(12) United States Patent
Dowski, Jr. et al.

(10) Patent No.: US 8,563,913 B2
(45) Date of Patent: Oct. 22, 2013

(54) IMAGING SYSTEMS HAVING RAY CORRECTOR, AND ASSOCIATED METHODS

(75) Inventors: Edward R. Dowski, Jr., Lafayette, CO (US); Paulo E. X. Silveira, Boulder, CO (US); Robert H. Cormack, Boulder, CO (US); Kenneth Scott Kubala, Boulder, CO (US)

(73) Assignee: OmniVision Technologies, Inc., Santa Clara, CA (US)

( * ) Notice: Subject to any disclaimer, the term of this patent is extended or adjusted under 35 U.S.C. 154(b) by 1022 days.

(21) Appl. No.: 11/575,284

(22) PCT Filed: Sep. 14, 2005

(86) PCT No.: PCT/US2005/034040
§ 371 (c)(1),
(2), (4) Date: Jan. 25, 2008

(87) PCT Pub. No.: WO2006/055094
PCT Pub. Date: May 26, 2006

(65) Prior Publication Data
US 2008/0203276 A1    Aug. 28, 2008

Related U.S. Application Data

(60) Provisional application No. 60/609,578, filed on Sep. 14, 2004, provisional application No. 60/697,710, filed on Jul. 8, 2005.

(51) Int. Cl.
*G02B 13/18*    (2006.01)
(52) U.S. Cl.
USPC ........................................ 250/201.9; 359/708
(58) Field of Classification Search
USPC .................................. 250/201.9; 359/708, 652
See application file for complete search history.

(56) References Cited

U.S. PATENT DOCUMENTS

| | | | |
|---|---|---|---|
| 3,064,401 A | 11/1962 | Mooney | |
| 5,398,130 A * | 3/1995 | Redman | 250/201.9 |
| 5,531,940 A | 7/1996 | Gupta et al. | |
| 5,748,371 A | 5/1998 | Cathey, Jr. et al. | |
| 5,822,125 A | 10/1998 | Meyers | |
| 6,061,169 A | 5/2000 | Feldman et al. | |
| 6,091,548 A | 7/2000 | Chen et al. | |
| 6,285,064 B1 | 9/2001 | Foster | |

(Continued)

FOREIGN PATENT DOCUMENTS

| | | |
|---|---|---|
| EP | 1239519 A2 | 9/1992 |
| EP | 0731509 | 9/1996 |

(Continued)

OTHER PUBLICATIONS

Patent Lawyer Report of WO2004027880(A2), (Phillips/stacked, wafer scale optics); reports by Heptagon (undated).
U.S. Appl. No. 11/227,316; Office Action Mailed Nov. 14, 2007; 16 pages.
U.S. Appl. No. 11/227,316; Response to Office Action Mailed Nov. 14, 2007, Filed Mar. 14, 2008; 14 pages.
Catrysse, P.B. & Wandell, B.A., Optical Efficiency of Image Sensor Pixels, Department of Electrical Engineering, Stanford University, J. Opt. Soc. Am. A/vol. 19., No. 8, Aug. 2002, pp. 1610-1620.

(Continued)

*Primary Examiner* — Seung C Sohn
(74) *Attorney, Agent, or Firm* — Lathrop & Gage LLP

(57) ABSTRACT

In an embodiment, a low height imaging system has: one or more optical channels and a detector array, each of the optical channels (a) associated with at least one detector of the array, (b) having one or more optical components and a restrictive ray corrector, and (c) configured to direct steeper incident angle field rays onto the at least one detector.

32 Claims, 49 Drawing Sheets

(56) References Cited

U.S. PATENT DOCUMENTS

| | | |
|---|---|---|
| 6,295,156 B1 | 9/2001 | Feldman et al. |
| 6,404,958 B1 | 6/2002 | Boye et al. |
| 6,417,950 B1 | 7/2002 | Cathey, Jr. |
| 6,449,236 B2 | 9/2002 | Wals et al. |
| 6,525,302 B2 | 2/2003 | Dowski, Jr. et al. |
| 6,788,472 B1 | 9/2004 | Iwasaki |
| 6,836,612 B2 | 12/2004 | Morris et al. |
| 6,842,297 B2 | 1/2005 | Dowski, Jr. |
| 6,873,733 B2 | 3/2005 | Dowski, Jr. |
| 6,911,638 B2 | 6/2005 | Dowski, Jr. et al. |
| 6,934,460 B2 | 8/2005 | Morris et al. |
| 6,940,649 B2 | 9/2005 | Dowski, Jr. |
| 7,009,652 B1 | 3/2006 | Tanida et al. |
| 7,049,168 B2 | 5/2006 | Findlater et al. |
| 7,068,432 B2 | 6/2006 | Boettiger et al. |
| 7,070,862 B1 | 7/2006 | Miyakawa et al. |
| 7,112,511 B2 | 9/2006 | Hong |
| 7,180,644 B2 | 2/2007 | Hoogland et al. |
| 7,186,968 B2 | 3/2007 | Raynor |
| 7,190,039 B2 | 3/2007 | Boettiger et al. |
| 7,199,931 B2 | 4/2007 | Boettiger et al. |
| 7,218,452 B2 | 5/2007 | Boettiger et al. |
| 7,223,960 B2 | 5/2007 | Mouli |
| 7,236,314 B2 | 6/2007 | Liao |
| 7,236,315 B2 | 6/2007 | Chen et al. |
| 7,453,653 B2 | 11/2008 | Dowski et al. |
| 2003/0099783 A1 | 5/2003 | Karita |
| 2004/0051806 A1 | 3/2004 | Cambou et al. |
| 2004/0165097 A1 | 8/2004 | Drowley et al. |
| 2004/0257677 A1 | 12/2004 | Matsusaka |
| 2005/0012158 A1 | 1/2005 | Gonzalez et al. |
| 2005/0231626 A1 | 10/2005 | Tuttle et al. |
| 2005/0247894 A1 | 11/2005 | Watkins et al. |
| 2005/0280012 A1 | 12/2005 | Boettiger et al. |
| 2006/0027887 A1 | 2/2006 | Boettiger et al. |
| 2006/0043262 A1 | 3/2006 | Akram |
| 2006/0044433 A1 | 3/2006 | Akram |
| 2006/0050379 A1 | 3/2006 | Yee et al. |
| 2006/0050397 A1 | 3/2006 | Oh et al. |
| 2006/0109366 A1 | 5/2006 | Humpston et al. |
| 2006/0119950 A1 | 6/2006 | Boettiger et al. |
| 2006/0138495 A1 | 6/2006 | Li et al. |
| 2006/0146233 A1 | 7/2006 | Park |
| 2006/0163761 A1 | 7/2006 | Miyakawa et al. |
| 2006/0175287 A1 | 8/2006 | Boettiger et al. |
| 2006/0175641 A1 | 8/2006 | Mouli |
| 2006/0177959 A1 | 8/2006 | Boettiger et al. |
| 2006/0187554 A1 | 8/2006 | Boettiger et al. |
| 2006/0198008 A1 | 9/2006 | Li et al. |
| 2006/0244016 A1 | 11/2006 | Mouli |
| 2006/0256322 A1 | 11/2006 | Bowes |
| 2006/0268143 A1 | 11/2006 | Boettiger et al. |
| 2006/0292735 A1 | 12/2006 | Boettiger et al. |
| 2007/0014019 A1 | 1/2007 | Mouli |
| 2007/0030379 A1 | 2/2007 | Agranov |
| 2007/0035844 A1 | 2/2007 | Li et al. |
| 2007/0035847 A1 | 2/2007 | Li et al. |
| 2007/0035849 A1 | 2/2007 | Li et al. |
| 2007/0035949 A1 | 2/2007 | Brates et al. |
| 2007/0057338 A1 | 3/2007 | Lee et al. |
| 2007/0121212 A1 | 5/2007 | Boettiger et al. |

FOREIGN PATENT DOCUMENTS

| | | |
|---|---|---|
| EP | 0840502 A2 | 5/1998 |
| EP | 0627637 B1 | 1/1999 |
| EP | 1531353 A1 | 5/2005 |
| JP | 06331891 | 12/1994 |
| JP | 2000152046 | 5/2000 |
| JP | 2000515704 | 11/2000 |
| JP | 200496358 | 3/2004 |
| WO | 9102380 A1 | 2/1991 |
| WO | 01077626 | 10/2001 |
| WO | 0186730 | 11/2001 |
| WO | 03029774 | 4/2003 |
| WO | 2004027880 A2 | 4/2004 |
| WO | 2004034477 | 4/2004 |
| WO | 2004042965 | 5/2004 |
| WO | WO2005109861 | 11/2005 |
| WO | 2006005044 | 1/2006 |

OTHER PUBLICATIONS

Catrysse, P.B., et al., QE Reduction Due To Pixel Vignetting in CMOS Image Sensors, Proceedings of SPIE vol. 3965, (2000), pp. 420-430.

Farn, M.W., et al., Color Separation by Use of Binary Optics, Optics Letters, vol. 18, No. 15, Aug. 1, 1993, pp. 1214-1216.

Layet, B. et al., Stripe Color Separation With Diffractive Optics, vol. 38, No. 35, Applied Optics, Dec. 10, 1999, pp. 7139-7201.

Pitchumani, M., et al., Additive Lithography for Fabrication of Diffractive Optics, Applied Optics, vol. 41, No. 29, Oct. 10, 2002, pp. 6176-6181.

Faklis, D. & Morris, G.M., Spectral Properties of Multiorder Diffractive Lenses, Applied Optics, vol. 34, No. 14, May 10, 1995, pp. 2462-2468.

Ogura, Y. et al., Wavelength-Multiplexing Diffractive Phase Elements: Design Fabrication, and Performance Evaluation, J. Opt. Soc. Am. A, vol. 18, No. 5, May 2001, pp. 1082-1092.

International Search Report and Written Opinion of related PCT application Serial No. PCT/US2005/034040, Mar. 30, 2006.

International Search Report and Written Opinion of related PCT application Serial No. PCT/US2006/026690, Dec. 18, 2006.

Response to Written Opinion on related PCT application Serial No. PCT/US2006/026690, filed May 7, 2007.

Final Office Action dated Nov. 19, 2012, issued in related U.S. Appl. No. 13/181,466, 7 pages.

Nonfinal Office Action dated Sep. 7, 2012, issued in related U.S. Appl. No. 13/181,466, 7 pages.

Response to Office Action filed Oct. 4, 2012 in related U.S. Appl. No. 13/181,466, 8 pages.

Notice of Allowance issued in U.S. Appl. No. 13/181,466, dated Jan. 28, 2013, 7 pages.

Office Action issued in Japanese 2007531491 dated Mar. 18, 2013, 16 pages.

Japanese Office Action issued Feb. 8, 2011 in related Japanese Patent Application 2007-531491, 8 pages.

Response to Japanese Office Action issued Feb. 8, 2011 in related Japanese Patent Application 2007-531491, filed Apr. 26, 2011, 14 pages.

Office Action issued on Jun. 22, 2011 in related Chinese Patent Application 200810161372.7, 6 pages.

U.S. Appl. No. 11/227,316 Examiner Interview Summary, Jul. 11, 2008, 2 pages.

U.S. Appl. No. 11/227,316 Notice of Allowance, Jul. 11, 2008, 9 pages.

U.S. Appl. No. 11/227,316 Issue Fee Payment and Comments on Statement of Reasons for Allowance, Oct. 10, 2008, 2 pages.

Chinese Application No. 200580034581.X Translation of the Second Office Action mailed Feb. 6, 2009, 10 pages.

Chinese Application No. 200580034581.X, Letter dated Apr. 9, 2009 in response to Second Office Action, 6 pages.

Chinese Application No. 200580034581.X, Letter dated May 8, 2009 in response to Second Office Action, 9 pages.

Israeli Application No. 181890 Translation of Office Action dated Sep. 7, 2010, 6 pages.

Israeli Application No. 181890 letter dated Nov. 10, 2001 in response to Office Action dated Sep. 7, 2010, 1 page.

European Application No. 05798906.3 Communication Pursuant to Article 94(3) mailed Apr. 9, 2010, 3 pages.

European Application No. 05798906.3 Response to Communication Pursuant to Article 94(3), Aug. 10, 2010, 12 pages.

* cited by examiner

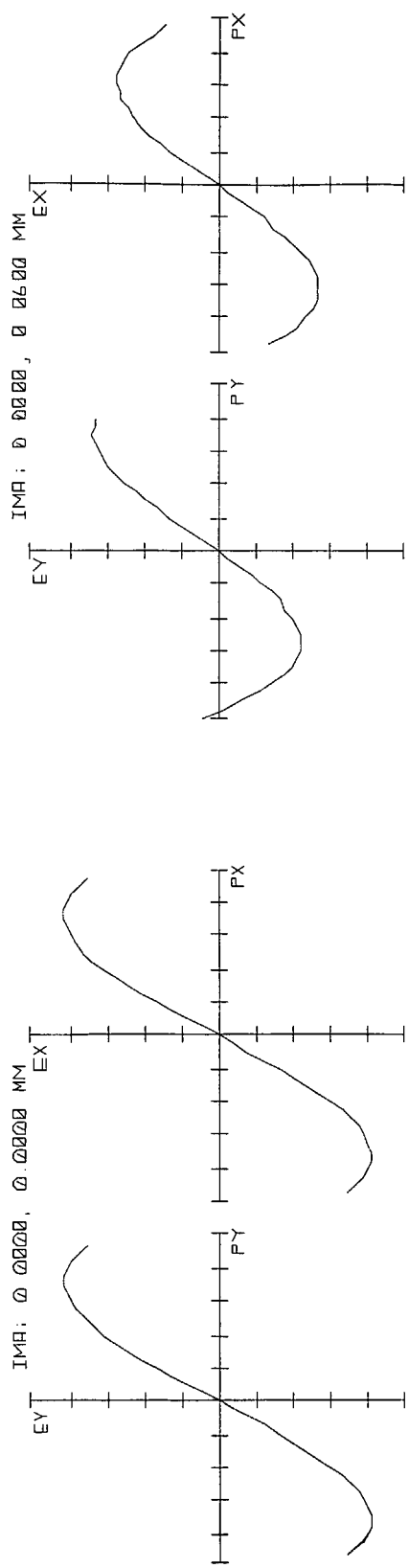
FIG. 6
FIG. 7
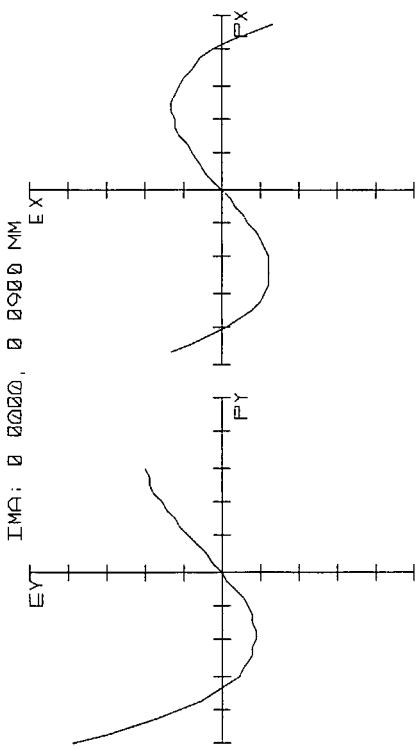
FIG. 8

Scale is +/- 50 microns for all three figures

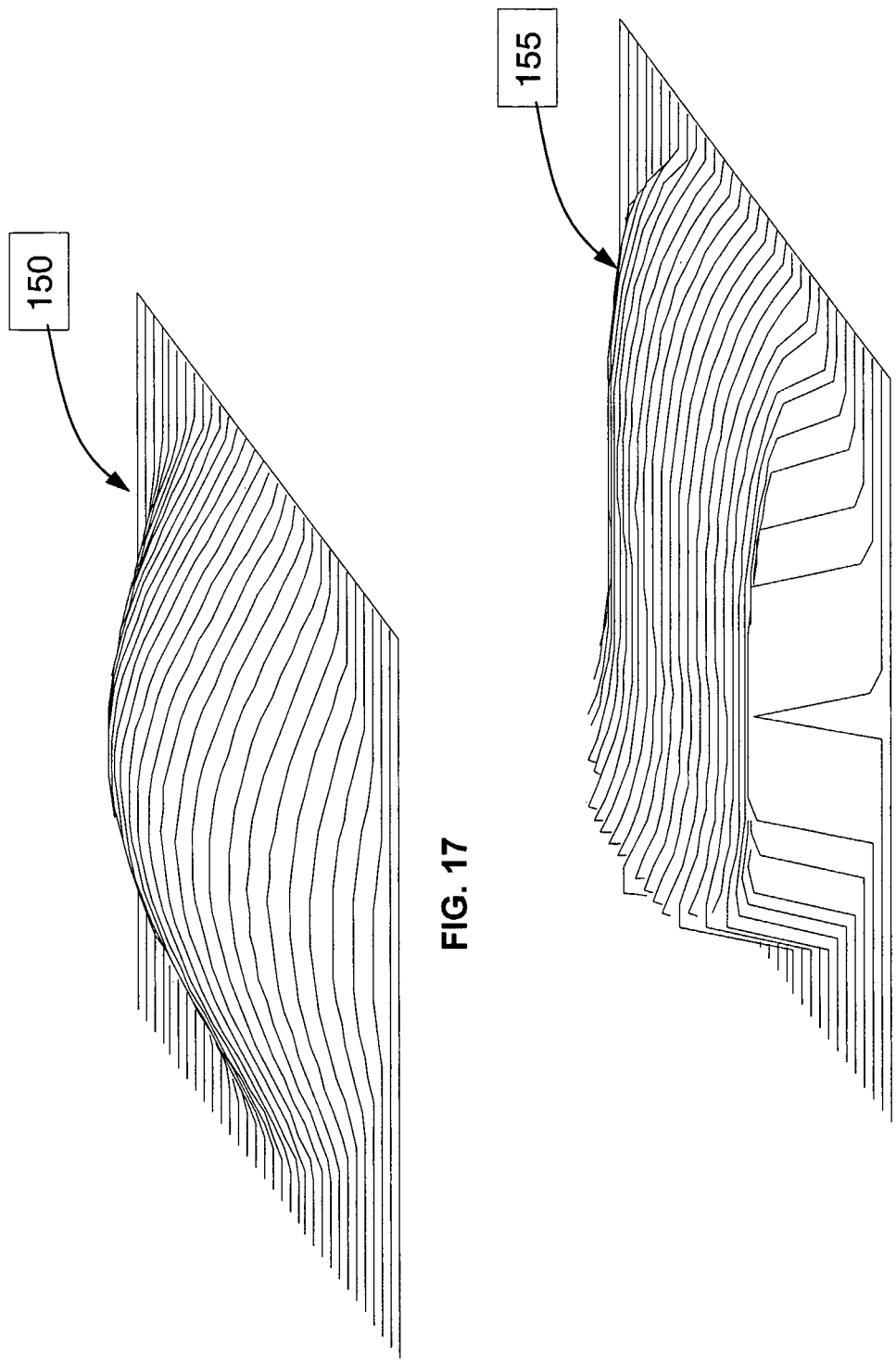

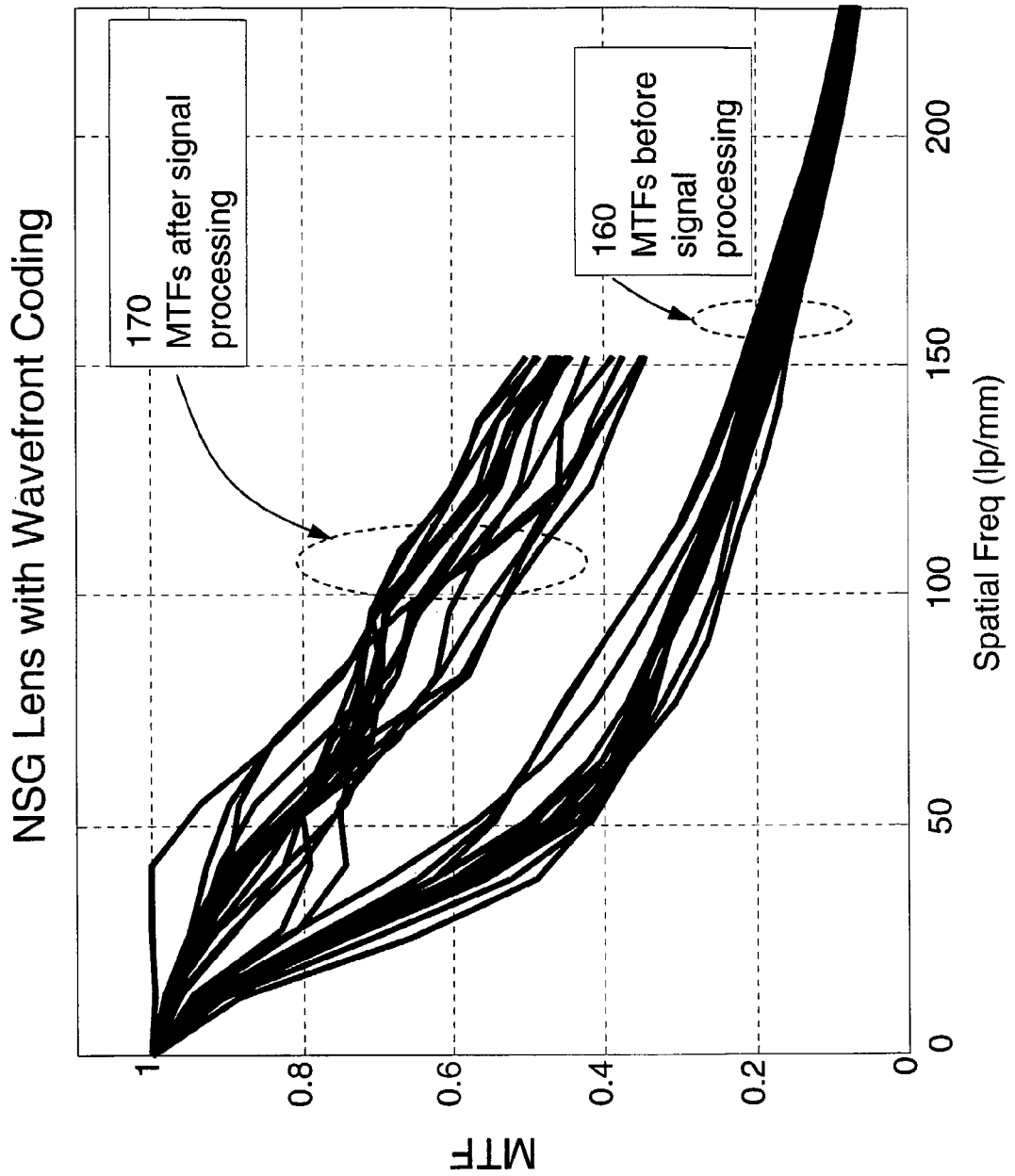

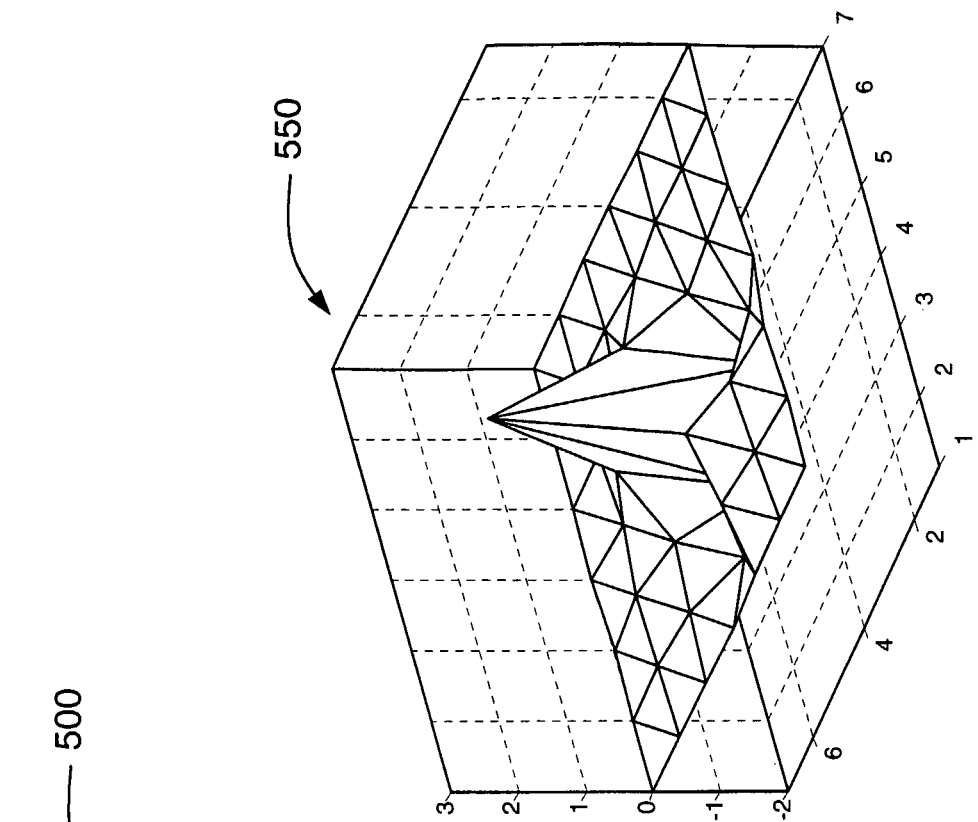
FIG. 27
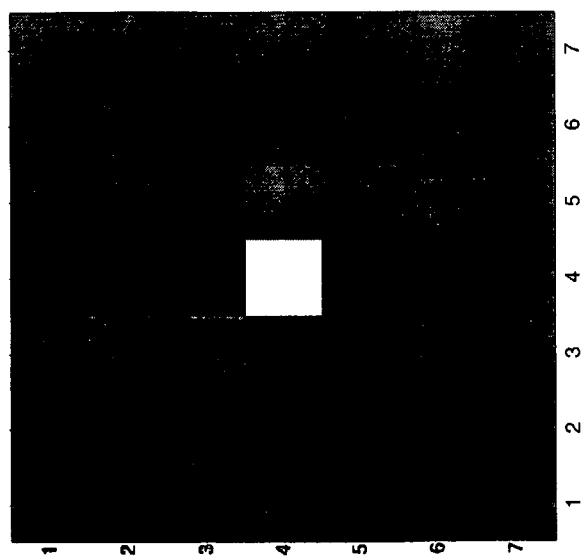
FIG. 26

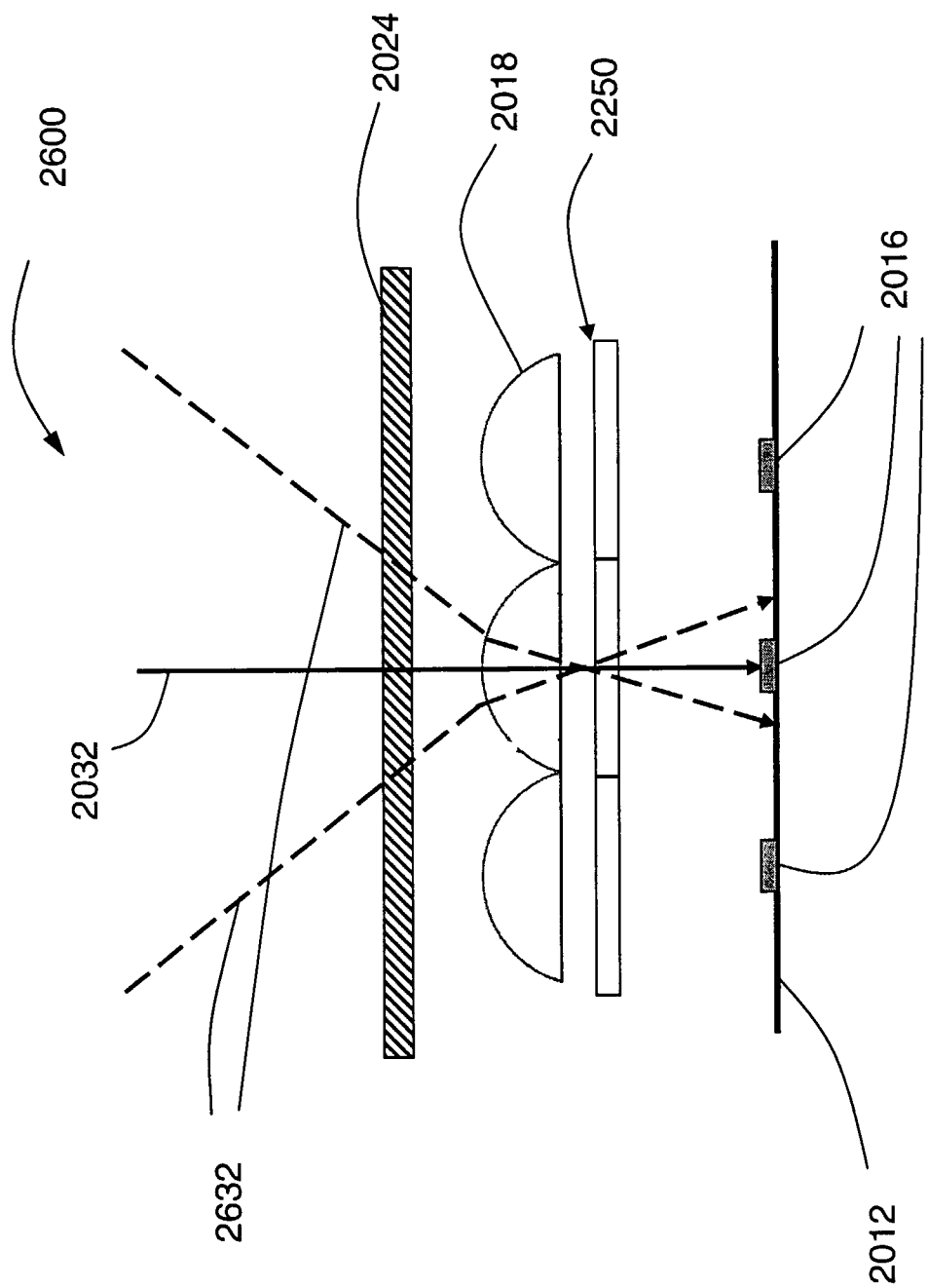

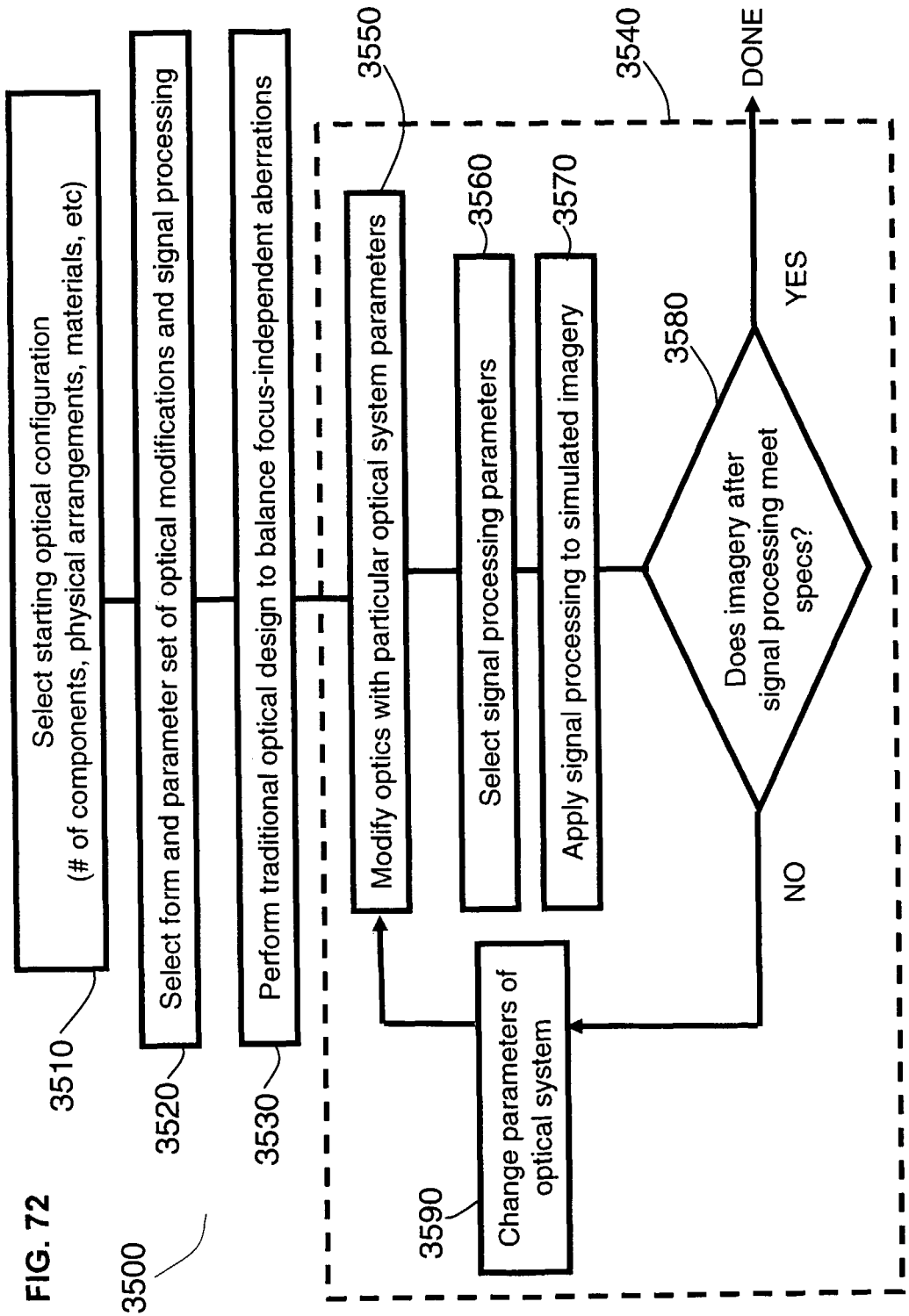

IMAGING SYSTEMS HAVING RAY CORRECTOR, AND ASSOCIATED METHODS

CROSS REFERENCE TO RELATED APPLICATIONS

The present application claims priority to U.S. Provisional Applications Ser. No. 60/609,578, filed on Sep. 14, 2004, entitled Improved Miniature Camera and Ser. No. 60/697,710, filed on Jul. 8, 2005, entitled Ray Correction Apparatus and Method, both of which applications are hereby incorporated by reference in their entireties. The following U.S. Patents are also incorporated by reference in their entireties: U.S. Pat. No. 5,748,371, entitled Extended Depth of Field Optical Systems to Cathey et al., U.S. Pat. No. 6,525,302, entitled Wavefront coding phase contrast imaging systems to Dowski, Jr., et al., U.S. Pat. No. 6,783,733, entitled Combined wavefront coding and amplitude contrast imaging systems to Dowski, Jr., U.S. Pat. No. 6,842,297, entitled Wavefront coding optics to Dowski, Jr., U.S. Pat. No. 6,911,638, entitled Wavefront coding zoom lens imaging systems to Dowski, Jr., et al. and U.S. Pat. No. 6,940,649, entitled Wavefront coded imaging systems to Dowski, Jr.

BACKGROUND

One of the latest trends in imaging devices is miniaturization. Compact imaging systems, such as miniature cameras, have become ubiquitous with the proliferation of cell phones and other portable handheld devices with cameras integrated therein. While the currently available, compact imaging devices are adequate for low resolution image capture for personal enjoyment, most provide rather low imaging quality or are undesirably long.

An exemplary imaging system 10 is shown in FIG. 1. System 10 may be, for example, a miniature camera and is shown to include a group of optical components 2 (shown here to include two separate refractive elements) and a detector 4. Optical components 2 may be made of an optical material such as Poly(methyl methacrylate) (PMMA), forming four aspheric surfaces, providing a focal length of 2.6mm and an F# of 2.6 over a 60 degree full field of view. Light rays 5 from an object (not shown) are directed through optical components 2 generally along a Z direction 3, and are imaged onto detector 4. Detector 4 then converts to the image received thereon into a data signal (indicated by a large arrow 7), which is directed to a processor 8. The data signal is processed at signal processor 8 to result in a final image 9.

Still referring to FIG. 1, optical components 2 of system 10 are located such that a Z-length (defined as the distance from the first surface of the group of optics encountered by an input light ray to the front of the detector, and indicated by a horizontal double-headed arrow) is approximately equal to a length L of detector 4 (indicated by a vertical double-headed arrow). In the exemplary imaging system shown in FIG. 1, detector length L is 4.4 mm, while Z-length is set at 4.6 mm.

Continuing to refer to FIG. 1, system 10 (like numerous other short imaging systems) does not have sufficient degrees of freedom to control the variety of optical and mechanical aberrations that are possibly manifest in the system. That is, since there are so few parts forming the system (e.g., just a few lenses and their holders, small detector, etc.) and the components are so small in compact applications such as a miniature camera, it is difficult to achieve an ideal design or alignment of the different components and/or to adjust any of the components once assembled. As a result, the resulting images do not have high image quality. Further, the potential for introduced aberrations due to misalignment of the physical components (e.g., optical components 2 and detector 4) of system 10 is significant, thereby requiring increased precision during manufacture. This requirement increases the cost of system 10, even though the image quality of the resulting system is relatively poor.

Additionally, in prior art imaging system 10, the angles of rays at the edge of detector 4 may be shallow. That is, an angle θ of the chief ray (which is the light ray passing through the center of the aperture defined by optical components 2) at the edge of the detector may be up to approximately 30 degrees from the normal of the detector. Since the intensity of light captured at the detector is a function of the angle to the detector, the captured light intensity decreases as the chief ray angle increases. Also, large ray angles may lead to light being captured by the wrong pixel on the detector, thereby causing pixel cross-talk. Therefore, as images formed with practical complementary metal-oxide-semiconductor (CMOS), charge-coupled device (CCD), and infrared (IR) detectors are degraded when the incident light rays are far from the normal of the detector, large chief ray angles are undesirable. As the Z-length of the system is additionally shortened in an effort to further miniaturize the system, these ray angle problems are exacerbated and increasingly lead to reduced image quality.

SUMMARY OF THE INVENTION

In an embodiment, a low height imaging system has: one or more optical channels and a detector array, each of the optical channels (a) associated with at least one detector of the array, (b) having one or more optical components and a restrictive ray corrector, and (c) configured to direct steeper incident angle field rays onto the at least one detector.

In an embodiment, a low height imaging system has: a detector array; and a GRIN lens having a surface with wavefront coding and configured to direct steeper incident angle field rays onto a plurality of detectors of the detector array.

In an embodiment, a low height imaging system has: a plurality of optical channels and a detector array, each of the optical channels (a) associated with at least one detector of the array and (b) having an aspheric GRIN lens.

In an embodiment, a method forms a lens with wavefront coding, including: positioning a lens in a mold; and curing material onto a surface of the lens to form an aspheric surface of the lens with wavefront coding.

In an embodiment, a low height imaging system has: a block of optically transmissive material having an entrance aperture, an exit aperture and at least one internally reflective surface, wherein a wavefront transmitted through the entrance aperture reflects off of the reflective surface and exits the exit aperture with wavefront coding.

In an embodiment, a low height imaging system has: a plurality of optical channels and a detector array, each of the optical channels associated with at least one detector of the array and having an aspheric restrictive ray corrector, wherein the aspheric restrictive ray corrector preferentially directs color towards particular detectors of the detector array.

In an embodiment, a photon compensating optical system has: at least one optical element and an aspheric surface, wherein a non-constant MTF of the system compensates for a range between the object and the optical element.

In an embodiment, a restrictive ray corrector has: an optical element configured for placement adjacent to, or coupling to, a detector array, the optical element forming at least one surface such that field rays within an optical imaging system are directed towards the detector array with an angle of incidence that is closer to a surface normal of the detector array as compared to angle of incidence of field rays incident on the detector array without the optical element.

In an embodiment, a low height imaging system has: a first wafer comprising a plurality of detectors; and a second wafer including a plurality of aspheric optical components such that MTF of the imaging system has no zeros within a passband of a detectors; the first and second wafer being stacked to form a low height imaging system with a plurality of optical channels, each of the optical channels having at least one optical component and at least one detector.

BRIEF DESCRIPTION OF THE DRAWINGS

FIGS. 6-8 are graphical plots of the calculated ray intercepts for the GRIN lens at one wavelength over the field of view for a variety of incident angles.

FIGS. 17 and 18 are graphical plots of the on-axis exit pupils for the systems illustrated in FIGS. 5-10 and FIGS. 11-16, respectively.

FIG. 25 is a graphical plot of the MTFs of an imaging system including the GRIN lens modified for use with Wavefront Coding, shown here to illustrate the differences in the MTFs before and after the signal processing.

FIGS. 26 and 27 are graphical plots of the digital filter used to form images in FIGS. 22-25 in an image format and a mesh format, respectively.

FIGS. 50-54 are diagrammatic illustrations, in partial cross section, of light rays traveling through additional embodiments of a ray correction system of the present disclosure, shown here to illustrate possible variations for customizing the ray correction characteristics of the ray correction elements.

FIG. 72 is a flowchart illustrating a method for applying Wavefront Coding to optical systems.

Figure 1:
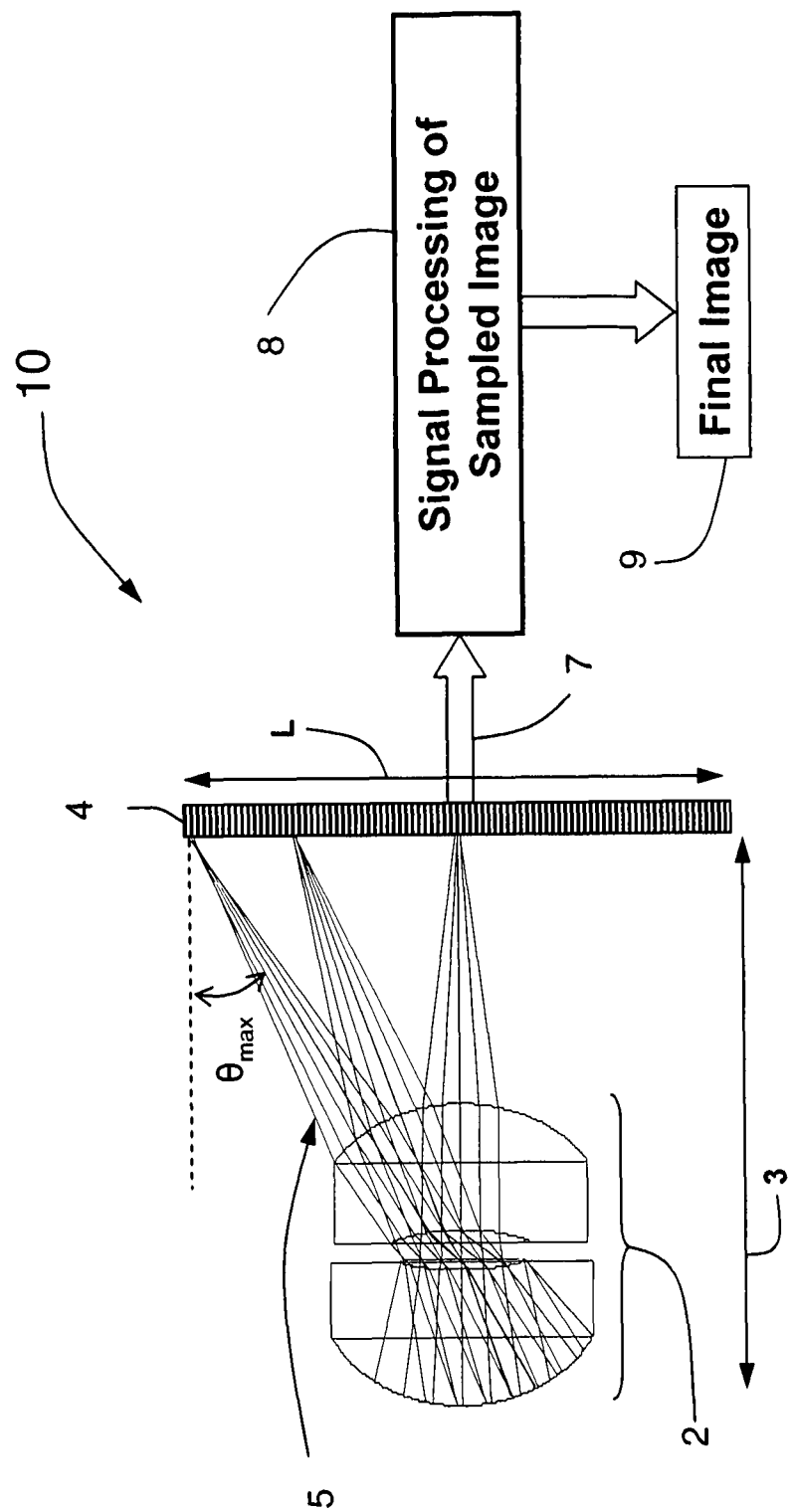
FIG. 1 is a diagrammatic illustration of a prior art imaging system.

It is noted that, for purposes of illustrative clarity, certain elements in the drawings may not be drawn to scale.

DETAILED DESCRIPTION

Optical systems and devices are now described which increase image quality even though they have a short z-length, or equivalently low height, with respect to the size of the detector. "Short" or "low height" is generally defined as a Z-length (from the first surface of the optics to the front of the detector) that is less than twice the effective focal length of the optical system.

These systems and devices may provide other advantages, for example they may provide: relaxed tolerances (to reduce costs) of the optics, mechanics, and digital detector while still achieving high image quality; for use of modified off-the-shelf short volume optics for high quality imaging; for use of customized short volume optics for high quality imaging; for use of customized short volume optics with reflections for high quality imaging; for use of groups of short volume optics to form high quality images; for use design of specialized exit pupils for specialized imaging systems such that detection probability, or image signal-to-noise ratio (SNR), is a constant over a range of object distances. These systems can also offer an increase in system light sensitivity.

While the optical systems and devices of the present disclosure may include refractive and/or diffractive elements therein, the main purpose of these additional elements is not to focus the incident light onto a particular spot on, for example, a detector, but to steer the incident light, without necessarily focusing, toward a desired location while achieving the desired incident angle at the detector. That is, the teachings herein provided are directed to "channeling" the light in particular ways or, in other words, steering the light along one or more desired "optical channels" so as to provide advantages such as increased light intensity at detectors, customizable chromatic separations, and reduced system size.

Figure 2:
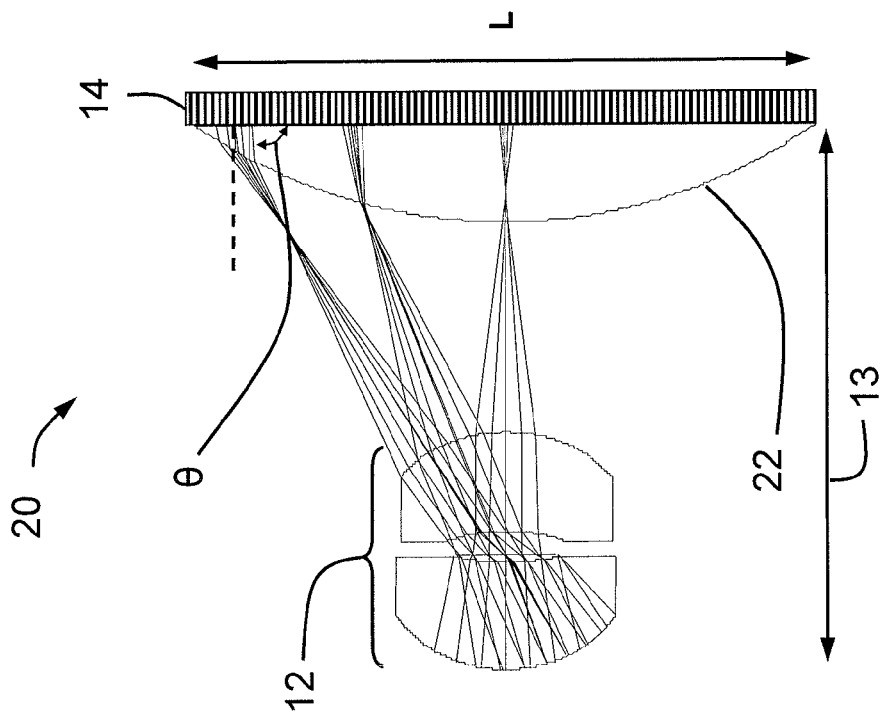
FIG. 2 is a diagrammatic illustration of a low height imaging system, shown here to illustrate one configuration for chief ray correction.

One known attempt to solve the problem of large ray angles at the detector in short imaging systems is shown in FIG. 2. FIG. 2 shows an exemplary low height imaging system 20 that includes optical components 12 and detector 14 generally arranged along a Z direction 13, similar to optical components 2 and detector 4 arranged along Z direction 3 of imaging system 10, FIG. 1. Low height imaging system 20 also includes a refractive restrictive ray corrector lens 22 located at or near detector 14. Refractive restrictive ray corrector lens 22 causes certain ray angles to be steeper at detector 14 than the ray angles would be without refractive restrictive ray corrector lens 22. The maximum chief ray angle for system 20 of FIG. 2 may be decreased by a factor of 6, as compared to the maximum chief ray angle of system 10, to 5 degrees with refractive restrictive ray corrector lens 22 placed before the detector. This resulting chief ray angle of 5 degrees is considered to be small and within the good quality operational region of most practical detectors.

Continuing to refer to FIG. 2, one potential drawback to system 20 is that, since refractive restrictive ray corrector lens 22 is refractive, it has a significant thickness. The thickness of refractive restrictive ray corrector lens 22 is generally about 1 mm, which is a thickness large enough to cause the ray angle to decrease but also potentially adds other aberrations to the wavefront of light rays 15 before detector 14.

Figure 3:
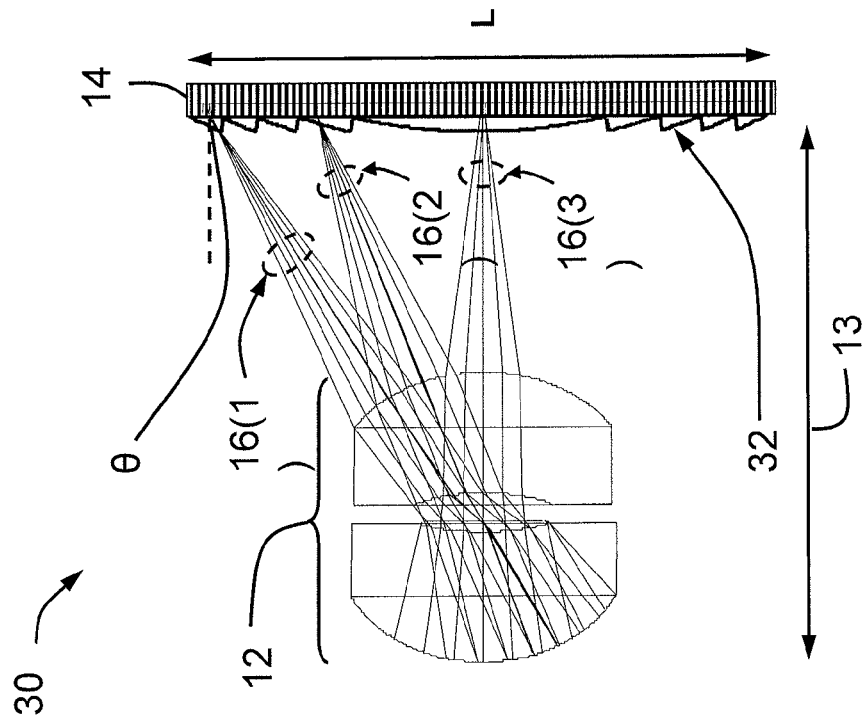
FIG. 3 is a diagrammatic illustration of a low height imaging system, shown here to illustrate a second configuration for chief ray correction.

FIG. 3 shows an alternative low height imaging system 30 that includes optical components 12 and detector 14 similar to optical components 2 and detector 4 of imaging system 10, FIG. 1. Low height imaging system 30 also includes a diffractive restrictive ray corrector 32 (e.g., a Fresnel lens) that functions in a similar manner to refractive restrictive ray corrector lens 32 of system 20. Diffractive restrictive ray corrector 32 has a greatly reduced thickness as compared to refractive restrictive ray corrector lens 22 while providing the same function. While the maximum ray angles at the detector are still about 5 degrees, the small thickness of diffractive restrictive ray corrector 32 means that virtually no additional aberrations are introduced to the wavefront of light rays 15 before they are incident on detector 14. In practice, diffractive restrictive ray corrector 32 may be less than 1/10 mm depending on the material used, the range of wavelengths used, and the spacing of diffractive zones. FIG. 3 also shows light ray groups 16(1), 16(2) and 16(3) to illustrate how optical channels are associated with light passing through optical component 12 to ray corrector 32, thereby steering the light into respective detectors of detector array 14.

One way of removing the need to correct ray angles at or near the detector is to make the imaging system telecentric at the image. An image side telecentric imaging system has chief ray angles that are essentially parallel to the optical axis. The ray angles at the detector for telecentric lenses can then only be related to the marginal ray angles (i.e., those rays from the edge of the lens to the image plane), which is related to the speed or F/# of the lens. No additional ray angle is introduced due to the distance of the image point from the optical axis. In practice, the imaging system only has to have telecentric properties; it does not have to be strictly telecentric.

Short telecentric refractive optics can be constructed where the image of the aperture, as seen from the detector side of the lens, is at or close to infinity. For the image of the aperture to appear near infinity, the aperture should be in front of the last group of optics, with the distance between the aperture and the group being the effective focal length of the last group. For a two element imaging system, such as shown in FIG. 1, the distance from the aperture to the second element has to be approximately the focal length of the second element for the system to be close to telecentric. However, the need to increase the distance between the two elements works against the goal of making very short imaging systems. When designing increasingly shorter refractive imaging systems, at some point it is not possible to make the systems telecentric and also meet a length constraint.

For example, the following describes an improved miniature camera. Similar techniques may be employed within cell phone cameras, digital cameras, endoscopes, automotive imaging systems, toys, infra-red (IR) imaging systems, biometric imaging systems and security systems.

In certain embodiments herein, telecentric imaging is provided through gradient index (GRIN) optics. GRIN optics have index of refraction changes that in general are a function of position within the optic. GRIN optics may have a spatially varying index of refraction given by $$n(r, z) = \Sigma a_i r^i + b_i z^i$$

where n(r, z) is the index of refraction in the radial (r) and axial (z) directions. The sum is over the parameter i. Other variations in the form of the index of refraction are possible. Some variations include the index of refraction changing as a function of thickness z along a spherical or lens-shaped contour and dynamically changing index distributions. By proper configuration of the GRIN optics, the imaging system can be approximately telecentric while also being short.

Figure 4:
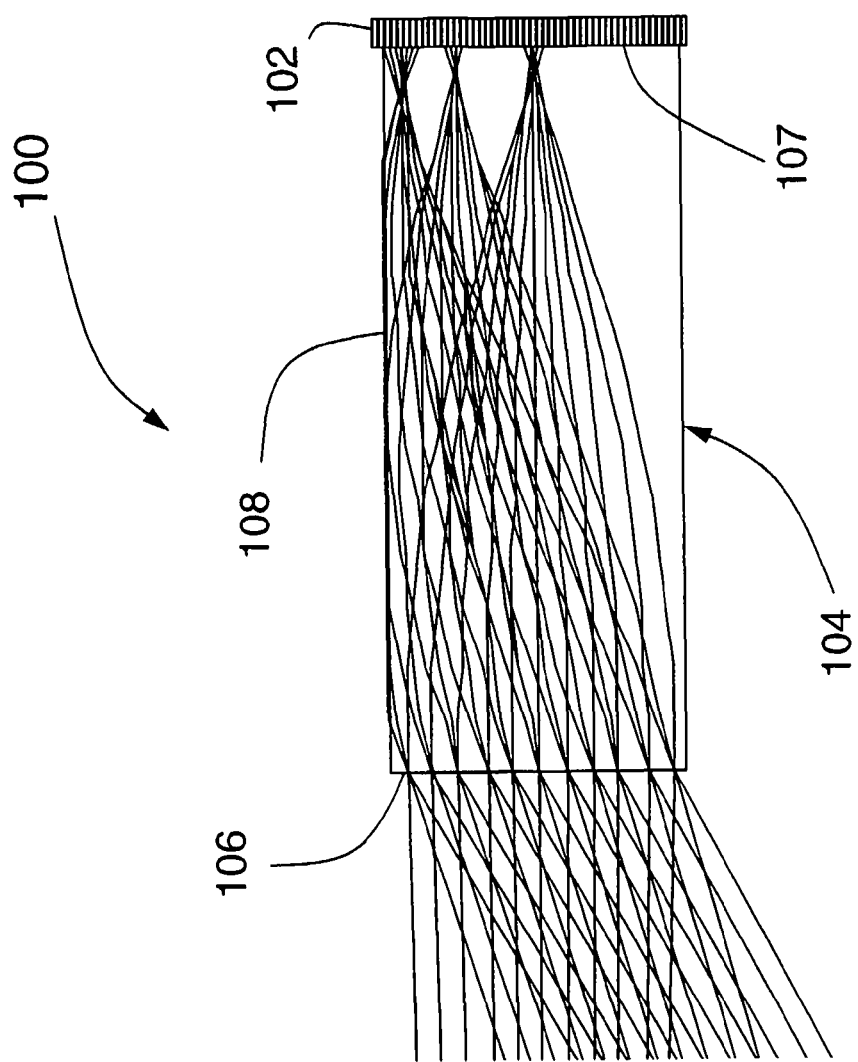
FIG. 4 is a diagrammatic illustration of a short imaging system in accordance with the present disclosure, including a GRIN lens with Wavefront Coding.

FIG. 4 shows a short imaging system 100 that includes a modified GRIN lens 104. Modified GRIN lens 104 (e.g., originally an NSG (Nippon Sheet Glass) GRIN lens ILH-0.25) is modified to implement Wavefront Coding and is disposed in front of a detector 102 to achieve a short length, high speed, and a very wide field of view. Modified GRIN lens 104 has a customized front surface 106 that includes a specially designed component employing Wavefront Coding. Signal processing of the resulting image from detector 102 may be utilized to reverse the spatial effects of the Wavefront Coding and produce a final image. A rear surface 107 of modified GRIN lens 104 is positioned nearly adjacent to or in contact with detector 102. One side of modified GRIN lens 104 includes a blackened exterior surface 108 for absorbing light and for reducing reflections, as well as acting as a field stop. The NSG ILH-0.25 GRIN lens, on which modified GRIN lens 104 is based has a focal length of f=0.25 mm, F/1, diameter=250 μm, length=400 μm, and a full field of view (FOV) of 60 degrees. Detector 102 may be, for example, a 56×56 pixel CMOS detector with 3.3 μm square pixels. In addition to customized front surface 106, the front or the rear surface of modified GRIN lens 104 may also be coated with a thin film spectral filter. In short imaging system 100, the use of specialized surfaces and gradient index optics results in a substantially telecentric optical system with a short total length (Z-length). Telecentric optics help to ensure that the chief ray angles at the detector surface are steep enough to remain within a practical range of input angles for readily available detectors.

Figure 5:
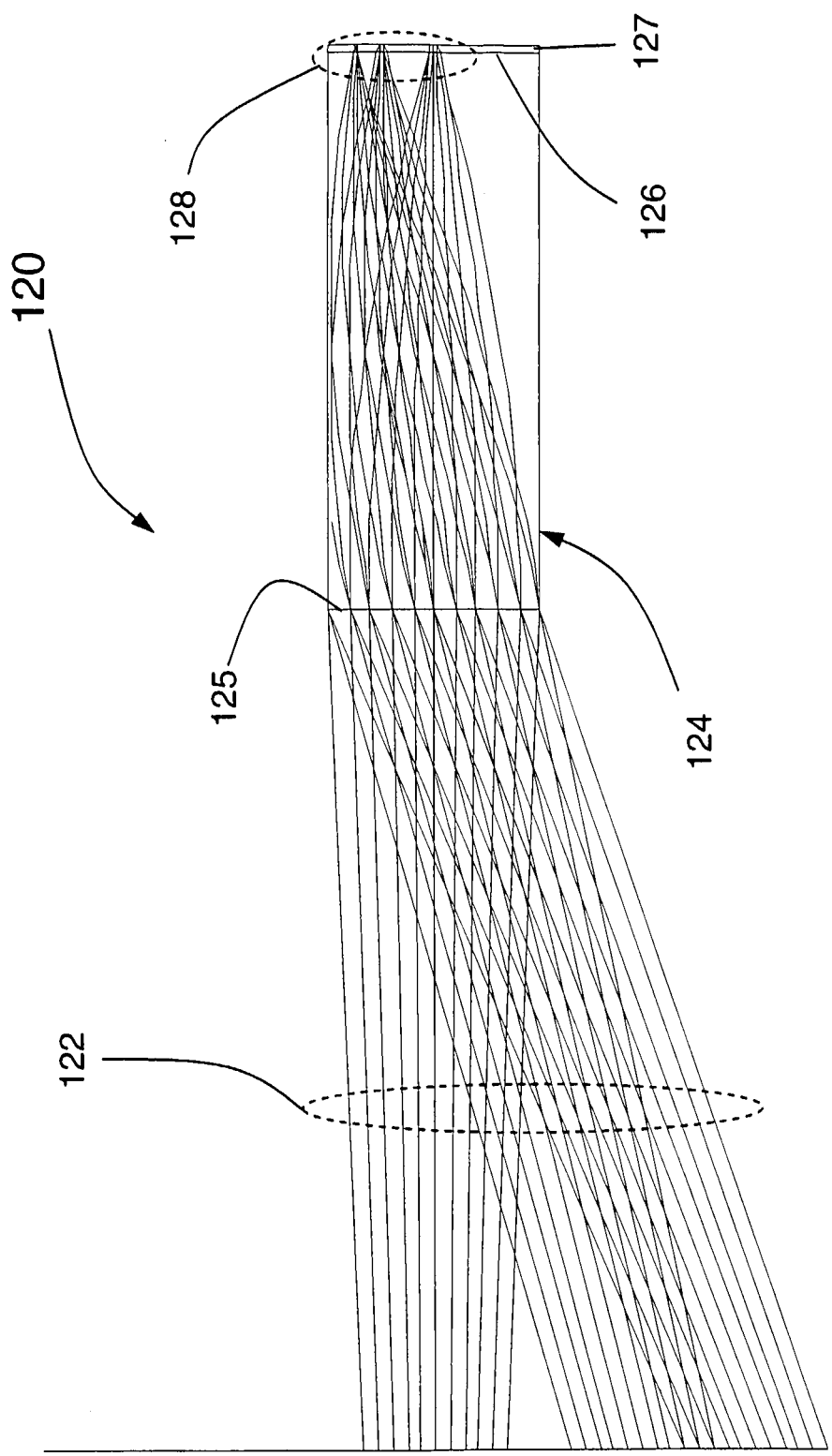
FIG. 5 is a diagrammatic illustration of the ray pattern over one half of a 60 degree field of view incident on a GRIN lens without Wavefront Coding.

The performance of a GRIN lens without Wavefront Coding is shown in FIGS. 5-10. FIG. 5 shows a ray pattern 120 for a plurality of input light rays (indicated by a dashed oval 122) over one half of a 60 degree field of view into a GRIN lens 124. Input light rays enter a front surface 125 of GRIN lens 124 and are focused at a rear surface 126 of GRIN lens 124, which is disposed adjacent to a detector 127. Due to the gradient index configuration of GRIN lens 124, a plurality of ray angles (indicated by a dashed oval 128) at the detector are all small, on the order of 20 degrees or less. The maximum ray angle at the detector is mainly determined by the speed of this GRIN lens, which is F/1.

FIGS. 6-8 illustrate the ray intercept diagrams for GRIN lens 124 at one wavelength over the field of view. Each pair of plots in FIGS. 6-8 correspond to the image point versus pupil point over the GRIN lens aperture at the input surface (shown as front surface 125 in FIG. 5) for different input ray angles; the scale of each of the plots in FIGS. 6-8 is from −5 microns to +5 microns. The ray intercept diagrams shown in FIGS. 6-8 indicate that GRIN lens 124 suffers from a large amount of field curvature, spherical aberration, coma, and astigmatism. The performance at other wavelengths is similar. These aberrations greatly limit the imaging performance at all but the on-axis positions.

Figure 9:
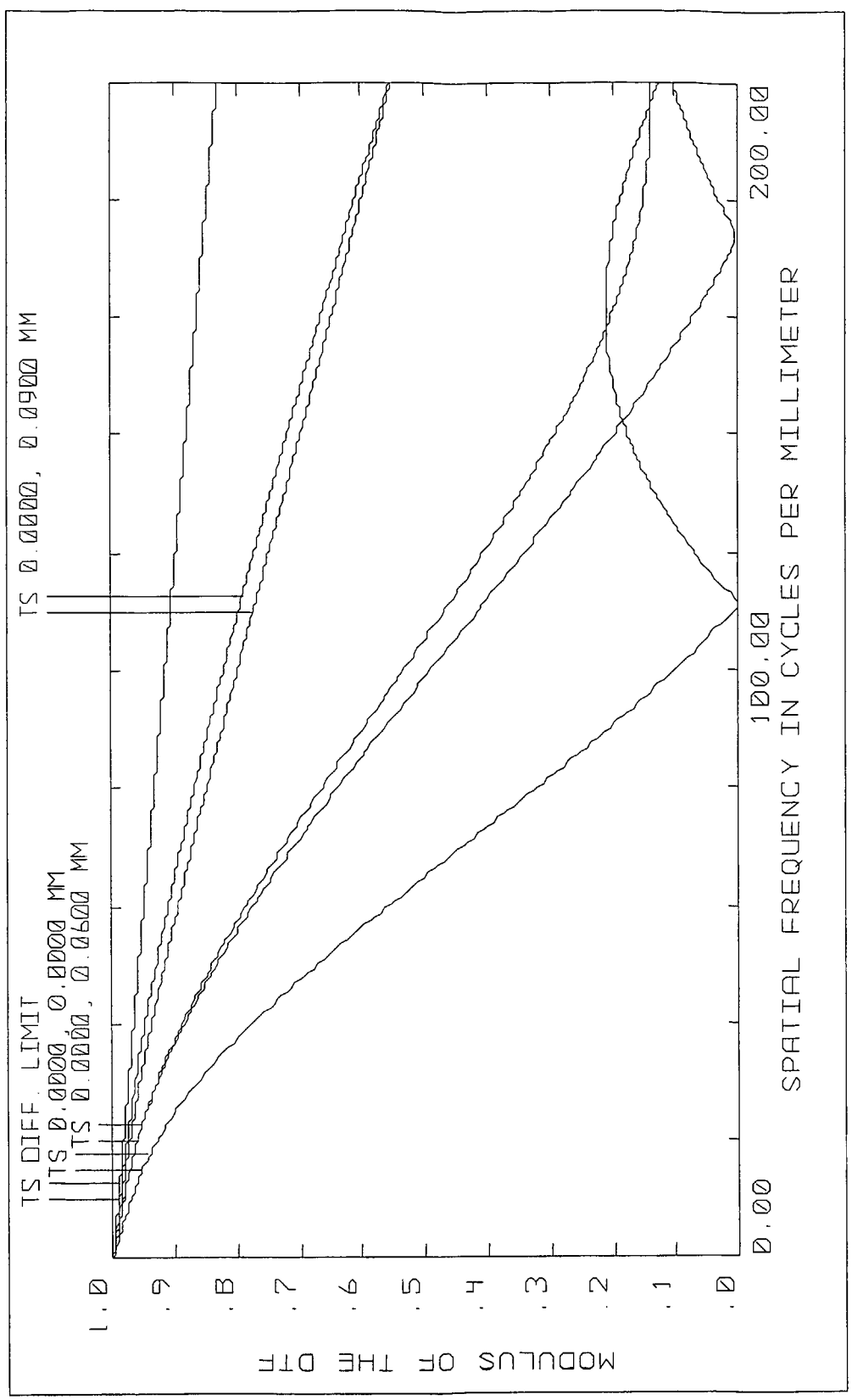
FIG. 9 is a series of graphical plots of the calculated monochromatic modulation transfer functions (MTFs) for the GRIN lens as a function of field angle.

FIG. 9 shows monochromatic modulation transfer functions (MTFs) for GRIN lens of FIG. 5 as a function of field angle. The MTF is seen to drop drastically for increasing field angles. At the largest field angles, the MTF has zeros near 110 lp/mm. The maximum spatial frequency captured by the 3.3 micron pixel detector is about 151 lp/mm. The image quality captured by the detector will then greatly depend on the image location to due the aberrations of field curvature, spherical aberration, coma, and astigmatism.

Figure 10:
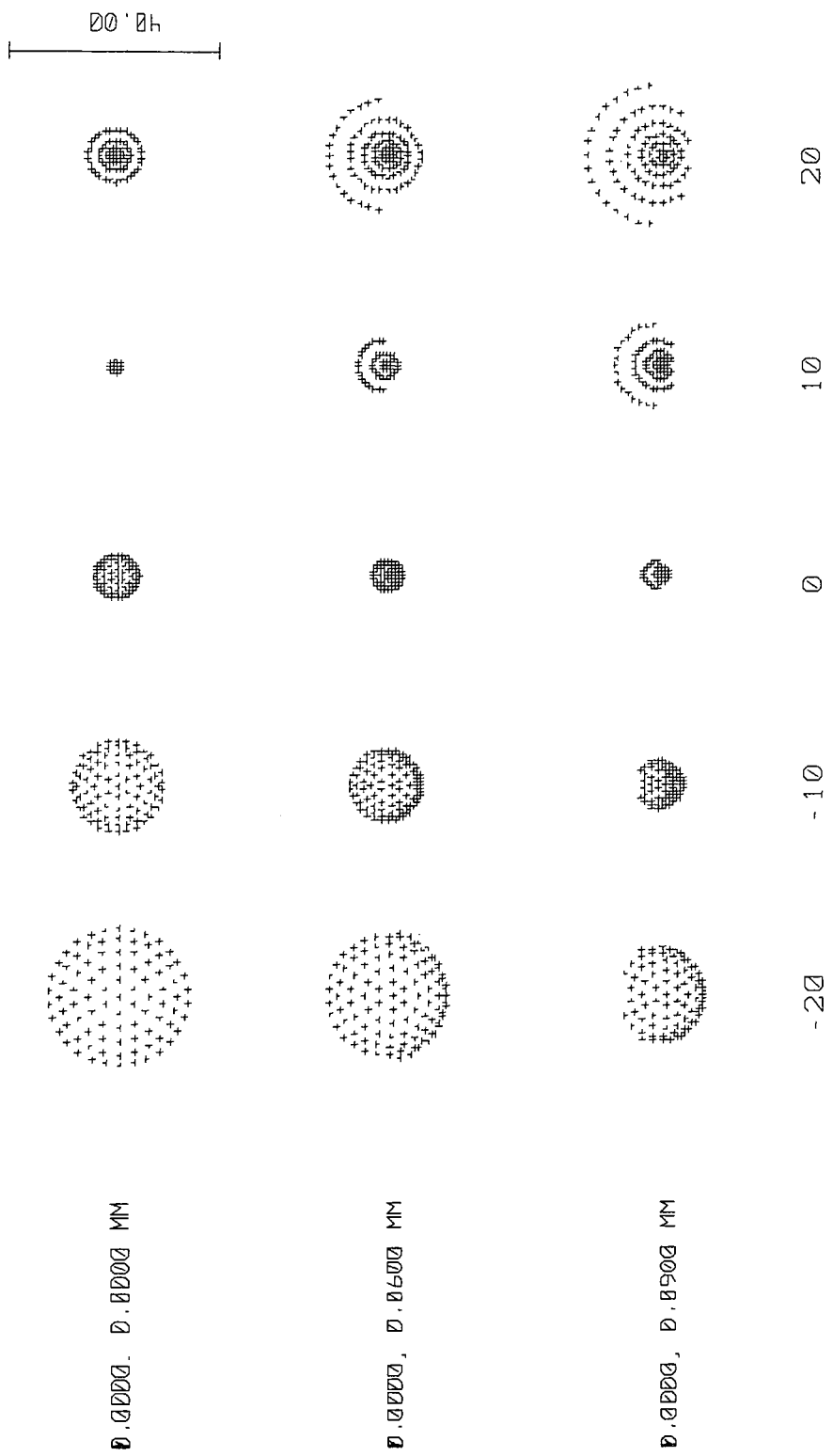
FIG. 10 is a series of spot diagrams as a function of field angle and object position for the GRIN lens.

FIG. 10 shows the spot diagrams for GRIN lens 124 as a function of field angle and object position. As can be seen in FIG. 10, the shape and size of the spot diagrams vary greatly over field and image plane. This variation again shows that this GRIN lens would, on its own, image poorly in a large field of view configuration.

By using Wavefront Coding through specialized types of the optical surfaces that form the lens, and signal processing of the resulting images, the effects of aberrations due to the optics, mechanics, environment, fabrication, and assembly can all be controlled. The signal processing increases the degrees of freedom of the overall system that can be used to compensate for the relatively small number of degrees of freedom of the physically short imaging system.

Figure 11:
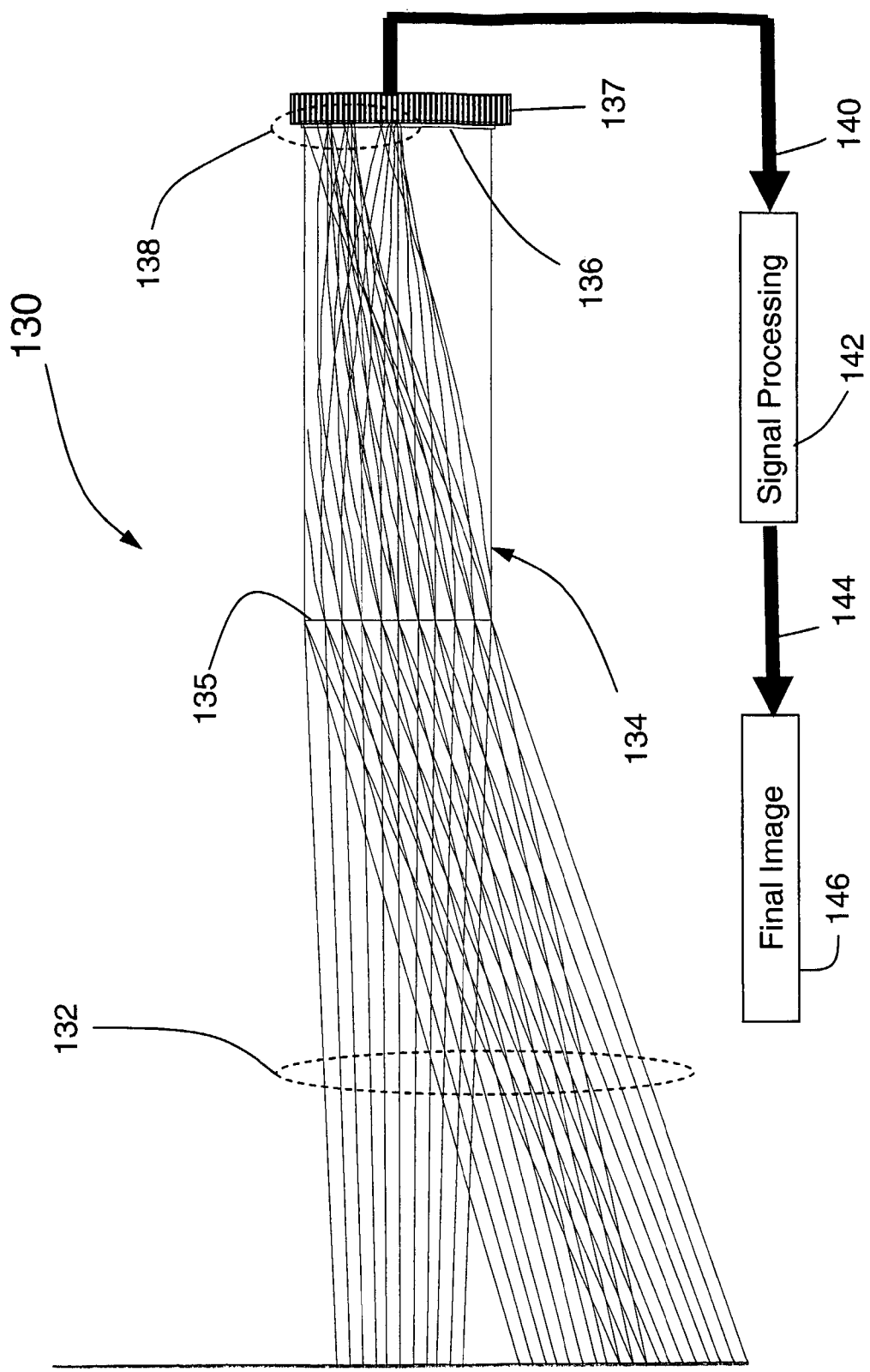
FIGS. 11-16 are illustrations corresponding to FIGS. 5-10 but for a GRIN lens modified for use with Wavefront Coding.

Through Wavefront Coding, even off-the-shelf gradient index (GRIN) fast (F/1) lenses can be made to image with high spatial resolution (3.3 micron pixels) over a large field of view (60 degree full field of view). A GRIN lens that has been modified for use with Wavefront Coding is shown in FIG. 11. FIG. 11 shows a ray pattern 130 for a plurality of input light rays (indicated by a dashed oval 132) over one half of a 60 degree field of view into a modified GRIN lens 134. Input light rays enter a front surface 135 of modified GRIN lens 134 and are focused at a rear surface 136 of GRIN lens 134, which is disposed adjacent to a detector 137. Ray angles (indicated by a dashed oval 138) at rear surface 136 are again small. Detector 137 converts the light signals received thereon into an electrical signal 140, which is directed to a signal processing unit 142. Resulting electrical signal 144 from signal processing unit 142 is used to form a final image 146.

Modified GRIN lens 134 differs from GRIN lens 124 of FIG. 5 by the formation of a specialized surface at front surface 135 of modified GRIN lens 134. Notice the different shape of the ray bundles at rear surface 136 in FIG. 11 compared to the ray bundles at rear surface 126 in FIG. 5. The specialized surface formed at front surface 135 of modified GRIN lens 134 may implement, for example, a rectangularly separable cubic phase modification. Mathematically, the phase modification is described as $\{\alpha(x^3+y^3)\}$, where $\alpha$ is chosen to give a peak-to-valley optical path difference (OPD) of up to about 11 wavelengths. This form for the specialized surface was chosen for use with modified GRIN lens 134 for simplicity. A variety of other surface forms are also valuable and possible. A light signal transmitted through modified GRIN lens 134 and detected at detector 137 is subsequently processed through signal processing unit 142. Signal processing unit 142 may, for example, compensate for the phase modifications that were implemented by the specialized surface. For instance, when the specialized surface is configured to be a known Wavefront Coding element, then signal processing unit 142 may serve to reverse the spatial effects of the phase modifications introduced by the transmission of light rays through the Wavefront Coding.

Figure 13:
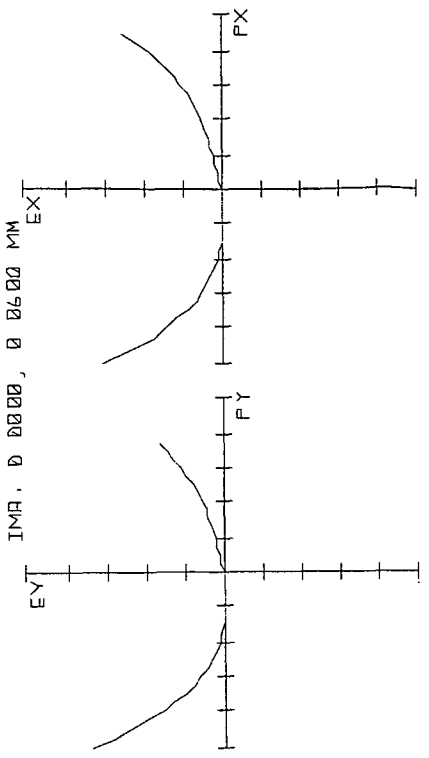
Figure 12:
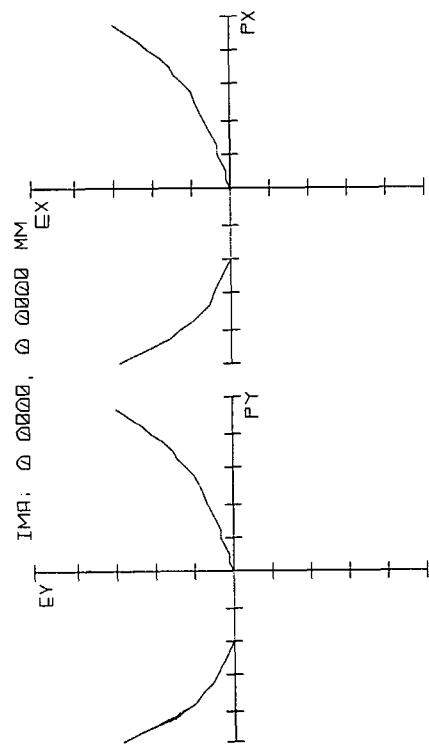
Figure 14:
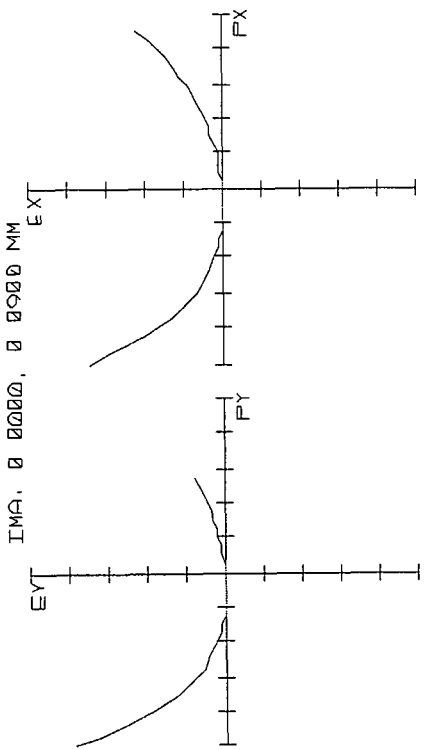

FIGS. 12-14 show ray intercept curves for modified GRIN lens 134 over field for a single wavelength; the scale of each of the plots in FIGS. 12-14 is from −50 microns to +50 microns. These curves are for the optics only and do not include the detector or signal processing. The performance is similar for other wavelengths. As may be seen in FIGS. 12-14, the ray intercept curves are all essentially constant as a function of field angle. From this result, it would be expected that the response from the system as a function of field angle is substantially constant. It is noted that the scale of the ray intercept curves shown in FIGS. 12-14 is 10 times larger than the scale shown in FIGS. 6-8.

Figure 15:
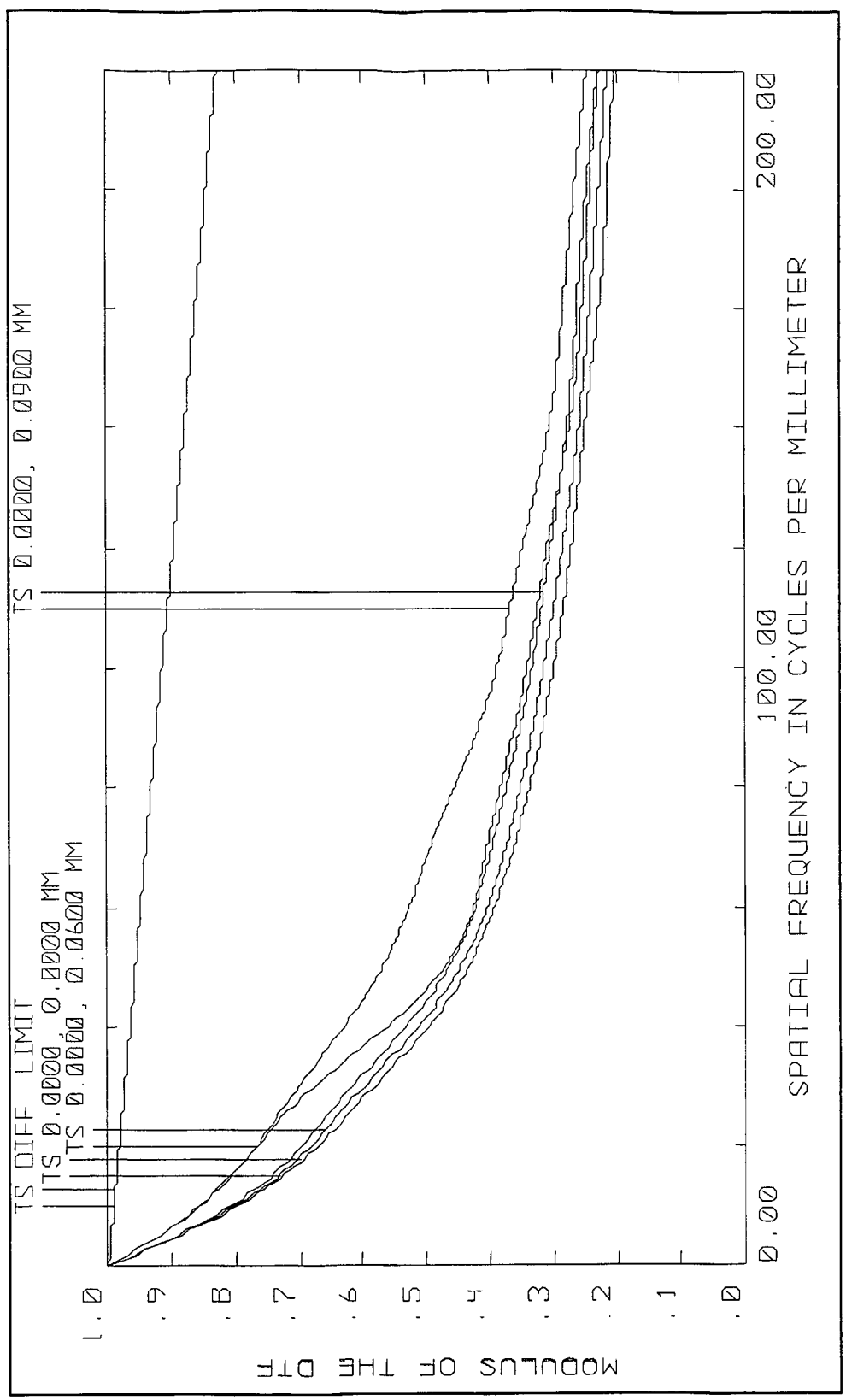

MTFs for modified GRIN lens 134 are shown in FIG. 15. These MTFs also do not include the effects of the detector or signal processing. The optics-only MTFs are seen to have substantially constant behavior over the entire field of view. This MTF behavior is very different from that of GRIN lens 124, as shown in FIG. 9.

Figure 16:
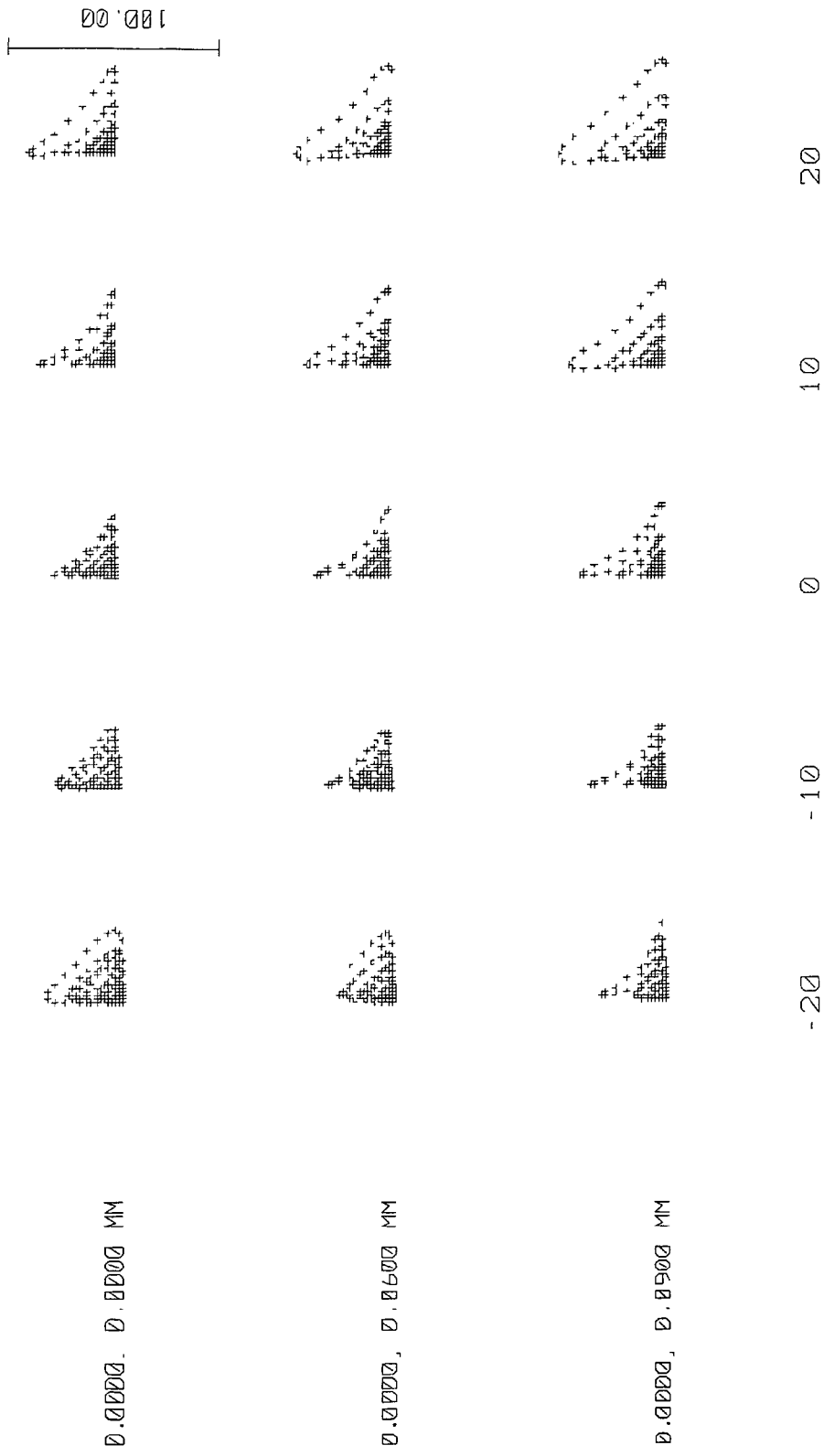

Spot diagrams of modified GRIN lens 134 are shown in FIG. 16, which again shows optics-only information, without signal processing. The spot diagrams are seen to be substantially constant over field angle and image plane. The particular shape of the spot diagrams is determined mainly by the particular rectangularly separable surface profile used with the modified GRIN lens.

The changes that differentiate front surface 135 of modified GRIN lens 134 from front surface 125 of GRIN lens 124 are illustrated by comparison of FIGS. 17 and 18. FIG. 17 represents an on-axis exit pupil profile 150, in a mesh format, of GRIN lens 124. As may be seen, on-axis exit pupil profile 150 is substantially flat with a slightly curved profile. FIG. 18 shows a specialized, on-axis exit pupil profile 155 of modified GRIN lens 134. Specialized exit pupil profile 155 is configured to introduce specific phase modifications to light rays transmitted therethrough in accordance with the desired Wavefront Coding effect. Front surface 125 and back surface 126 of GRIN lens 124 are considered substantially flat, as shown in FIG. 5. A peak-to-valley OPD is approximately 2.2 wavelengths for the profile shown in FIG. 17. In contrast, front surface 135 of modified GRIN lens 134 has a surface profile that implements a rectangularly separable cubic phase modification. In (x, y) coordinates the form of this surface is $\{\alpha(x^3+y^3)\}$, where the constant $\alpha$ is adjusted to achieve a desired surface height. The surface height of front surface 135 of modified GRIN lens 134 is configured, in the example shown in FIG. 18, such that the on-axis peak-to-valley OPD for the modified GRIN lens is approximately 11 wavelengths. Although present on front surface 135 of FIG. 11, this small deviation from flat is difficult to see visually.

Figure 21:
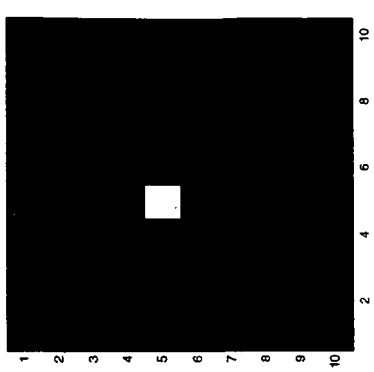
FIGS. 19-21 and 22-24 are sampled images of a point object as a function of the field angle for the systems illustrated in FIGS. 5-10 and FIGS. 11-16, respectively.
Figure 20:
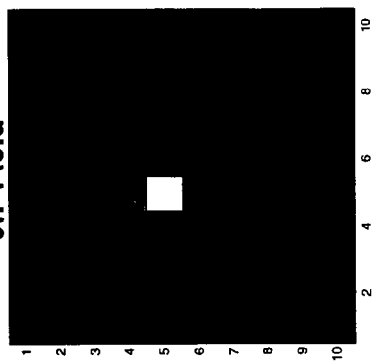
Figure 19:
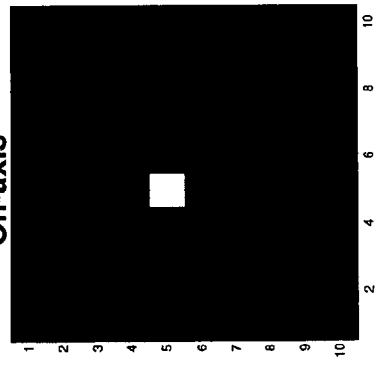

Images of a point object as a function of field angle after sampling with the 3.3 micron detector for various field angles, using modified GRIN lens 134, are shown in FIGS. 19 through 21. The images of point objects, or point spread functions (PSFs), as shown in FIGS. 19 through 21 exhibit a characteristic triangular shape for a rectangularly separable system, and also exhibit little visual change as a function of field angle. The side length of the PSF in units of pixels is about 10.

Figure 24:
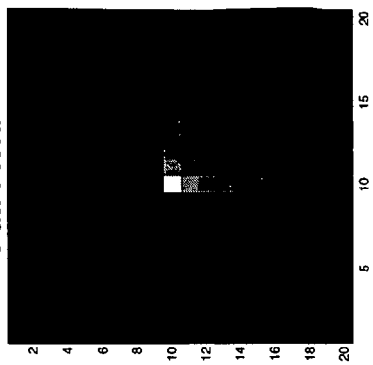
Figure 23:
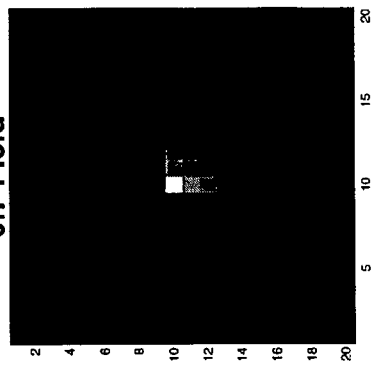
Figure 22:
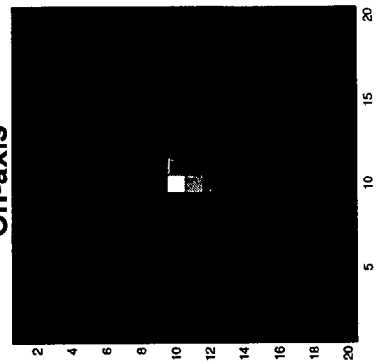

As shown in FIG. 11, the images detected at detector 137 are directed through signal processing unit 142 for final image formation. PSFs that result from processing the images of a point object as imaged through modified GRIN lens 134 through signal processing unit 142 are shown in FIGS. 22 through 24. The signal processing used to produce the PSFs shown in FIGS. 22 through 24 is linear digital filtering. A linear digital filter used in this signal processing is constant over all positions in the image field. After linear filtering of the sampled PSFs of FIGS. 19 through 21, the filtered PSFs of FIGS. 22 through 24 are seen to be spatially compact and essentially constant over the entire field. PSFs as a function of object position, for a broad range of object positions, although not shown, would be similar to those shown in FIGS. 19 through 21 and 22 through 24 for modified GRIN lens 134.

MTFs of an imaging system using modified GRIN lens 134, employing Wavefront Coding before and after signal processing, are shown in FIG. 25. As in FIGS. 22-24, the signal processing illustrated in FIG. 25 is linear digital filtering. The MTFs before signal processing are shown as a lower group indicated by a dashed oval 160; the MTFs after signal processing are shown in an upper group indicated by a dashed oval 170. The MTFs are representative of the entire field and of a range of object positions from 3 to 15 mm. The MTFs also include an ideal pixel MTF from a 3.3 micron detector with 100% fill factor. Referring briefly back to FIG. 9, it may be recalled that an imaging system with a conventional GRIN lens images with poor quality at even one object distance. As may be seen from FIG. 25, lower group 160 of the MTFs resulting from the modified system including the modified GRIN lens are seen to be substantially constant, before signal processing, over all field angles and over a range of object distances. Signal processing, using the same linear digital filter applied over all field positions and object distances, produces the MTFs shown in upper group 170. It is noted that MTFs of upper group 170 have substantially the same height as the best focused, on-axis MTFs from a conventional GRIN lens (assuming the MTFs from the conventional GRIN lens include the pixel MTF of a ideal 3.3 micron pixel).

The linear digital filter used to form images in FIGS. 22-24 and the plots of FIG. 25 is represented in FIGS. 26 and 27. FIG. 26 shows a representation of the linear digital filter in an image format 500, and FIG. 27 shows a representation of the digital filter in a mesh format 550. As may be seen in FIGS. 26 and 27, the linear digital filter is spatially compact, with very few distinct values. Such a digital filter is computationally efficient to implement in hardware processing platforms. In the example shown in FIGS. 26 and 27, the sum of all values of the digital filter is equal to one. A square root of a sum of squared values of this filter then gives an approximation to the RMS gain of additive noise (or noise gain) after application of this filter. Thus calculated, the noise gain for this exemplary digital filter is 3.2.

Figure 28:
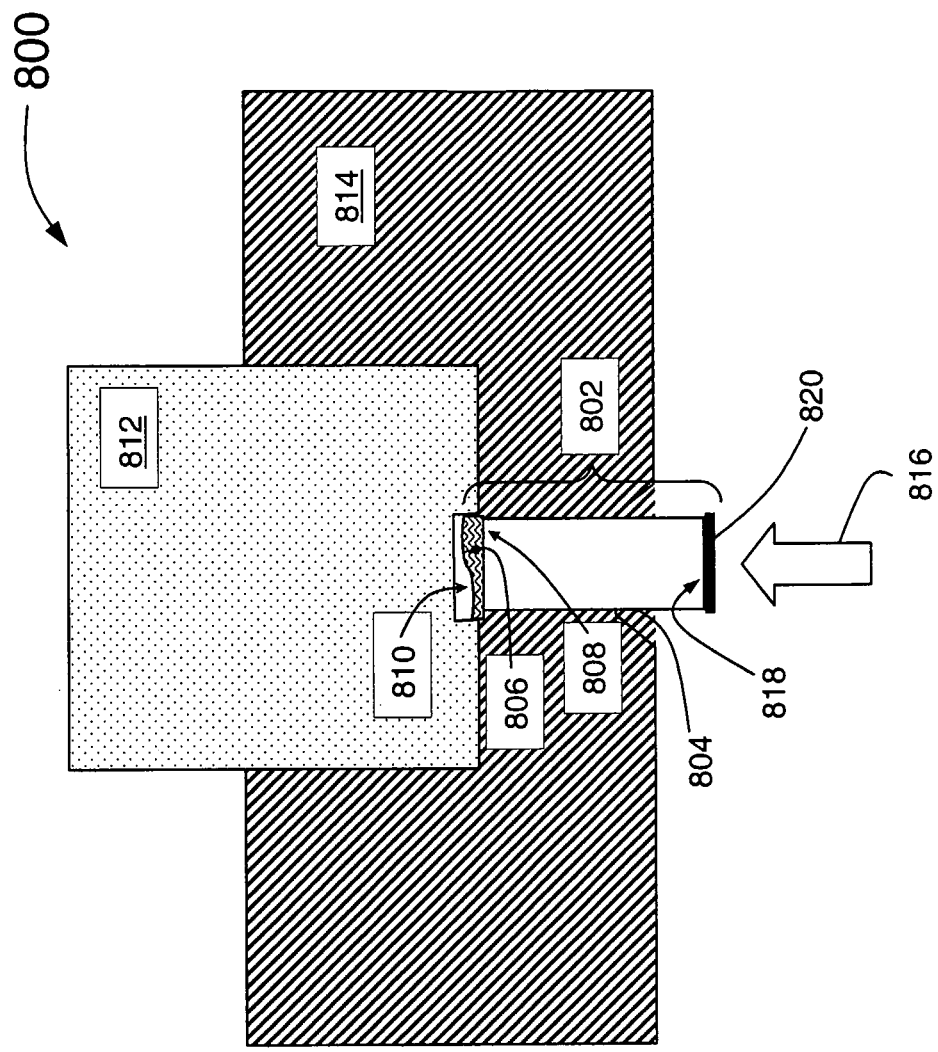
FIG. 28 is a diagrammatic illustration of a fabrication system for the manufacture of the modified GRIN lens.

An example of a fabrication system 800 that produces a modified GRIN lens 802 is shown in FIG. 28, in accord with an embodiment. Modified GRIN lens 802 includes a traditional GRIN lens 804 onto which a specialized phase surface 806 is added. Specialized phase surface 806 is formed on a front surface 808 of traditional GRIN lens 804 using a moldable material such as, but not limited to, a UV-curable material, epoxy, glue, or similar. The shape of specialized phase surface 806 is determined by the shape of a machined surface 810 of a pin 812. A surface 810 of pin 812 is machined to accurately represent the negative of the surface profile desired for specialized phase surface 806. The form taken by the moldable material (and, consequently, specialized phase surface 806) is thus determined by the shape of machined surface 810 of pin 812. The shape of specialized phase surface 806 may be, for instance, aspheric. That is, pin 810 is similar to other pins commonly used in injection molding machines. A measured amount of the moldable material is added to machined surface 810 of pin 812, before insertion of traditional GRIN lens 804 into fabrication system 800. A collar 814 holds traditional GRIN lens 804, pressing it against pin 812. If a UV-curable material is used as the moldable material, for example, UV curing light 816 may be introduced through traditional GRIN lens 804 from a back surface 818. Back surface 818 of traditional GRIN lens 804 may also be coated with a thin film spectral filter 820. If the spectral filter 820 is added to traditional GRIN lens 804 before the molding of specialized phase surface 806, and a UV-curable material is to be used as the moldable material for the specialized phase surface, then spectral filter 820 should be configured to pass light at the UV curing wavelengths appropriate to the specific UV-curable material used. Additionally, pin 812 and collar 814 may be coated with a non-stick material, such as TEFLON®, for ready release of modified GRIN lens 802 after fabrication.

Figure 29:
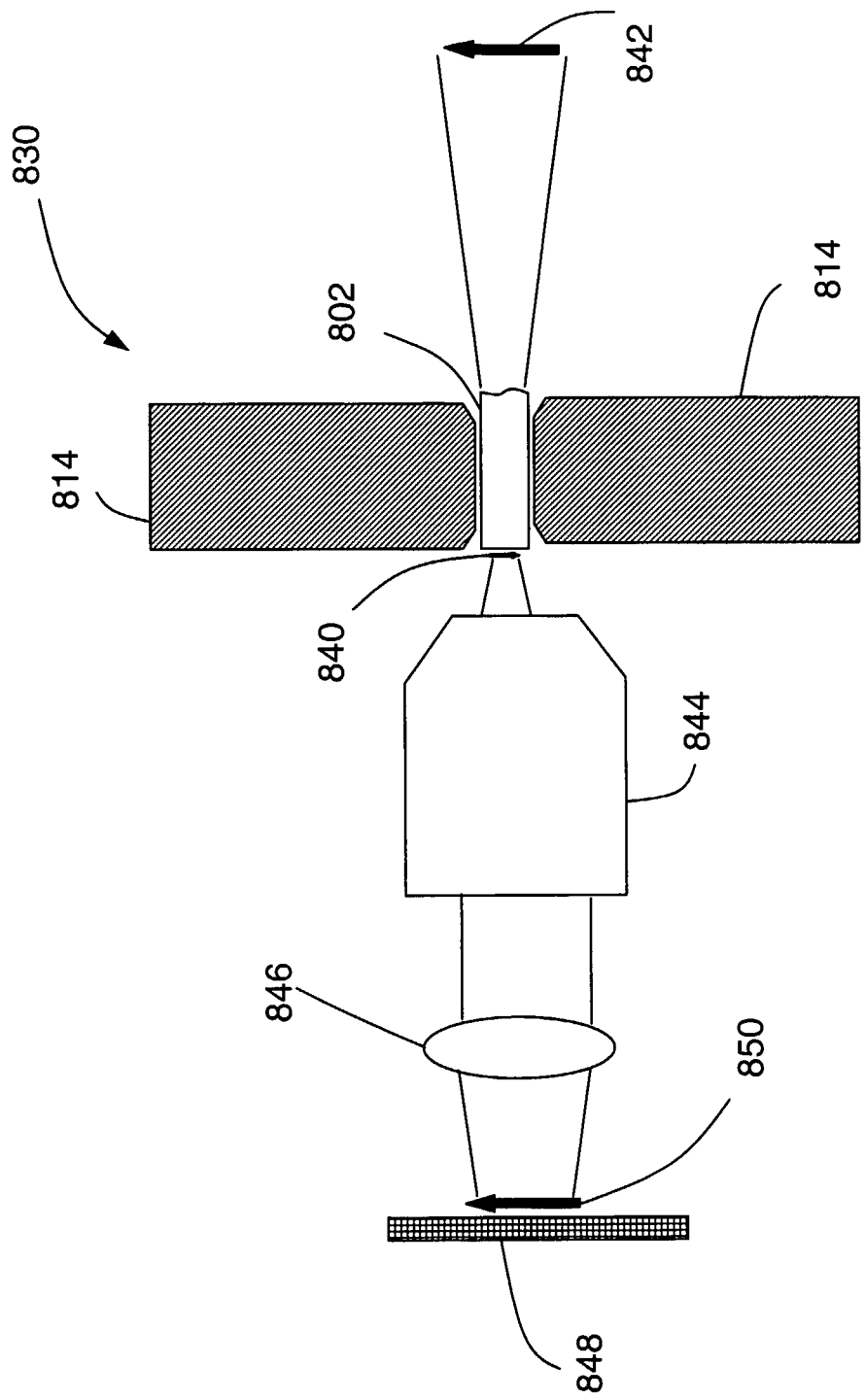
FIG. 29 is a diagrammatic illustration of a measurement system for the evaluation of the modified GRIN lens.

Referring now to FIG. 29 in conjunction with FIG. 28, a measurement system 830 for the evaluation of modified GRIN lenses, such as modified GRIN lens 802 of FIG. 28, is described. After pin 812 is removed, but before collar 814 is removed, modified GRIN lens 802 is used to form an image 840 of a test object 842, such as a point object, a bar chart, or other suitable object for testing. A microscope objective 844 may be used to focus at a resulting image 840 that forms on rear surface 818 of modified GRIN lens 802. Microscope objective 844 cooperates with an imaging lens 846 to transfer image 840 onto a remote detector array 848 as a transferred image 850. Objective 844 may optionally be, for example, infinity corrected. In the example shown in FIG. 29, objective 844 is assumed to be infinity corrected. By imaging test object 842 onto detector array 848 while collar 814 is still attached to modified GRIN lens 802, quality of transferred image 850 may be iteratively checked. Measurement system 830 may then be used to improve the quality of a particular modified GRIN lens 802 by indicating whether the specialized phase surface of that particular lens may need to be re-fabricated. In this way, measurement system 830 may be used to accelerate the reliable fabrication of modified GRIN lenses. This type of fabrication, testing, and rework method may be used in parallel when groups of GRIN lenses are made and attached in a group, for example.

Figure 30:
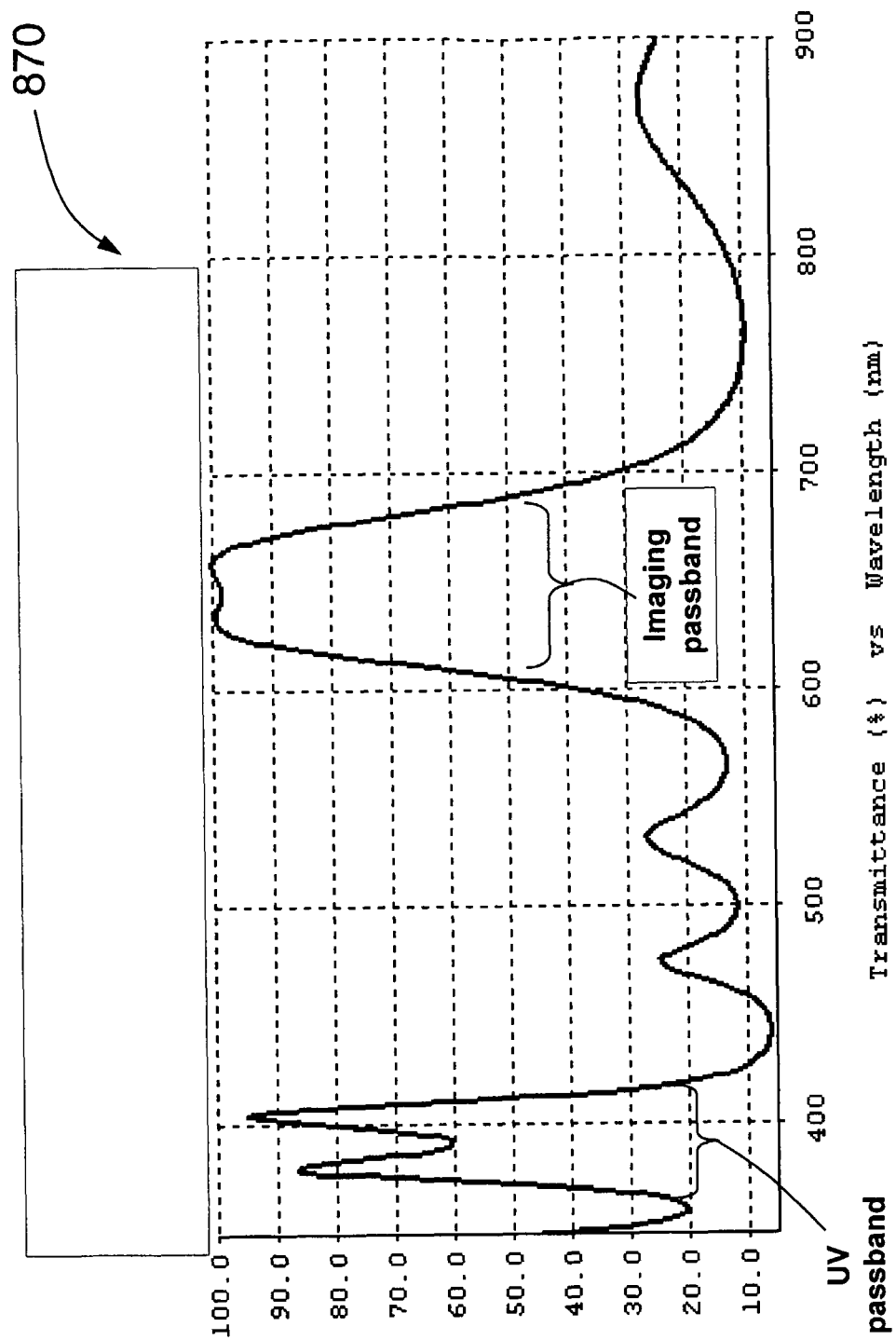
FIG. 30 is a graphical plot of an exemplary thin film spectral filter response suitable for use with the modified GRIN lens.

An example thin film spectral filter response 870 for a modified GRIN lens (e.g., modified GRIN lens 802 of FIG. 28) is shown in FIG. 30. One example of a possible configuration for the thin film spectral filter of FIG. 30 is described in TABLE 1. TABLE 1 lists the layer material and thickness (i.e., the prescription) of this 13-layer thin film bandpass spectral filter. The imaging passband for this 13-layer filter is about 50 nm. The UV passband also has a slightly less than 50 nm wide bandwidth. By appropriate design of the various layers within the filter, imaging bandwidth of spectral filters may be made wide enough to cover the visible band. The effects of the resulting chromatic aberration that would typically result in the traditional GRIN lens can be removed by design of the Wavefront Coded front surface and signal processing of the final images.

TABLE 1

| Material | Thickness (nm) |
|---|---|
| Air | N/A |
| $TiO_2$ | 75.56 |
| $SiO_2$ | 93.57 |
| $TiO_2$ | 34.13 |
| $SiO_2$ | 86.48 |
| $TiO_2$ | 58.57 |
| $SiO_2$ | 45.05 |
| $TiO_2$ | 63.34 |
| $SiO_2$ | 113.25 |
| $TiO_2$ | 94.20 |
| $SiO_2$ | 108.37 |
| $TiO_2$ | 105.07 |
| $SiO_2$ | 145.66 |
| $TiO_2$ | 100.20 |
| Substrate (GRIN lens) | |

Returning briefly to FIG. 4, the maximum image size of modified GRIN lens 104 is, in practice, limited by the range of index of refraction change within the GRIN lens volume. A change of index of refraction of 0.1 is considered common in GRIN lenses. A change of index of 0.3 is considered uncommon. Although such larger changes of index of refraction may become increasingly common in the future, there is a need to balance the size of the image with the index change currently available.

Figure 31:
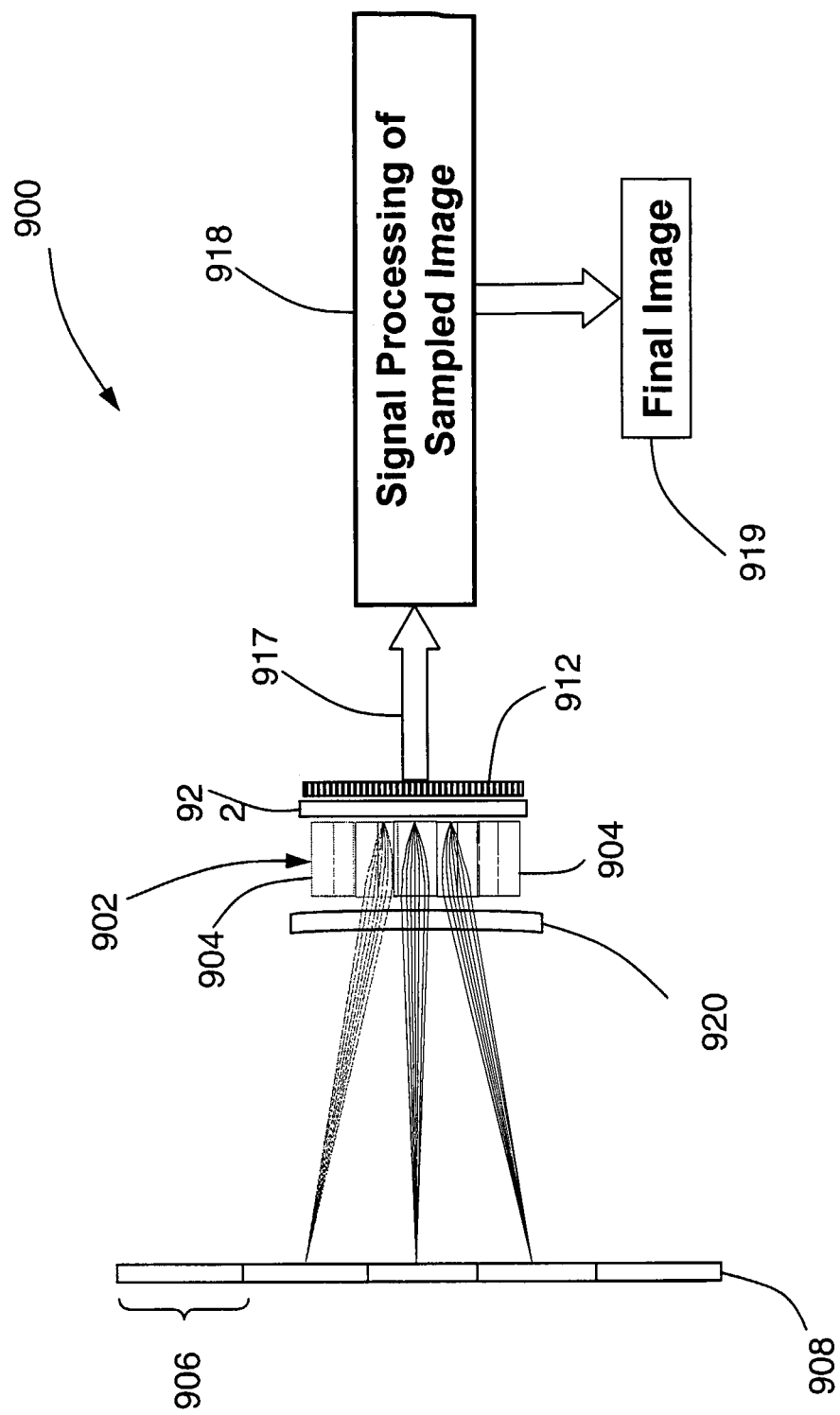
FIG. 31 is a diagrammatic illustration of an imaging system in accordance with the present disclosure, shown here to illustrate the use of a set of grouped GRIN lenses for increasing the field of view of the imaging system.

One system for imaging large objects and for forming increasingly larger size images is shown in FIG. 31. A system 900 includes a group 902 of a plurality of GRIN lenses 904 to form large images. Each of the plurality of GRIN lenses 904 may be, for example, modified GRIN lens 802 or traditional GRIN lens 804 of FIG. 28. Each one of plurality of GRIN lenses 904 images a small field of regard 906 (i.e., the portion of the object seen by each GRIN lens) of a large object 908 onto a detector 912, which converts the detected optical image into an image data signal 917. Image data signal 917 is then processed at a signal processor 918 in order to produce a final image 919. As a result, the total image size of final image 919 may be much larger than the image size that may be produced by singly using any one GRIN lens.

In FIG. 31, group 902 of plurality of GRIN lenses 904 is configured such that uninterrupted coverage of the entire object 908 may be achieved. Field of regard 906 of each GRIN lens may overlap the fields of regard of any other GRIN lens. System 900 may optionally include a steering optics 920 for controlling the field of regard of individual GRIN lenses. Steering optics 920 is shown in a refractive configuration in FIG. 31, but other configurations may be used. For example, in a diffractive configuration, steering optics 920 may include one or more prisms with additional surface variations for optical correction. Such prisms may also be mounted directly onto the front surface of the group of GRIN lenses. Steering optics 920 may also be configured to exhibit optical power and to perform some aberration balancing.

Referring now to FIG. 31 in conjunction with FIG. 4, the Wavefront Coding surface added to the front surface of GRIN lens 104 of FIG. 4 may be implemented in system 900 of FIG. 31 in, for example, one of three ways: 1) an aspheric surface may be added to a separate refractive and/or diffractive steering optics, such as a part of steering optics 920; 2) an aspheric surface may be directly added to the front surface of each one of plurality of GRIN lenses 904 of group 902; or 3) the effect of customized front surface 106 on the imaging wavefront may be integrated into the design of each individual GRIN lens of group 902. It is noted that the third listed method would not require a specialized aspheric surface to be attached or formed at the front or back surface of each GRIN lens, as was shown in the fabrication method shown in FIG. 28.

Still referring to FIG. 31, an optional correction plate 922 or, simply, free space may be disposed between group 902 of GRIN lenses 904 and detector 912. For example, if a diffractive or a volume element is used as correction plate 922, additional aberrations from each GRIN lens may be mitigated. If free space is used in place of correction plate 922, then the effect of propagation through free space may help smooth the sub-image boundaries between the individual GRIN lenses. Also, the boundaries between GRIN lenses may be blackened so as to act as field stops.

Continuing to refer to FIG. 31, since each GRIN lens 904 images a different field of regard 906, the individual GRIN lenses, and their corresponding Wavefront Coding optics, may be specially designed for wide fields of view. Furthermore, the optical property of each individual GRIN lens may be customized to image well at particular incident angles at which that GRIN lens receives the light from the object. In this way, the aberrations inherent in the on-axis viewing GRIN lenses and the off-axis viewing GRIN lenses may be optimally controlled. Signal processing 918 for producing final image 919 may also be customized for each individual GRIN lens. The signal processing applied may be, for example, similar to the linear filtering demonstrated in FIGS. 26 and 27.

Figure 32:
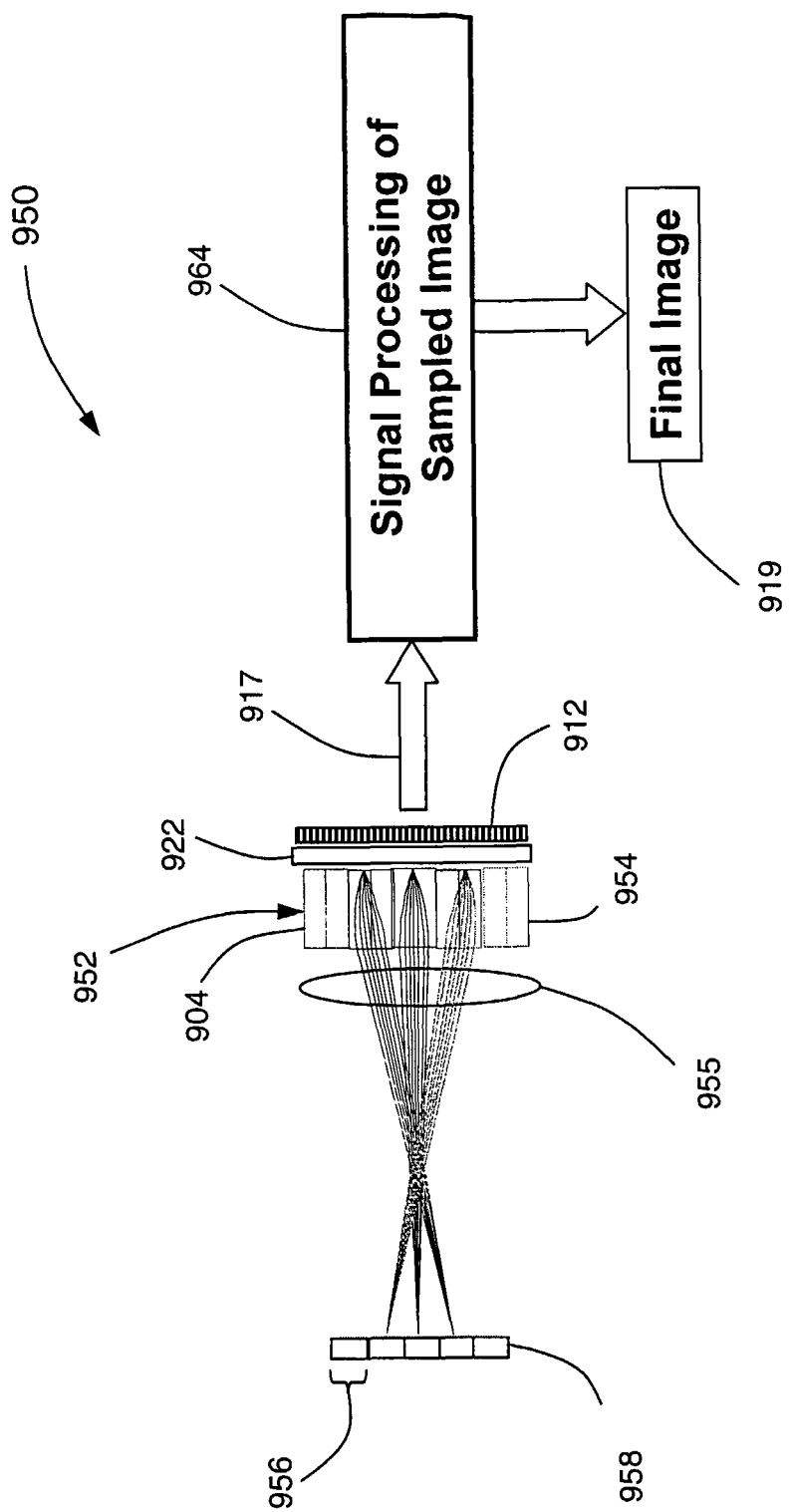
FIG. 32 is a diagrammatic illustration of another imaging system in accordance with the present disclosure for increasing the field of view of the imaging system, shown here to illustrate the use of an alternative correction and steering optics.

Referring now to FIG. 32 in conjunction with FIG. 31, another form of the groups of GRIN lens system (employing Wavefront Coding) is shown in FIG. 32. This system shown of FIG. 32 is similar to system 900 of FIG. 31 except at the steering optics. Like system 900 of FIG. 31, a system 950 includes a group 952 of a plurality of GRIN lenses 954. However, unlike system 900, system 950 includes steering optics 955 configured such that different fields of regard 956 of an object 958 cross at some distance before detector 912. This arrangement of system 950 helps to reduce some of the requirements placed on a signal processor 964 in the signal processing of the detected image. The magnification of group 952 of GRIN lenses 954 may be negative such that the image is inverted. It may be seen in FIG. 31 that portions of object 908 that are farther from the optical axis (i.e., the surface normal from the center of detector 912) are imaged onto detector 912 closer to the optical axis for a single GRIN lens. Signal processing 918 is then required to sort the sub-images resulting from each field of regard 906 and to correct the magnification. System 950 of FIG. 32 does not have this magnification problem because portions of object 958 that are farther from the optical axis are imaged farther from the optical axis in a particular GRIN lens. Therefore, the resulting sub-images do not need to be reversed.

Continuing to refer to FIGS. 31 and 32, signal processing 918 and 964 of FIGS. 31 and 32, respectively, will still have to remove objectionable distortions and possible illumination fall off with field angle as well as remove the blur inherent in images due to Wavefront Coding. It is recognized that distortion generally increases as the image field increases with GRIN optics as does the illumination decrease. Distortion and illumination correction may be performed before or after the blur removal. Blur removal may be achieved, for example, with a simple linear filter as illustrated in FIGS. 26 and 27.

Figure 33:
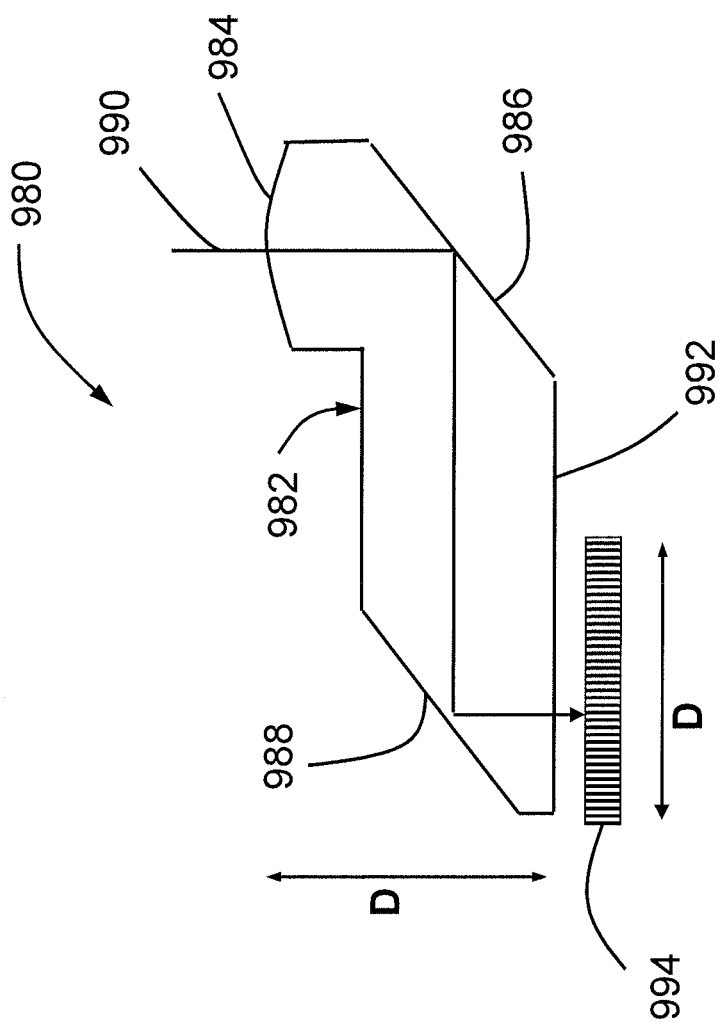
FIG. 33 is a diagrammatic illustration of an alternative imaging system in accordance with the present disclosure, shown here to illustrate the use of reflective, miniature optics for further reducing the overall length of the imaging system.

By introducing reflections into miniature optics such as shown in FIG. 33 the resulting overall length D of a reflective imaging system 980 may be decreased. In the example illustrated in FIG. 33, a reflection optic 982 includes a first surface 984, which may, for instance, be refractive, diffractive, or include a Fresnel lens. Reflection optic 982 also includes additional reflective surfaces 986 and 988 that may be utilized to further modify the wavefront of a light 990 passing through reflection optic 982. An aperture stop (not shown) may be additionally located at or near one of the reflective surfaces. Also, additional phase modification may be introduced at final surface 992. The material forming reflection optic 982 may be a GRIN material, a general volume element or a homogeneous material. As additional degrees of freedom are introduced to reflection optic 982 by the presence of reflected surfaces 986 and 988, these additional reflective surfaces may offer further customizability to offset the reduction in degrees of freedom when replacing a GRIN or general volume material with a homogeneous material. Reflective imaging system 980 may be configured such that the system is substantially telecentric. That is, the chief ray angles through reflection optic 982 may be made small such that the resulting incident angles at detector 994 are small, thereby ensuring that reflective imaging system 980 behaves substantially as a telecentric system. The chief ray angle of light ray transmitted through reflective imaging system 980 may be further controlled to reduce the detector intensity loss. Refractive or diffractive surface may also be implemented on other surfaces of reflection optic 982. If final surface 992 is kept flat, then reflection optic 982 may be mounted directly on the surface of detector 994 in a manner similar to modified GRIN lens 104 of FIG. 4. Mounting directly on the detector, or equivalently on the detector cover plate, may greatly decrease the fabrication tolerance of the system. However, if it is impractical to mount imaging system 980 directly on detector 994, imaging system 980 may also be mounted at some distance away from the detector.

Figure 35:
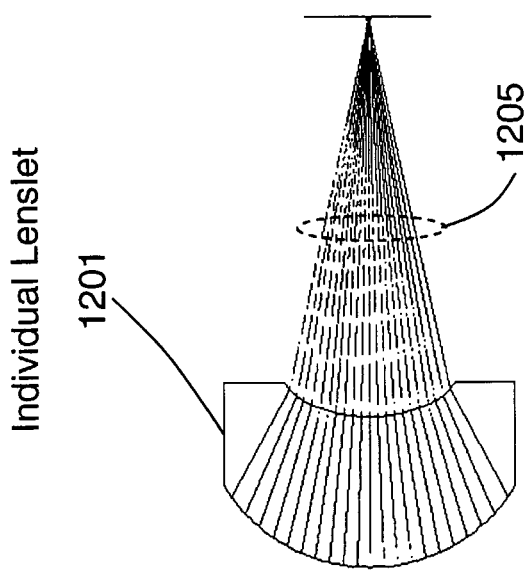
FIG. 35 is a diagrammatic illustration, in elevation, of a lenslet array formed from a plurality of individual lenslets, as shown in FIG. 34, which lenslet array is suitable for use in place of the grouped GRIN lenses shown in FIGS. 31 and 32.
Figure 34:
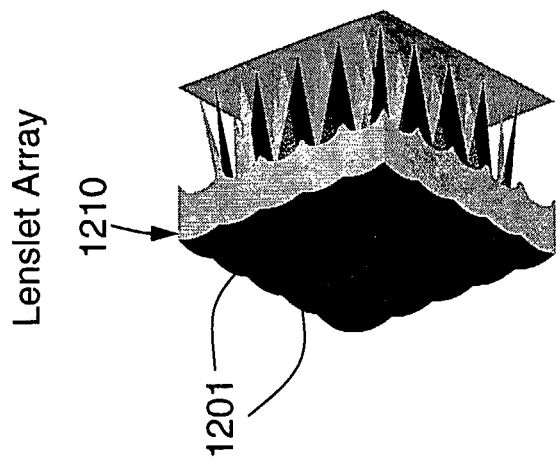
FIG. 34 is a ray diagram of light rays incident on an individual lenslet forming a portion of a lenslet array.
Figure 36:
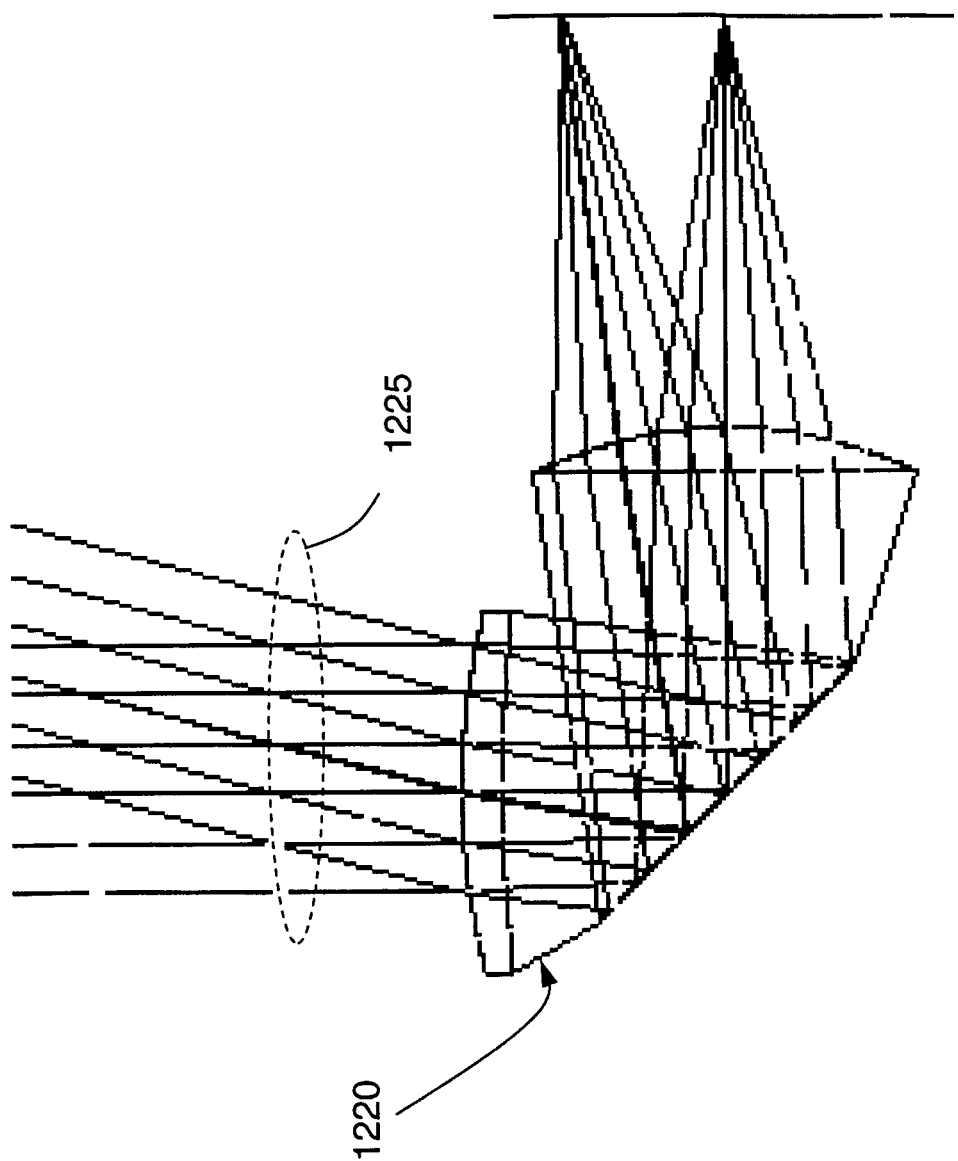
FIG. 36 is a ray diagram of light rays transmitted through a folded optics configuration suitable for use in the imaging systems shown in FIGS. 31 and 32.

FIGS. 34-36 illustrate other configurations of the optical components broadly represented in FIGS. 31 and 32. As earlier discussed, a group of specialized GRIN lenses are used as the basis of FIGS. 31 and 32. In general, there are a many other types of imaging configurations that may be used in place of the GRIN lens array. That is, similar functionality to those configurations described in FIGS. 31 and 32 may be achieved using groups of individual optics. For example, instead of the grouped GRIN lenses 902 and 952 of FIGS. 31 and 32 the grouped optical elements can be a simple lenslet 1201, through which a bundle of light rays (indicated by a dashed oval 1205) may be transmitted, of FIG. 34 grouped into a lenslet array 1210 of FIG. 35. The surface form of the array may be generalized aspheric optics, including Wavefront Coding, such that the type of imaging performance achieved by the GRIN lenses, and shown in FIGS. 11-25, may be achieved with the lenslet array. Multiple lenslet arrays may also be used such that the arrays are stacked along the optical axis resulting in increasingly higher quality imaging. The separation between imaging arrays along the optical axis can be maintained through mounting features formed on the arrays or through separate array spacers. Array spacers are essentially optical disks with index of refraction different from that of the array optics or possibly non-optical disks with holes centered on the optical axes of the array optics.

FIG. 36 shows another optical configuration that can be used in the grouped lenses 902 and 952 of FIGS. 31 and 32. A folded optics 1220 used in FIG. 36 acts to fold the path of the optical axis allowing both an additional optical degree of freedom at the reflection surface and a change in orientation of the detector plane. As a result, a bundle of light rays 1225 traveling through folded optics 1220 are re-directed in a direction approximately 90-degrees away from the incident direction. Such folded optical configurations can be constructed with a single physical component in order to simplify mounting and alignment.

The miniature optics so far described generally have more than a single layer of material through which light passes. In FIGS. 31 and 32 three different layers are represented. The first layers (920 and 955) are shown to act as correction and steering optics. Group optics 902 and 952 collect the light and transfer toward the detector. Layer 922 acts as a further correction plate. Each of these layers may be fabricated in an array fashion such that components important to systems like 900 and 950 of FIGS. 31 and 32 are replicated across and along the array. Individual components suitable for systems 900 and 950 may be acquired by cutting or dicing the needed components from the array. As is well known, electronic sensors, such as CMOS sensors, are fabricated in a array fashion on a silicon substrate or wafer. Individual sensors are acquired from the wafer by cutting or dicing.

Figure 37:
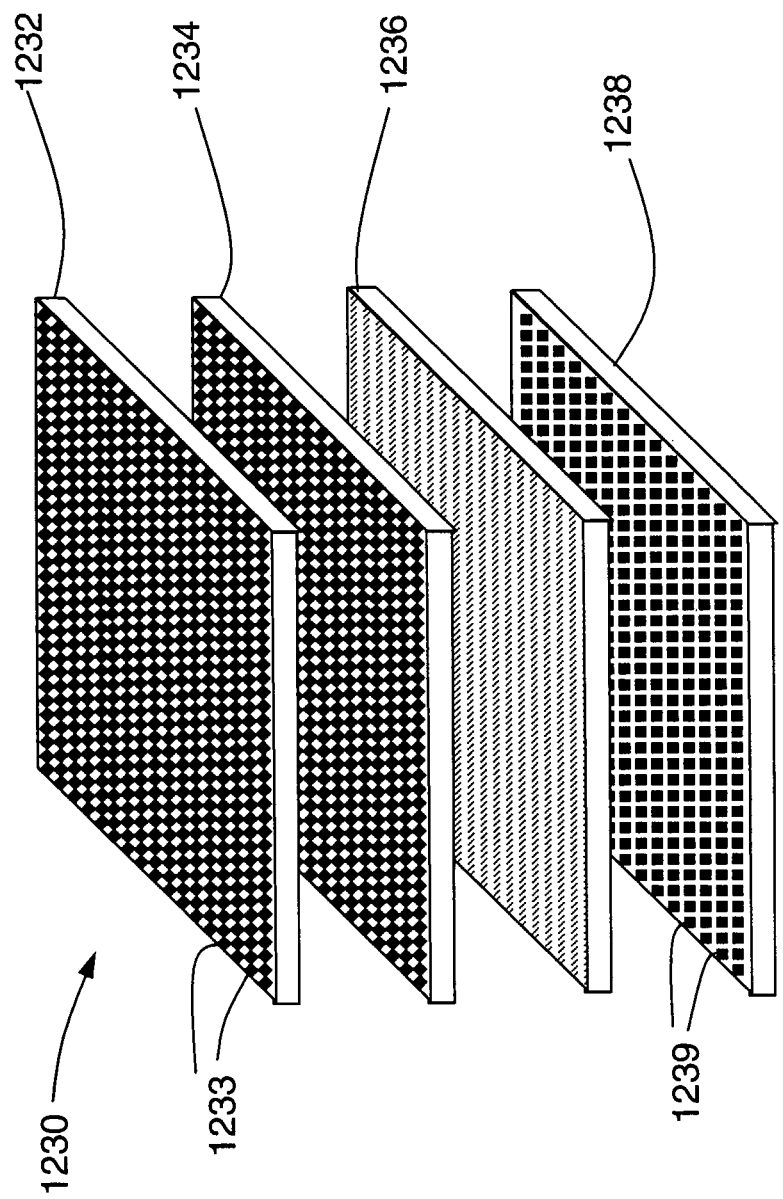
FIG. 37 is a diagrammatic illustration, in elevation, of a general array representation of a miniature optical system including several imaging systems, such as those shown in FIGS. 31 and 32.

FIG. 37 shows a general array representation of miniature optical systems, of which systems 900 and 950 of FIGS. 31 and 32 are particular examples. FIG. 37 shows a system 1230 of stacked wafers. An array of fabricated optical elements can also be called "wafer optics" as 1232 and 1234 of FIG. 37. In wafer optics 1232 and 1234, each diamond 1233 represents optics at the sensor level. An array of optics that acts as correctors can be called "wafer of corrective elements" as on a wafer 1236 of FIG. 37. In wafer of corrective elements 1236, details are on the pixel level and replication is on the sensor level. If the replicated scale and spatial locations of all wafer optics matches the alignment of a CMOS wafer 1238 then the entire set of wafer optics and electronics can be bonded together forming an array of imaging systems. In CMOS wafer 1238, each square 1239 represents one N×M pixel sensor. This array may be diced, thereby leading to a complete set of assembled optics plus electronics. That is, wafers may be bonded together and then the stack is diced into individual sensors plus optics. In general the functions of imaging optics and corrective optics may be realized with one or more individual wafers. The particular designs of these elements may be optimized with that of the sensor pixels for increased light capture and sensitivity.

Returning briefly to FIGS. 31 and 32, details of correcting and steering optics, such as steering optics 920 and 958 of FIGS. 31 and 32, respectively, are discussed in further detail. The correcting and steering optics may be designed with additional functionality that provide further advantages when used in combination with the imaging systems described thus far.

Figure 38:
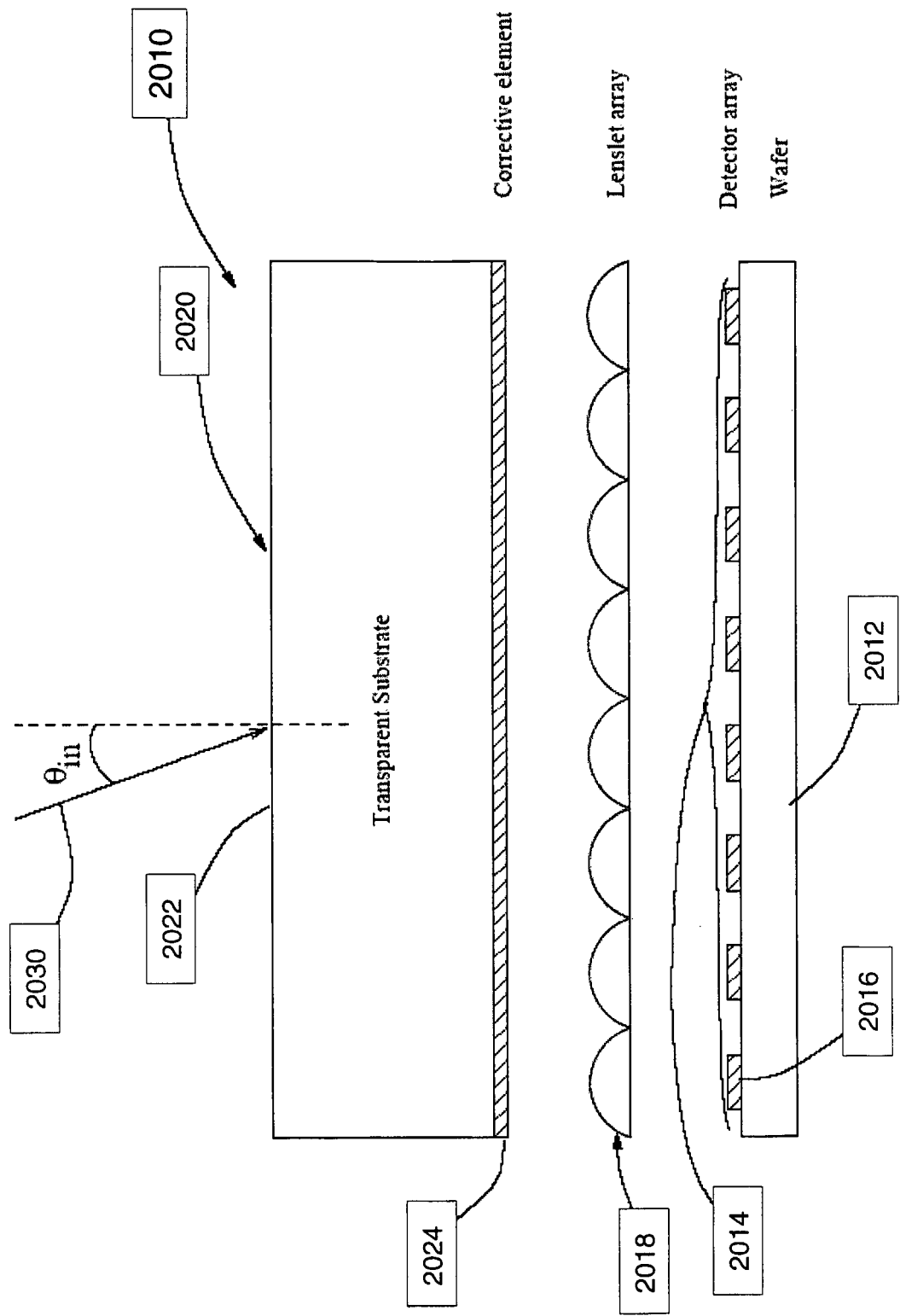
FIG. 38 is a diagrammatic illustration, in partial cross section, of a detector array subsystem in accordance with the present disclosure.

The wafer of corrective optics 1236 and CMOS wafer 1238 of FIG. 37 can be more fully described by FIG. 38. FIG. 38 illustrates a subsystem 2010 including a combination of optics and electronics, in a cross sectional view. Subsystem 2010 includes a CMOS wafer 2012 supporting a detector array thereon. Detector array 2014 includes a plurality of detector pixels 2016 distributed across CMOS wafer 2012. Subsystem 2010 further includes a lenslet array 2018 for increasing the light capture of the detector array. Additionally, subsystem 2010 includes a ray correction apparatus, generally indicated by a reference numeral 2020. Ray correction apparatus 2020 is another example of wafer of corrective elements 1236 of FIG. 37. In the embodiment shown in FIG. 38, ray correction apparatus 2020 includes a transparent substrate 2022 with a corrective element 2024 attached thereto. Corrective element 2024 may be one optical element or a combination of a variety of optical elements including, but not limited to, diffraction gratings, refractive elements, holographic elements, Fresnel lenses and other diffractive elements. Ray correction apparatus 2020 is configured such that incident light (indicated by an arrow 2030) may be received over a wide range of incident angles $\theta_{in}$ and still reach one of plurality of detector pixels 2016. That is, more of incident light 2030 would reach detector pixel array 2014 regardless of incident angle $\theta_{in}$ with the presence of ray correction apparatus 2020 than without. In essence, if the arrow indicating incident light 2030 is thought of as the chief ray of incident light 2030, then ray correction apparatus 2020 substantially corrects for non-ideal angles of incidence of the chief ray such that the incident light would reach one of the plurality of detectors even when incident from very far off of normal incidence. In this way, subsystem 2010 may accept input light over a fairly large cone of incident angles and still function effectively. In the embodiment shown in FIG. 38, corrective element 2024 should be positioned close enough to lenslet array 2018 in order to minimize chromatic dispersion and pixel cross-talk.

Figure 39:
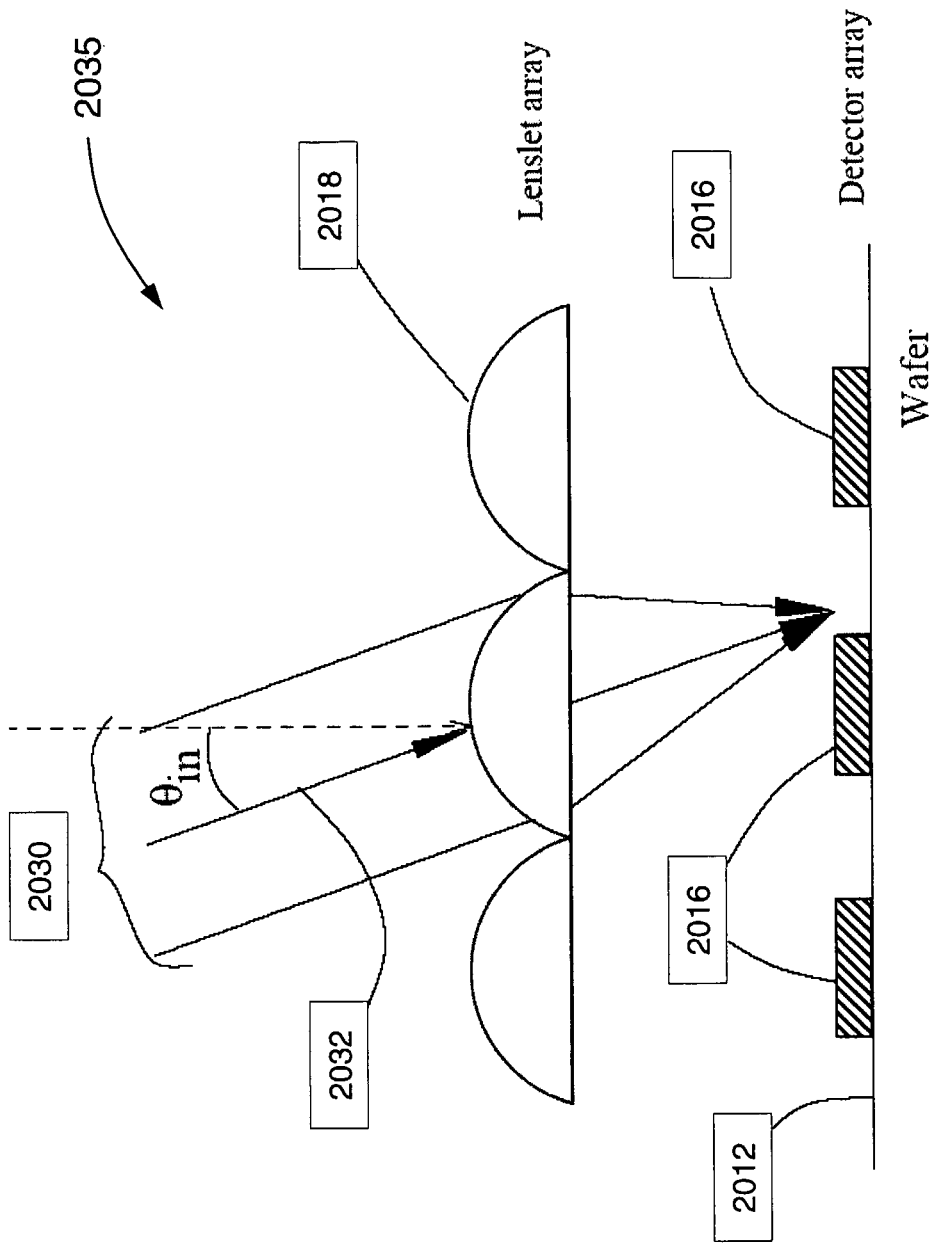
FIG. 39 is a diagrammatic illustration, in partial cross section, of a portion of a prior art detector array subsystem, shown here to illustrate light rays traveling through a lenslet array onto a substrate including a detector array without any ray correction.

For comparison, a prior art detector array subsystem without the ray correction apparatus is shown in FIG. 39. FIG. 39 shows a cross sectional view of a portion of a detector array system 2035. As in FIG. 38, incident light beam 2030, including a chief ray 2032, is incident on a portion of lenslet array 2018 at an incident angle $\theta_{in}$. Without the presence of any ray correction in detector array system 2035, lenslet array 2018 focuses incident light beam 2030 at a spot in between detectors 2016 such that the incident light does not fall on a detector and is consequently lost thereby reducing the sensed illumination. Common methods of increasing the detected light from large incident ray angle include shifting of the optical center of the lenslets 2018 relative to the pixels 2016. While shifting the optical center of the lenslets improves performance somewhat, the improvement in possible performance is limited due to vignetting caused by the 3D nature of common pixel structures. Therefore, subsystem 2010, including ray correction apparatus 2020, as shown in FIG. 38 provides a significant improvement in performance over prior art systems without the inclusion of a ray correction apparatus.

Figure 40:
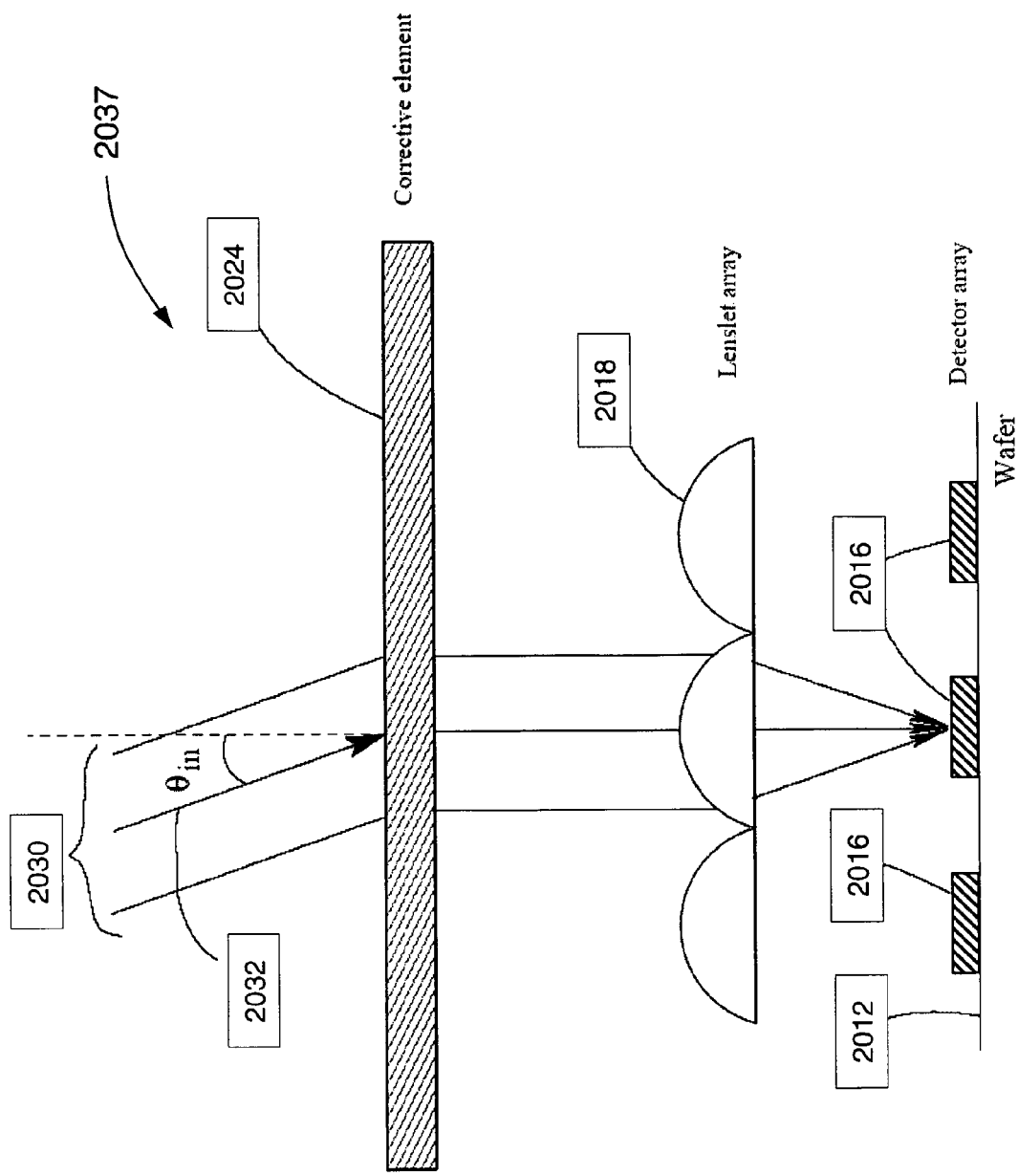
FIGS. 40 and 41 are diagrammatic illustrations, in partial cross section, of a portion of the detector array subsystem in accordance with the present disclosure, and are shown here to illustrate light rays traveling through the lenslet array and onto the detector array with the corrective element, in accordance with the present disclosure, in different locations with respect to the lenslet array.
Figure 41:
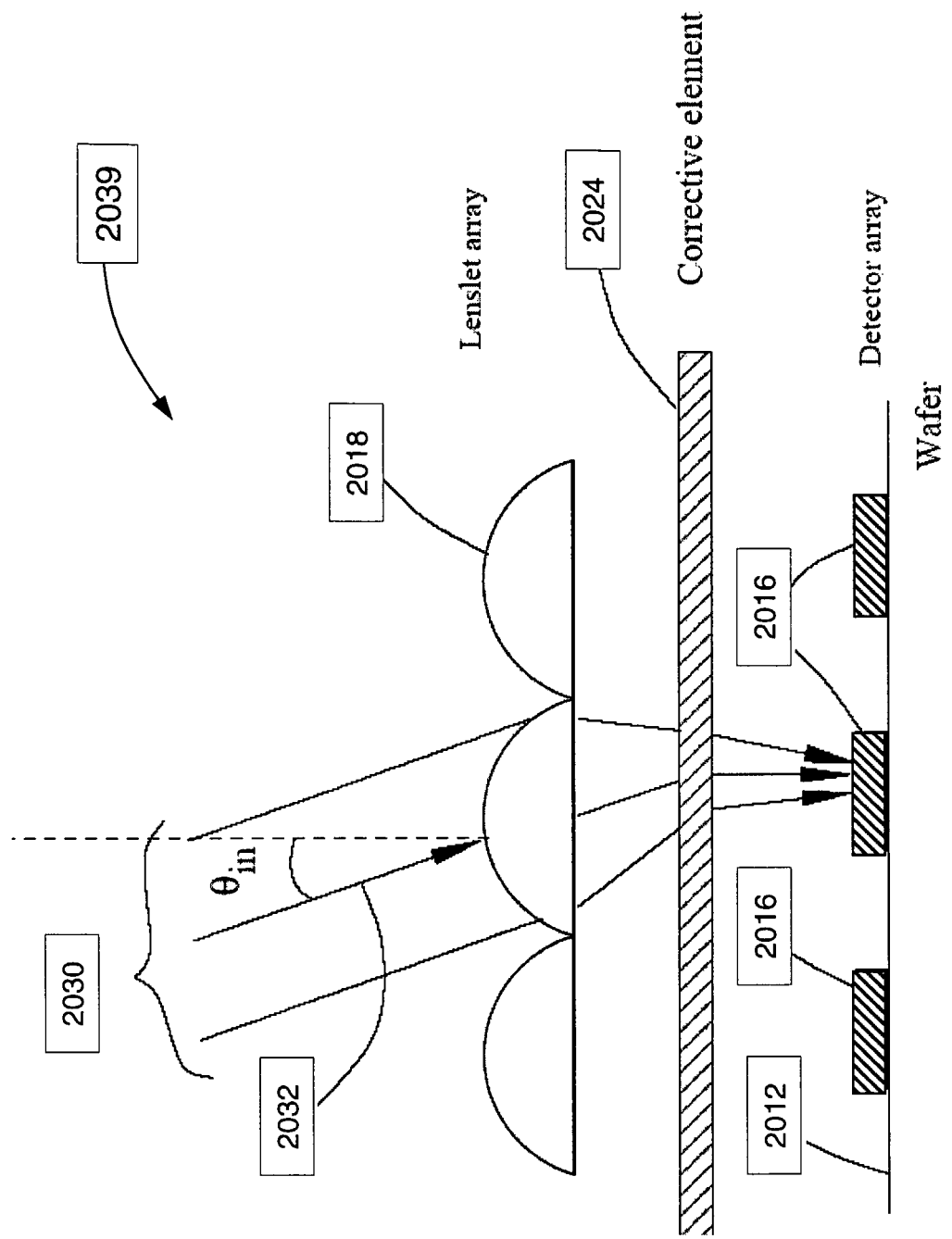

Turning now to FIGS. 40 and 41 in conjunction with FIG. 38, details of the effect of the presence of the corrective element in the detector array system are illustrated. First referring to FIG. 40, a subsystem 2037 includes corrective element 2024 before the incoming light encounters the lenslet array. Corrective element 2024 receives incident light beam 2030 at an incident angle $\theta_{in}$. Corrective element 2024 is configured so as to correct for the off-normal incidence such that, after passing through corrective element 2024, incident light beam 2030 is then directed toward lenslet array 2018 at a near-normal angle such that the incident light beam is focused onto one of the detectors.

FIG. 41 shows a similar configuration including a corrective element but, unlike in FIG. 40, the corrective element is placed in the path of the incident light beam propagation after the lenslet array. As in FIG. 39, the lenslet array in FIG. 41 begins to focus incident light beam 2030 at a spot in between detector pixels 2016. However, corrective element 2024 in FIG. 41 serves to correct the direction of propagation of the resulting light beam such that the light beam then falls on one of detectors 2016, thereby maximizing the detected illumination.

Figure 42:
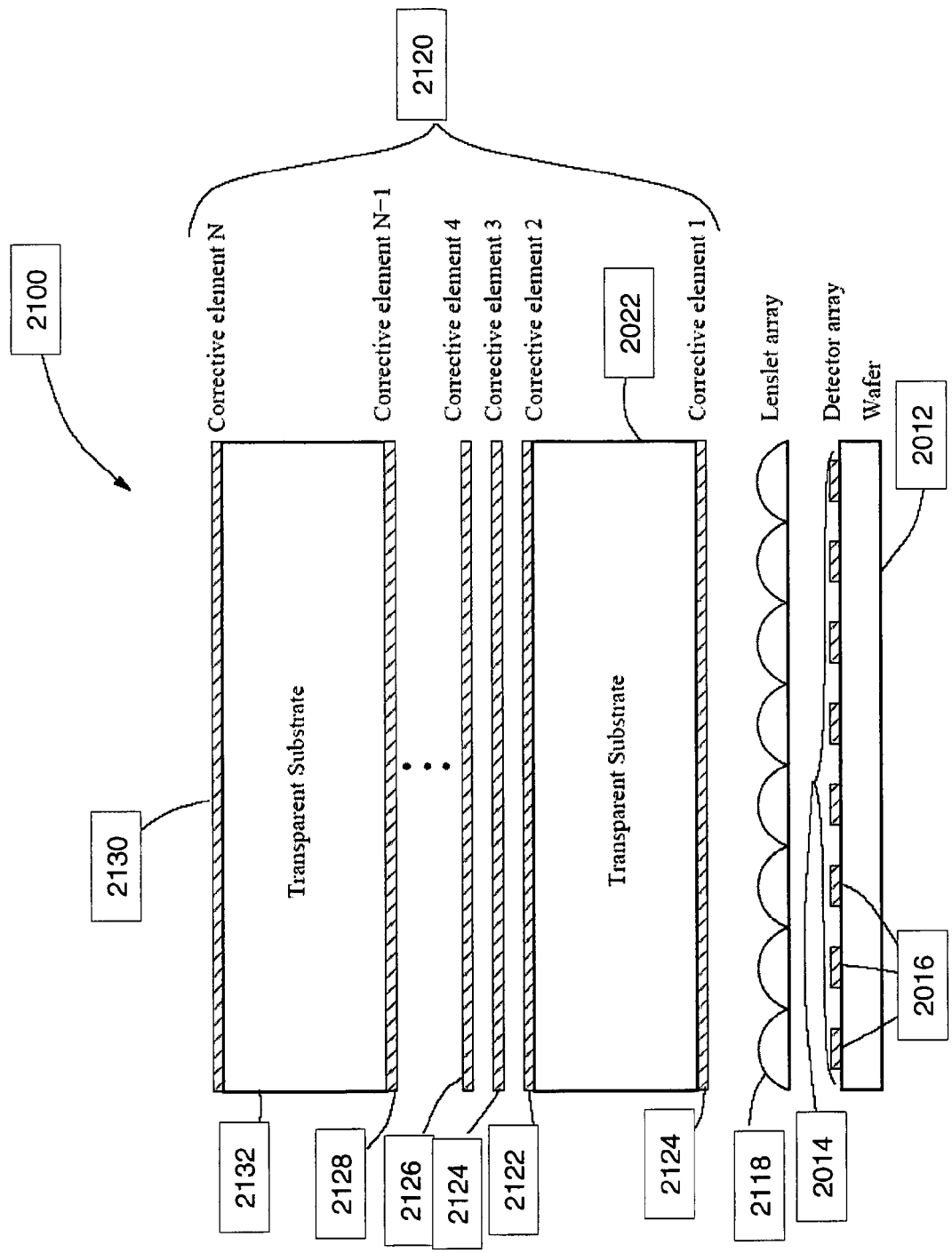
FIG. 42 is a diagrammatic illustration, in partial cross section, of a ray correction system in accordance with the present disclosure, including a plurality of corrective elements in a stack over the lenslet array.
Figure 43:
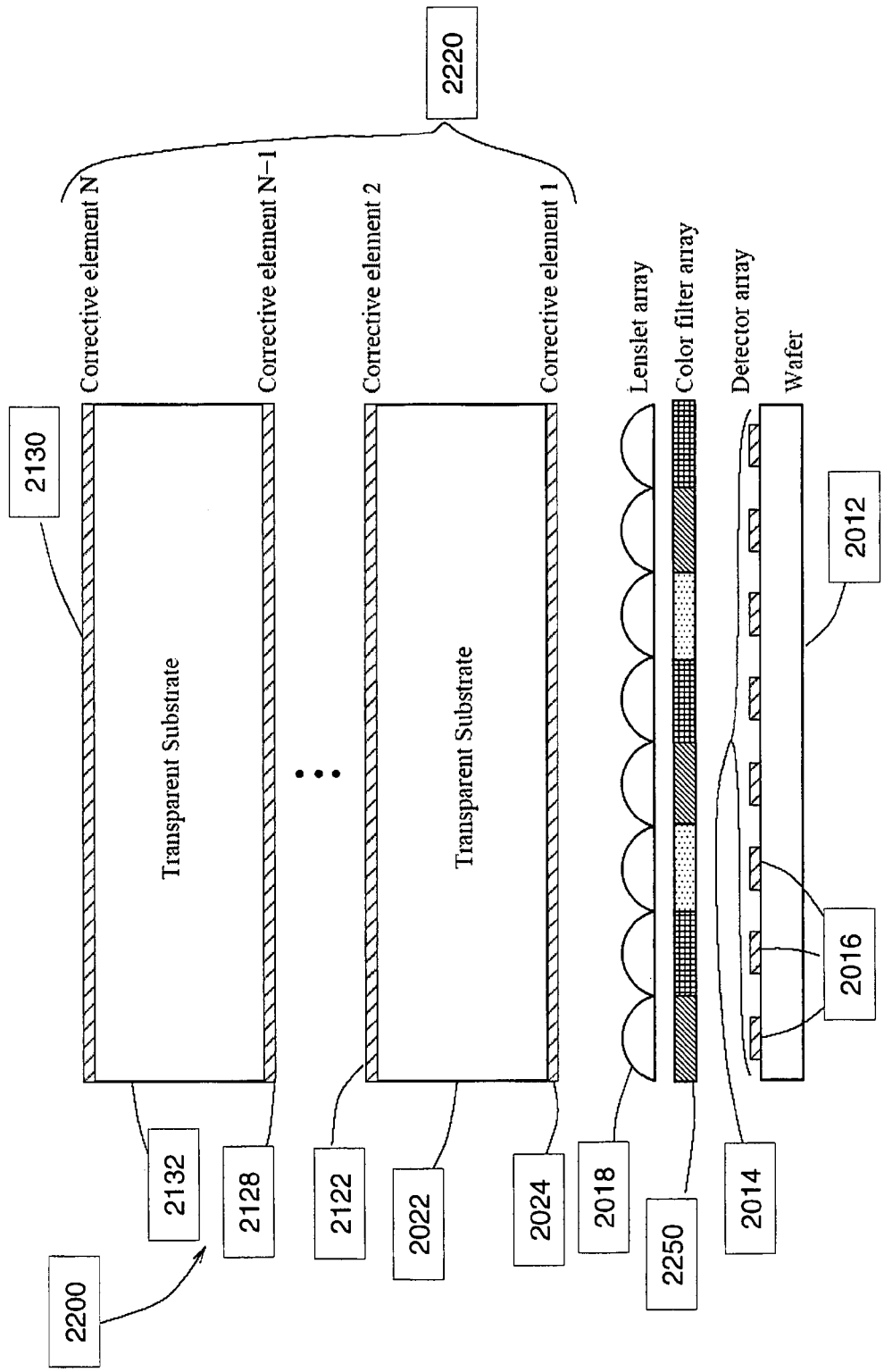
FIG. 43 is a diagrammatic illustration, in partial cross sectional view, of another embodiment of a ray correction system, in accordance with the present disclosure, including a plurality of corrective elements as well as a color filter array.

Turning to FIGS. 42 and 43, embellishments to the ray correction apparatus in accordance with the present disclosure are shown. FIG. 42 shows a detector system 2100 including a ray correction apparatus 2120 including a plurality of corrective elements and transparent substrates. In the example shown in FIG. 42, ray correction apparatus 2120 includes a plurality of corrective elements 2122, 2124, 2126, 2128 and 2130. These corrective elements may be supported by a plurality of transparent substrates (such as transparent substrate 2022 supporting corrective elements 2124 and 2122, and a transparent substrate 2132 supporting corrective elements 2128 and 2130) or be independently positioned (such as corrective elements 2124 and 2126. The stacking of a plurality of corrective elements yields further ray corrective effects than would be possible with a single corrective element such that more compensation may be effected for, for instance, large range of chief ray angles, wider range of wavelengths or higher diffraction efficiency. Detectors 2016 may include, for example, monochromatic detectors and polychromatic detectors.

FIG. 43 shows a configuration similar to detector system 2100 of FIG. 42 but also includes a color filter array. A detector system 2200 of FIG. 43 includes a combination of detector array 2014, lenslet array 2018, a ray correction apparatus 2220 including a plurality of corrective elements and transparent substrates in a stack configuration, as well as a color filter 2250 for color separation. The plurality of corrective elements in ray correction apparatus 2220 may be configured such that the ray correction effected by the ray correction apparatus is tailored for a variety of wavelengths corresponding to the colors in the color filter. For example, ray correction apparatus 2200 may be configured such that a green component of the incident light beam is directed specifically through the detector/color filter combination configured to detect green light.

Figure 44:
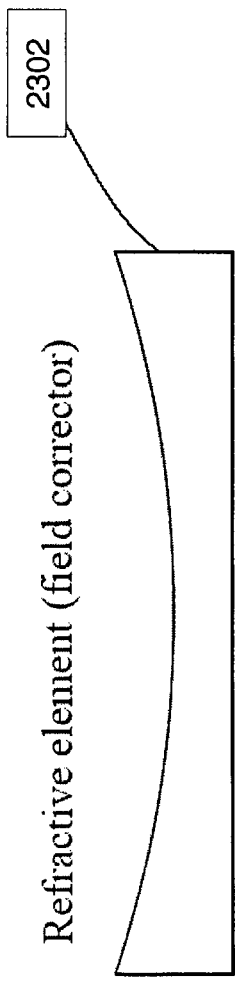
FIGS. 44-46 are diagrammatic illustrations, in cross section, of examples of corrective elements suitable for use as corrective elements in the ray correction system of the present disclosure.
Figure 45:
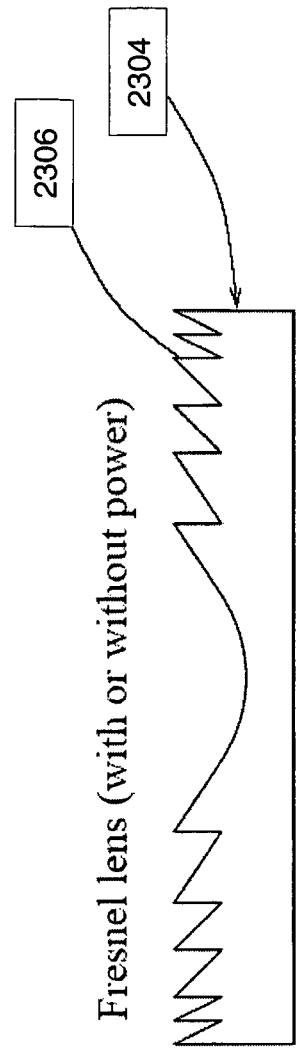
Figure 46:
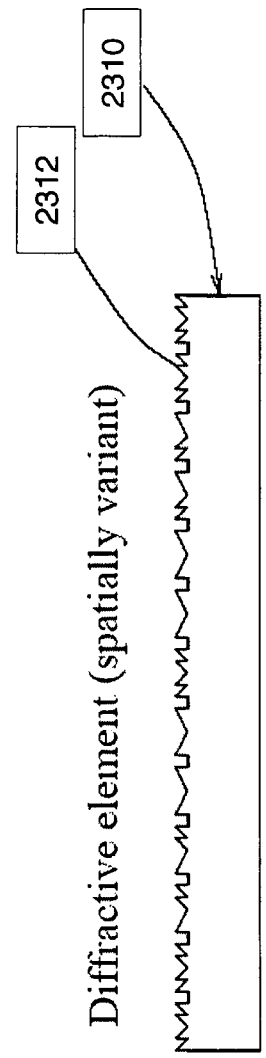

FIGS. 44-46 illustrate three examples of element forms that are suitable for use as corrective elements in the ray correction apparatus of the present disclosure. FIG. 44 shows a refractive element 2302 for correcting the varying chief ray angle as a function of radial dimension. An example of such a refractive element is a field corrector. FIG. 45 shows a Fresnel lens 2304, with or without optical power, which provides an effect similar to that of refractive element 2302 but generally may be thinner than a refractive element along an optical axis. Fresnel lens 2304 is shown to include a ridged surface 2306 which provides the chief ray corrective effect. FIG. 46 shows a diffractive element 2310 including a surface 2312 with a spatially varying grating period. Diffractive element 2310 may be configured, for example, to correct for arbitrary variations of the chief ray angle. As shown in FIGS. 42 and 43, a variety of corrective elements may be combined for greater design flexibility.

Figure 47:
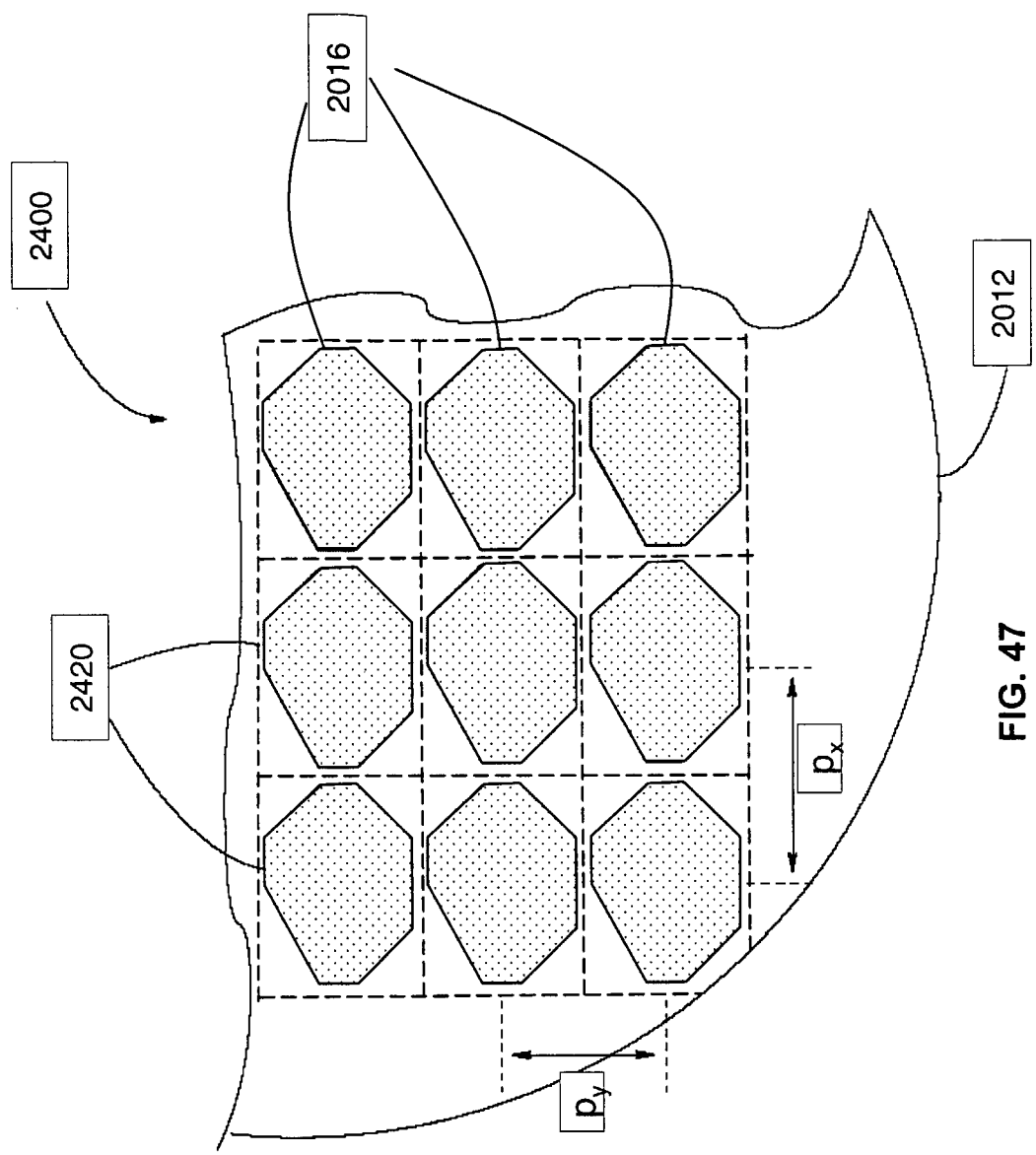
FIG. 47 is a diagrammatic, top view illustration of a portion of a wafer with an array of corrective elements disposed over an array of detector elements (not visible), shown here to illustrate an example of a possible shape of the corrective elements.

Turning to FIG. 47, a top view of a detector system 2400 including an array of corrective elements 2420 positioned over CMOS wafer 2012 is shown. As shown, for example, in FIG. 38, CMOS wafer 2012 includes a plurality of detector pixels 2016. Notice that the shape of the detector pixels is not a simple square or a rectangular shape. In general the shape of the pixels can be quite complicated. The array of corrective elements 2420 are placed over the plurality of detectors so as to provide ray correction for light incident thereon. The shape and surface form of each of corrective elements 2420 may be tailored for the size and shape of the incident light beam and shape of the detector pixels.

Figure 48:
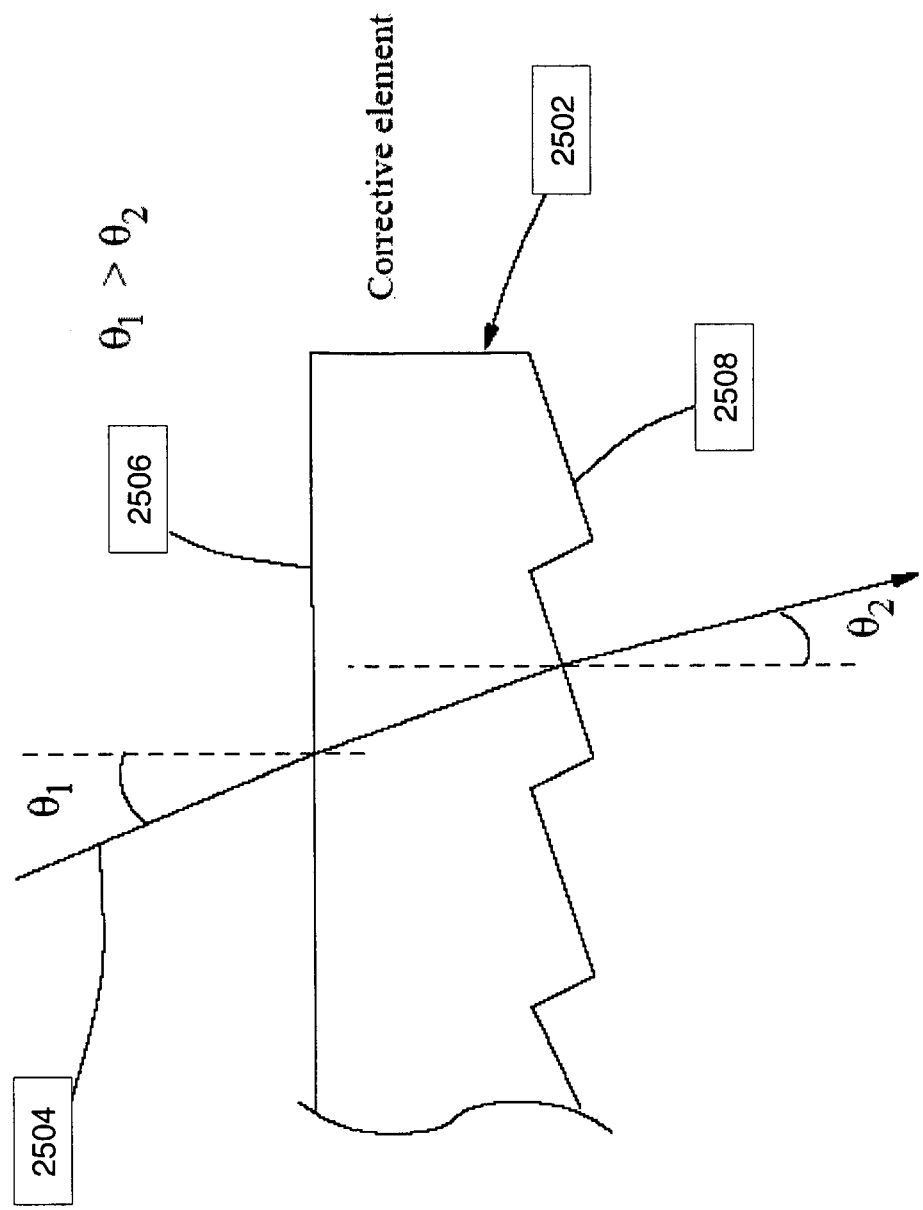
FIG. 48 is a diagrammatic illustration, in partial cross sectional view, of a light ray traveling through an exemplary corrective element, shown here to illustrate a possible type of ray correction provided by a corrective element in the ray correction system of the present disclosure.
Figure 49:
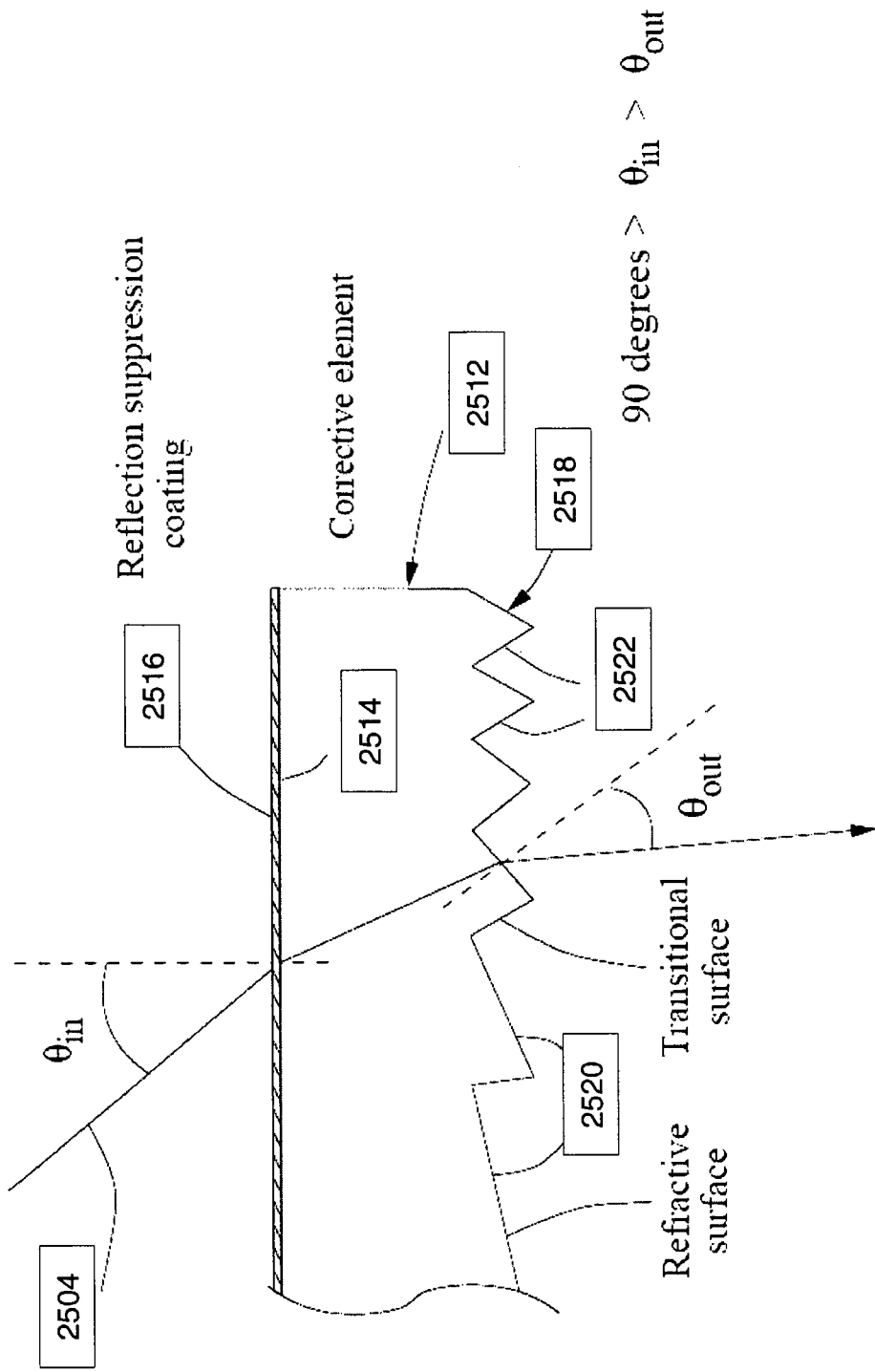
FIG. 49 is a diagrammatic illustration, in partial cross section, of a light ray traveling through an enhanced corrective element of the present disclosure, shown here to illustrate some of the possible modifications that may be made to the corrective element itself in order to enhance the ray correction.

FIGS. 48 and 49 illustrate the mechanism of ray correction by an exemplary corrective element. A corrective element 2502, as shown in FIG. 48, is a diffractive element for receiving a light 2504. Light 2504 impinges on a top surface 2506 of corrective element 2502 at an incident angle $\theta_1$. When exiting from a ridged, bottom surface 2508 of corrective element 2502, light 2504 emerges at an output angle 02, which is less than the incident angle $\theta_1$. Such a corrective element would be suitable for use in the ray correction system of the present disclosure.

In a variation to corrective element 2502, a corrective element 2512 of FIG. 49 includes a top surface 2514 with a reflection suppression coating 2516 deposited thereon. Reflection suppression coating 2516 allows coupling of light from a large cone of angles away from the normal such that the incident angle $\theta_{in}$ may be any angle less than 90-degrees, depending on the specific coating design. Corrective element 2512 further includes a bottom surface 2518, which in turn includes a plurality of alternating refractive surfaces 2520 and transitional surfaces 2522. The refractive surfaces are designed, possibly with curved surfaces, so as to yield the desired ray correction to direct light 2504 at the appropriate output angle $\theta_{out}$. The transitional surfaces are sloped such that minimum light is scattered by the transitional surfaces; for example, the transitional surfaces may be designed to be near the chief ray incident angle at that particular spot on the corrective element. The orientation of the refractive and transitional surfaces may be tailored for a given type of light source, such as one including input optics that provide an incident cone of light rather than a collimated light beam. The optical shape of the refractive surfaces can also be tailored for the particular imaging optics being used.

Another aspect of correction elements, such as corrective element 2512 of FIG. 49, is control of the chief ray as well as surrounding rays particular to the imaging lens system and location on the sensor. For instance consider FIG. 50 as illustrative of this issue. In a system 2600 shown in FIG. 50, corrective element 2024 acts to steer chief ray 2032 such that, after the chief ray travels through lenslets 2018 and color filter 2250, chief ray 2032 is collected by pixel 2016 on wafer 2012. FIG. 50 shows a chief ray perpendicular to corrective element 2024 for ease of explanation. In general, the chief ray and other rays may be incident on corrective element 2024 at any angle. Rays 2632 are seen to be far in angle from the chief ray 2032. Rays 2632 may be considered as the edge rays from a general cone or rays loosely centered about the chief ray 2032. For fast imaging systems, the edge rays will be at a large angle to the chief ray. For Wavefront Coded imaging systems, the edge rays may have uneven and even larger deviations from the chief ray. If corrective element 2024 is designed solely to steer chief ray 2032, then edge rays 2632 have a large chance of not being detected by sensor 2016. This situation may be avoided by appropriate design of corrective element 2024 with knowledge of the imaging system between the object and the sensor.

Figure 52:
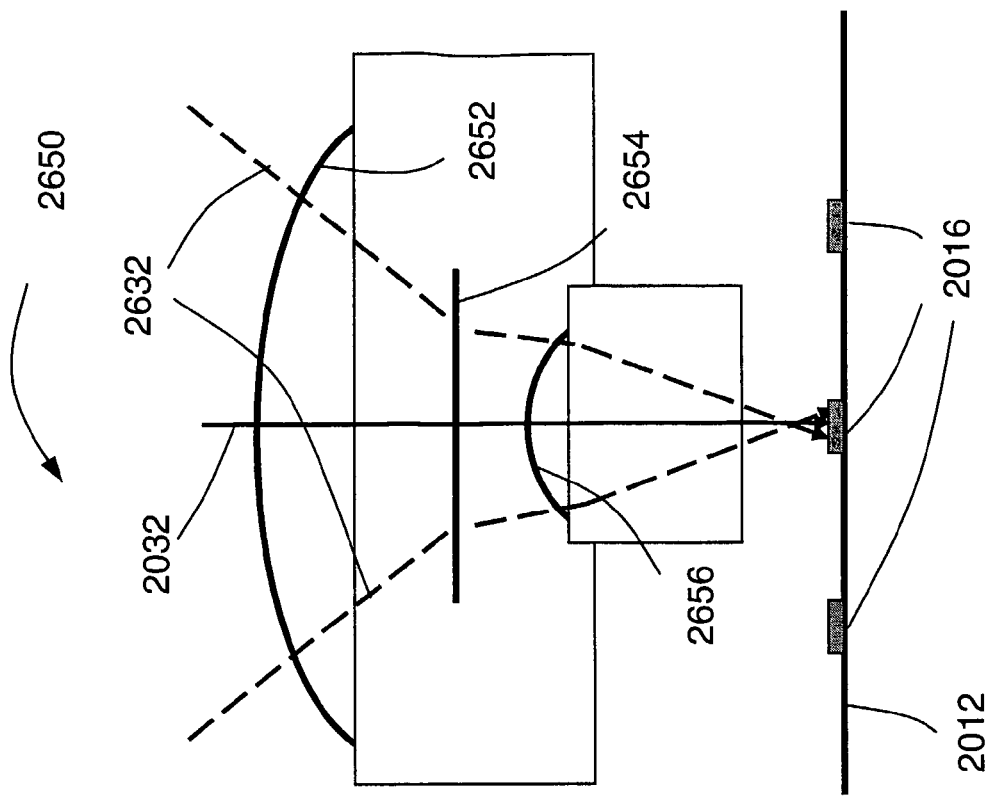
Figure 51:
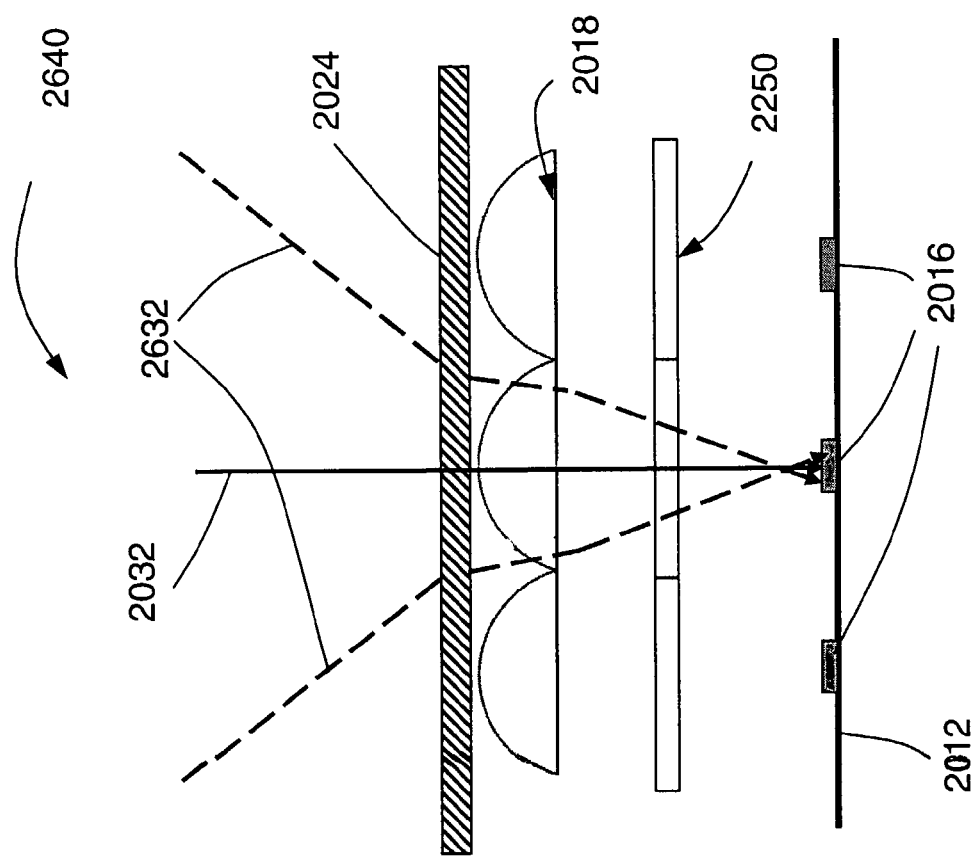

FIGS. 51 and 52 illustrate two representations of a specialized corrector, an improved version of corrector 2512 of FIG. 50, that corrects the chef ray as well as surrounding rays through knowledge of the lens system. In contrast to FIG. 50, the edge rays 2632 of FIG. 51 are corrected by corrector 2024, in addition to the chief ray 2032, such that the entire range of rays traverses the lenslets 2018 and color filter 2250 to be collected by pixel 2016 on wafer 2012. Corrector 2024 corrects the chief ray 2032 and all other rays through knowledge of the lens system, or equivalently, the wavefronts generated by the lens system forming the image.

FIG. 52 shows a wavefront representation of the structure of FIG. 51. Wavefront 2652 is transmitted from the lens system (not shown) and in general is dependent on the illumination wavelength and location on the image. After corrector 2024 of FIG. 51, wavefront 2654 is substantially flat, compared to wavefront 2652. Wavefront 2654 only needs to be flat enough so that the illumination, after passing through the lenslets and color filters land within detector pixel 2016. Larger detector pixels 2016, or less accurate lenslets 2018 require less flat wavefronts 2654. After lenslet 2018, wavefront 2656 is generated that is generally converging towards pixel 2016.

Figure 53:
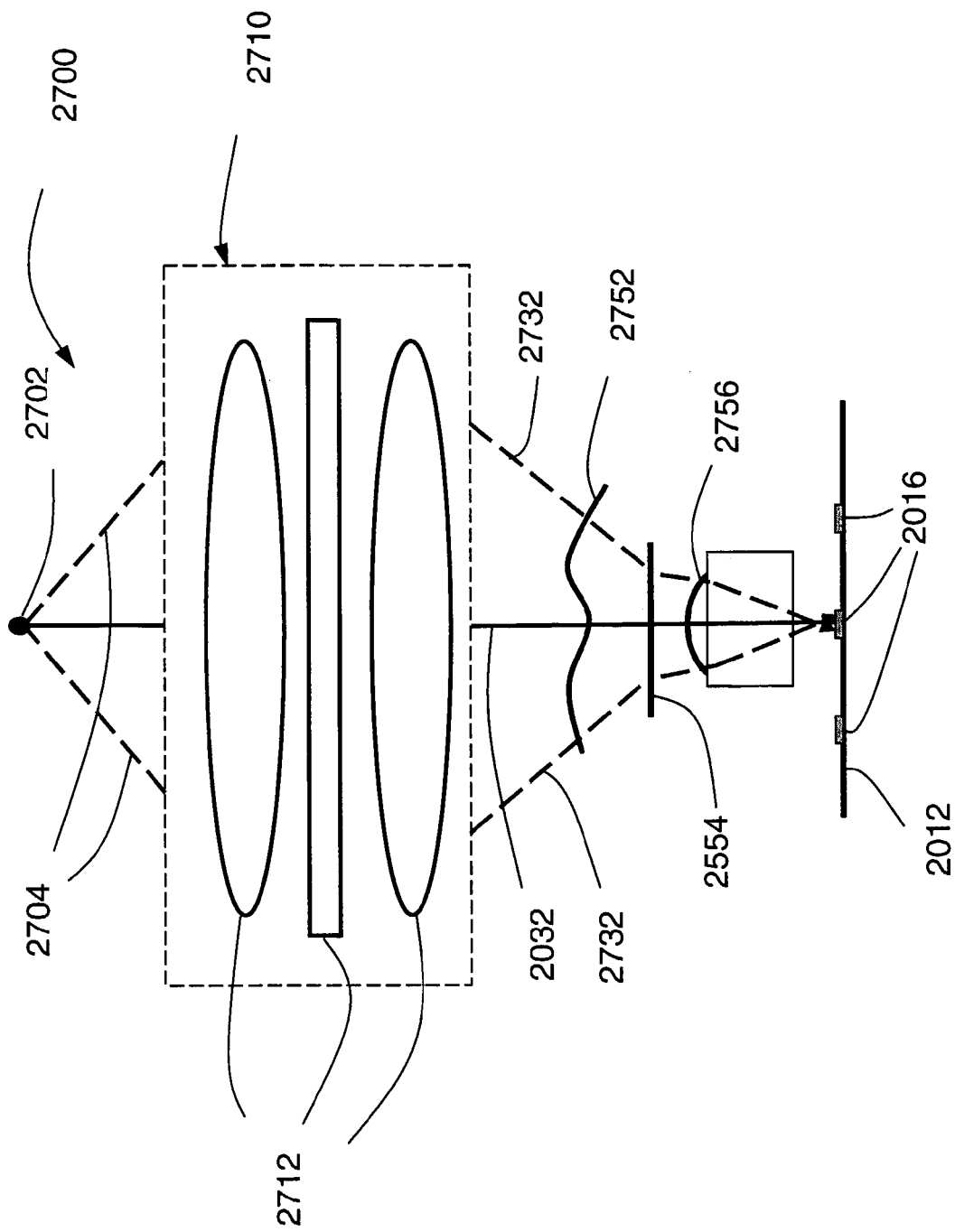

FIG. 53 shows the more general case of FIG. 51 through a wavefront description and including a lens system 2100. In system 2700, illumination rays 2704 from object 2702 are collected by a lens system 2710. Lens system 2710 includes a plurality of optics 2714. This lens system forms a chief ray 2032 and other rays 2732 that, along with all other rays, are represented by a wavefront 2752 for a particular illumination color and position on the image and/or location of object 2702. Corrector 2554, like the corrector shown in FIG. 51, acts to remove much of the local wavefront tilt and produce a flatter wavefront 2756 that is generally converging toward a particular detector pixel 2016. Then, the rays from lens system 2710 are collected by pixel 2016 on wafer 2012. The corrector uses knowledge of wavefront 2752, as a function of illumination color and spatial position, to substantially cancel the curvature of wavefront 2752 and produce a flatter wavefront 2556 that allows a maximum of rays to strike the area of the detector pixel. A focused image is not needed to be formed; what is important is that the rays strike the detector pixel anywhere within the active area. Wavefront cancellation may be performed through, for example, but not limited to, complementary surface shapes, volumetric variations of the corrector, and holograms.

Figure 54:
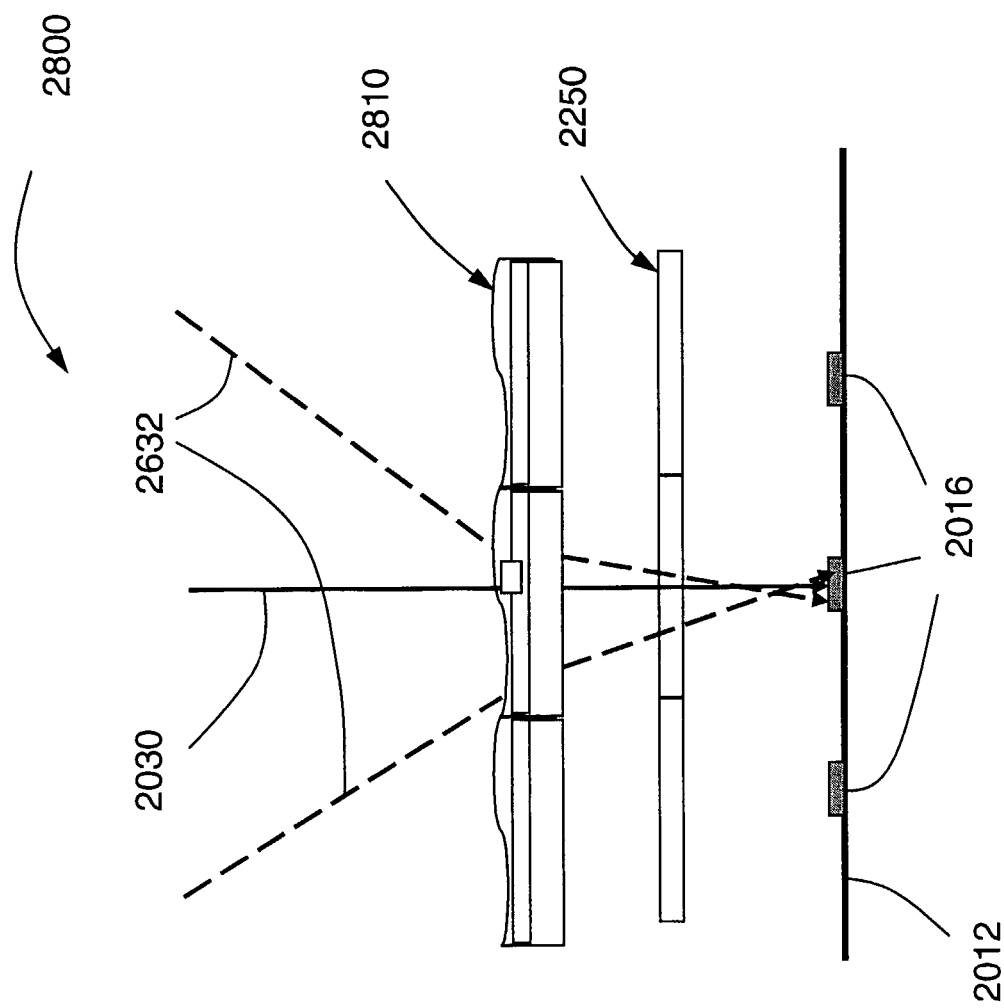

FIG. 54 shows another modification to the system of FIG. 51, this time with the lenslets being incorporated into corrector 2024. In a system 2800, a corrector 2810 now acts to substantially cancel the wavefront from the lens system (not shown), and also chief ray 2030 and edge rays 2632, such that, after color filter 2250, the wide variation of rays before corrective element 2810 are detectable at pixel 2016 on wafer 2012. Corrector 2810 is shown as having a curved surface that repeats over one or more pixels. The curved surface can represent the curvature needed to cancel the wavefront from the lens system as well as curvature that otherwise would be provided by the lenslets, as in FIG. 51. In this way the corrector can be the only optical element between the lens system and wafer 2012. Alternatively, color filters 2250 may be integrated onto or into corrector 2810 as well in a color imaging system. Although corrector 2810 is shown as having refractive surfaces, fresnel, and diffractive surfaces are equally suitable as are volume holographic elements.

FIGS. 55-64 describe further methods of forming corrective elements particularly suitable for color imaging systems such as in FIG. 43. These corrective elements may be used alone or in conjunction with the type of ray corrective elements of FIGS. 44 to 54 in a miniature camera system. A particularly important feature of corrective elements in FIGS. 55-64 is color separation. Color separation is used so that different colors of light are spatially directed towards proper color filters, or pixel locations, so that light capture is greatly increased compared to not using color separation.

Figures 60, 61:
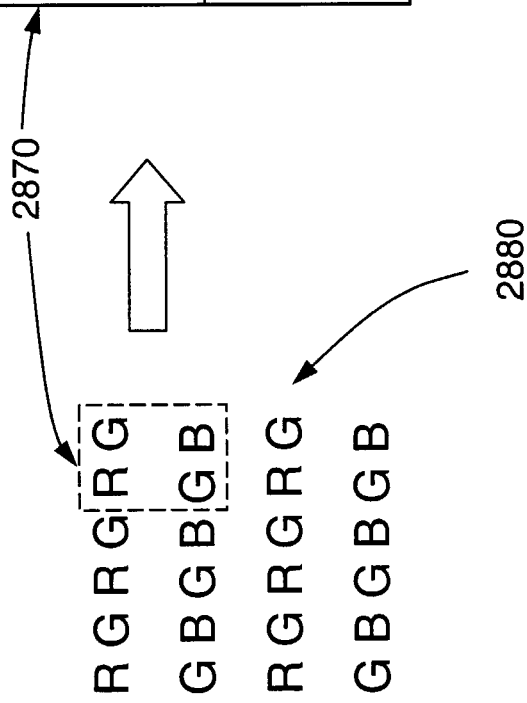
FIG. 60 is a diagrammatic illustration of a Bayer color filter array pattern.
FIG. 61 is a diagrammatic illustration of spatial color separation achieved using the cascaded corrective elements used to produce the color separation shown in FIGS. 55-59, shown here to illustrate that the spatial color separation function may be customized such that the resulting color separation corresponds to the color distribution of the Bayer filter array pattern as shown in FIG. 60.

Consider the use of color filter arrays used in imaging systems common today. Different pixels typically have different color filters, and a multitude of colors are then used with signal processing to form final color images. A common color filter array pattern is called the Bayer pattern and consists of red, green, and blue color filters. The Bayer pattern is shown in FIG. 60. In prior art imaging systems all colors of light that represent the object are incident at all relevant pixels. If a particular pixel and color filter location at the image coincides with a white color of the object then white light is incident on this particular pixel and color filter. If the color of this particular color filter is, for example, red, then only about ⅓ of the incident white light photons can be captured by this pixel, because the color filter acts to remove the blue and green photons. Corrective elements that are constructed and arranged to provide color separation would spatially separate the incident light so that mainly red photons are incident on the red filtered pixels, mainly the green photons are incident on the green filtered pixels, and mainly blue photons are incident on the blue pixels. Any other type of color space, besides red, green, and blue, can also be configured in this way so that certain proportions of red, green, and blue can be separated and directed towards certain pixels. Consequently, a greater share of the incident photons are captured allowing higher signal strengths greatly increased low light imaging performance.

Figure 56:
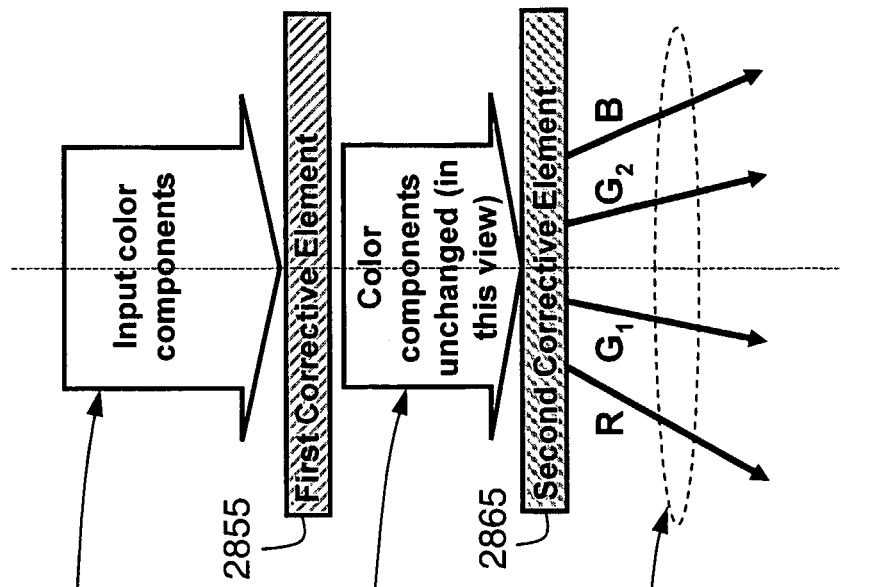
FIGS. 55 and 56 are diagrammatic illustrations of a front view and a side view of a color separation function that may be provided by a pair of cascaded corrective elements, in accordance with the present disclosure.
Figure 55:
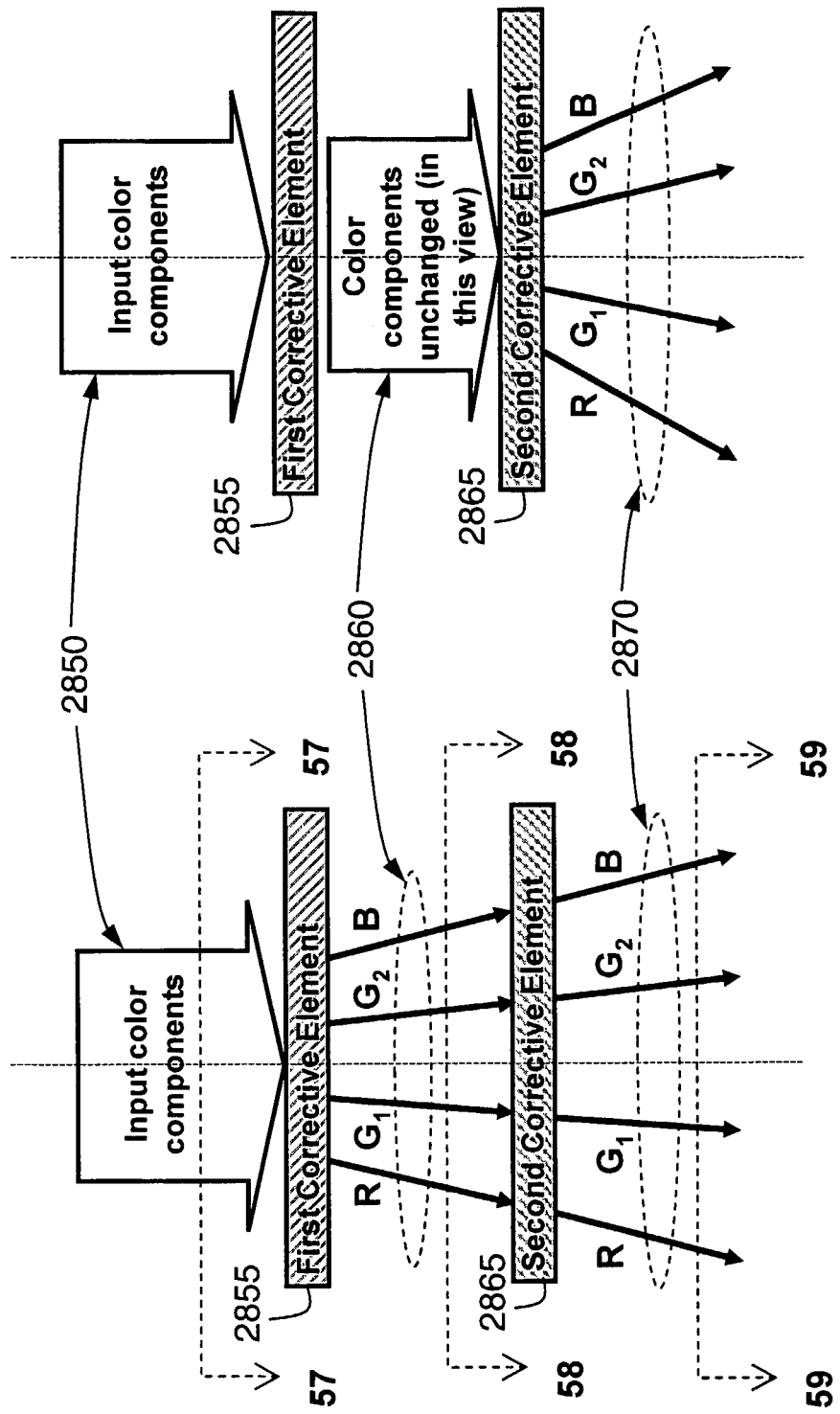

FIGS. 55 and 56 show a conceptual drawing of a two level color separation subsystem in accordance with the present disclosure. In practice, a one level color separation system, rather than a two level system, is sometimes necessary. The subsystem of FIGS. 55 and 56, in a replicated wafer configuration, is an example of the wafer of corrective elements 1232 of FIG. 37. Illumination incident on the first corrective element (First Corrective Element 2855) is denoted as 2850. This illumination in general has red, green, and blue components in proportions dependent on the scene being imaged, the lens system, and the spatial location on the sensor. The green component is represented in FIGS. 55 and 56 as two components, G1 and G2. G1 is a green red/green color, and G2 is a green, blue/green color. Illumination 2850 is shown as being perpendicular to first corrective element 2855 for ease of illustration. After First Corrective Element 2855 and before Second Corrective Element 2865, the R (red) and G1 illumination components are separated from the G2 and B (blue) components into illumination 2860, as shown in the front view. The corresponding side view of FIG. 56 shows no separation of illumination 2860 before second corrective element 2865, implying that a one-dimensional separation has been effected by First Corrective Element 2855. After Second Corrective Element 2865, the front view in FIG. 55 shows no change in the color separation of illumination 2870 (i.e., the illumination ray directions are unchanged by Second Corrective Element 2865 in the front view). The side view of FIG. 56 does though show additional color separation of the (R/G1) and (G2/B) components of illumination 2870. The color separation due to First Corrective Element 2855 is ninety degrees different from the color separation due to Second Corrective Element 2865. After both First and Second Corrective Elements, the incident illumination 2850 has been separated into four spatially separate color components 2870. First and second corrective elements may be on opposite sides of a substrate, such as in elements 2024 and 2122 in FIG. 43 with substrate 2022 in between. Furthermore, the two corrective elements that yield one dimensional separation can be combined into a single corrective element that yields two dimensions of color separation. Corrective elements may be, for example, substrates with modified surfaces or volume optical elements.

Figure 57:
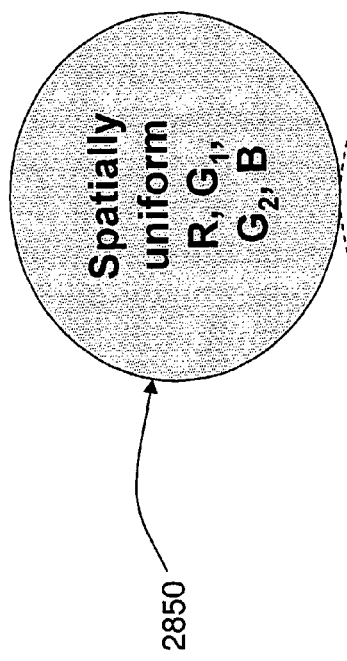
FIGS. 57-59 are diagrammatic illustrations of cross-sectional, top views of the color separation function illustrated in FIGS. 55 and 56, shown here to illustrate the separation of color into different spatial regions as a result of passing through the cascaded corrective elements.
Figure 58:
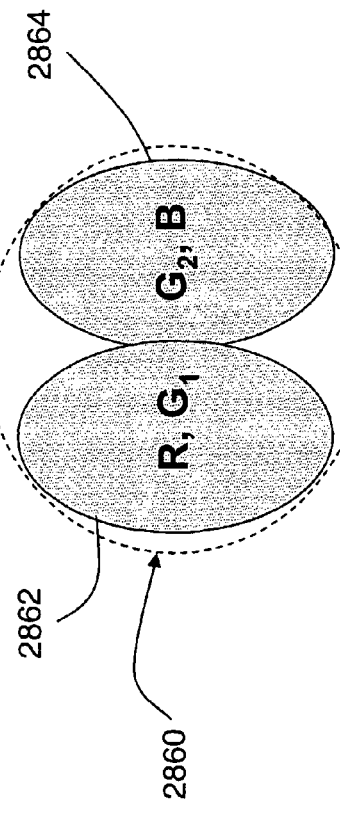
Figure 59:
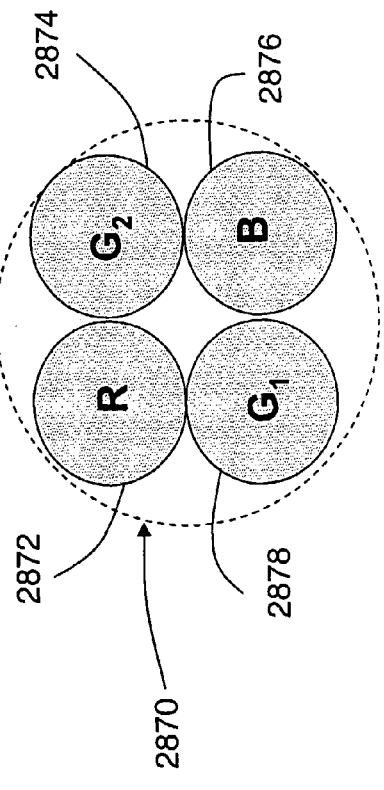

FIGS. 57-59 additionally illustrate the nature of color separation of FIGS. 55 and 56. Initially, before the First Corrective Element, incident illumination 2850 is substantially, spatially uniform. Illumination 2850 ray bundle is described as fitting within a circular contour, as shown in FIG. 57. After First Corrective Element 2855, but before Second Corrective Element 2865, illumination 2860 is now split into two regions 2862 and 2864 as shown in FIG. 58. The (R/G1) illumination components (region 2862) are spatially separated from illumination components (G2/B) (region 2864). The ray bundles of these illumination components are shown as smooth and overlapping. Benefit over the existing art may be achieved even if only the density of the illumination components are increased for a fraction of the illumination components. After First and Second Corrective Elements (2855 and 2865), illumination 2870 is further spatially separated in FIG. 59. The B, G2, G1, and B components have higher intensities in four spatially separate spatial regions (2872, 2874, 2876 and 2878). These regions are shown as non-overlapping for clarity only—in practical devices, slight overlap of these regions are possible. That is, any high proportion of color in adjacent pixels corresponds to improved color separation. If the color separated regions correspond to individual detector pixels, such as 2016 in FIG. 42, then each pixel in a 2×2 pixel region will sample photons of a particular illumination spectrum. When the separated colors match the individual detector pixel color filter then an increased amount of illumination will be captured by the detector.

For instance, say the northwest pixel of a 2×2 region 2880 of FIG. 60 has a red color filter. Then, if separated color of illumination 2880 in FIG. 61 is red at this location then this particular pixel will capture a larger fraction of incident photons than if the illumination where not color separated. This directly improves light capture and low light imaging performance. If the spatial pattern of the separated color can be distinct enough then the color filter array 2250 of FIG. 43 is no longer required. The color separation with corrective optics alone can be used to shape the spatial illumination spectrum in any desired fashion. Instead of colors R, G1, G2, and B, the separated colors may be any desired mix. For example the three colors of magenta, yellow and cyan can be color separated and when used without R, G, and B color filters may produce a new color sampling of the image.

Figure 62:
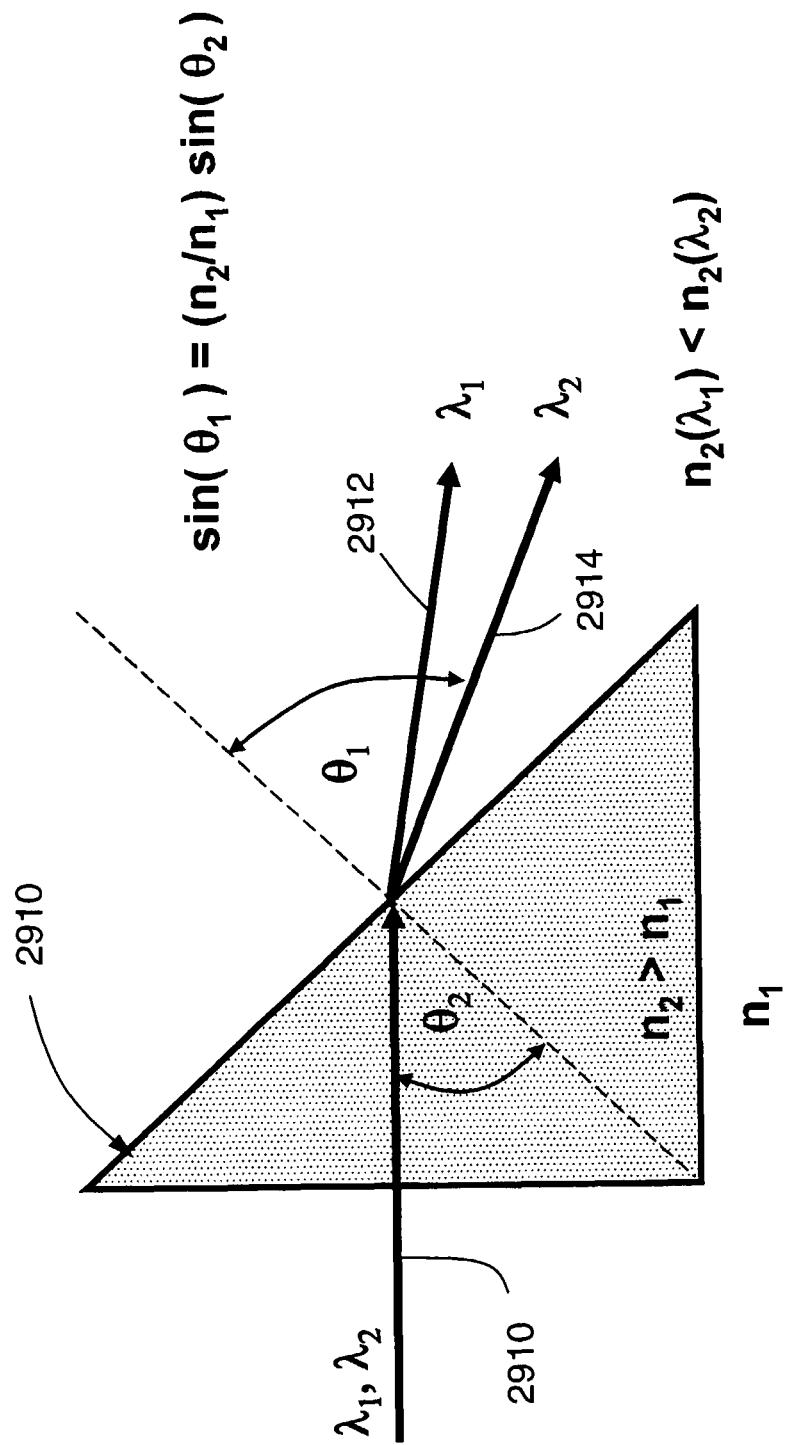
FIG. 62 is a diagrammatic illustration, in cross sectional view, of a prism for use in spatially dispersing illumination by wavelength, which is suitable for use in the spatial color separation function in accordance with the present disclosure.

There are many methods which may be used to achieve color separation with corrective elements. FIG. 62 shows one method of spatially dispersing illumination by wavelength, a dispersive prism. The prism uses the dispersion of optical materials (i.e., change in refractive index as a function of illumination wavelength) in order to spatially separate colors. Given the small nature of miniature cameras dispersive prisms alone may not provide a practical solution for some systems.

Figure 63:
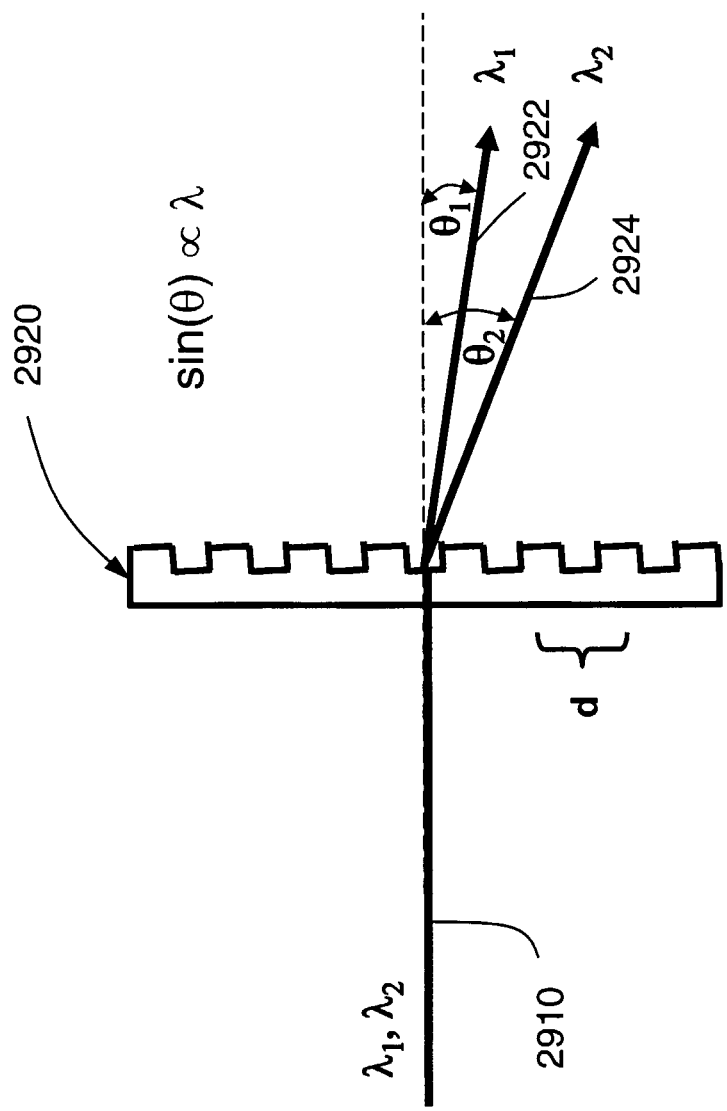
FIG. 63 is a diagrammatic illustration, in partial cross section, of a two-level, binary diffractive structure for use in spatially dispersing illumination by wavelength, which is also suitable for use in the spatial color separation function in accordance with the present disclosure.
Figure 64:
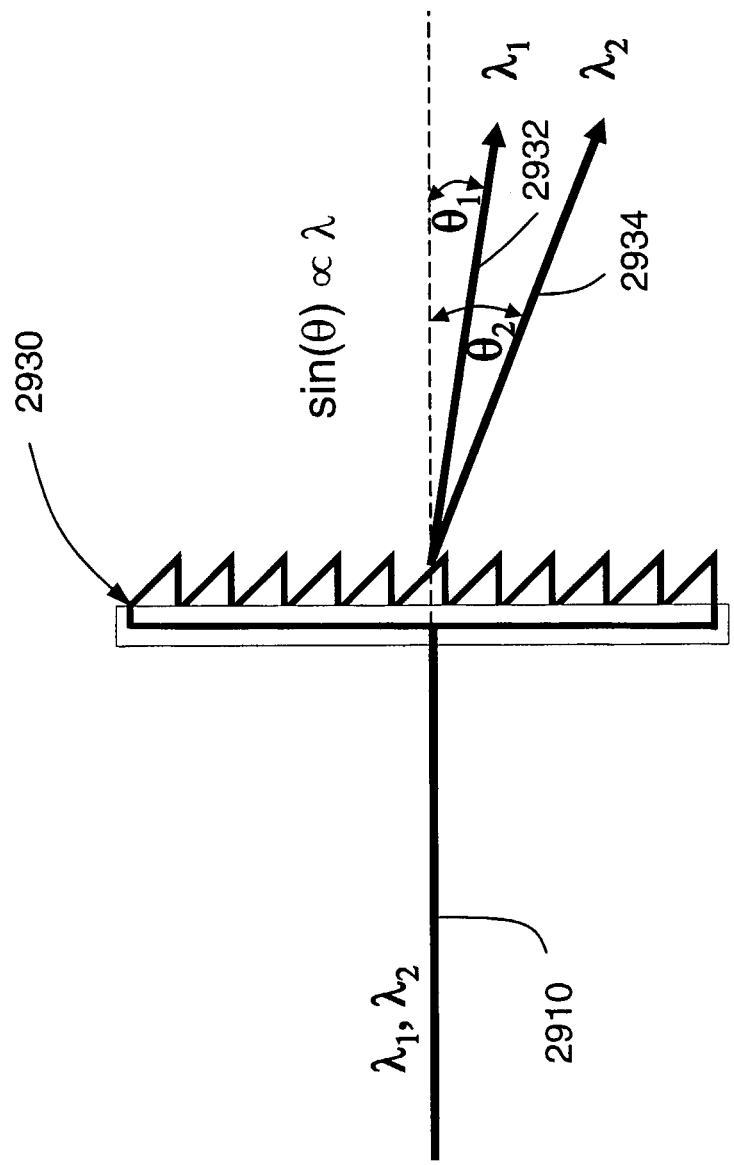
FIG. 64 is a diagrammatic illustration, in partial cross section, of a blazed diffractive structure, which is also suited for the spatial color separation of the present disclosure.
Figure 65:
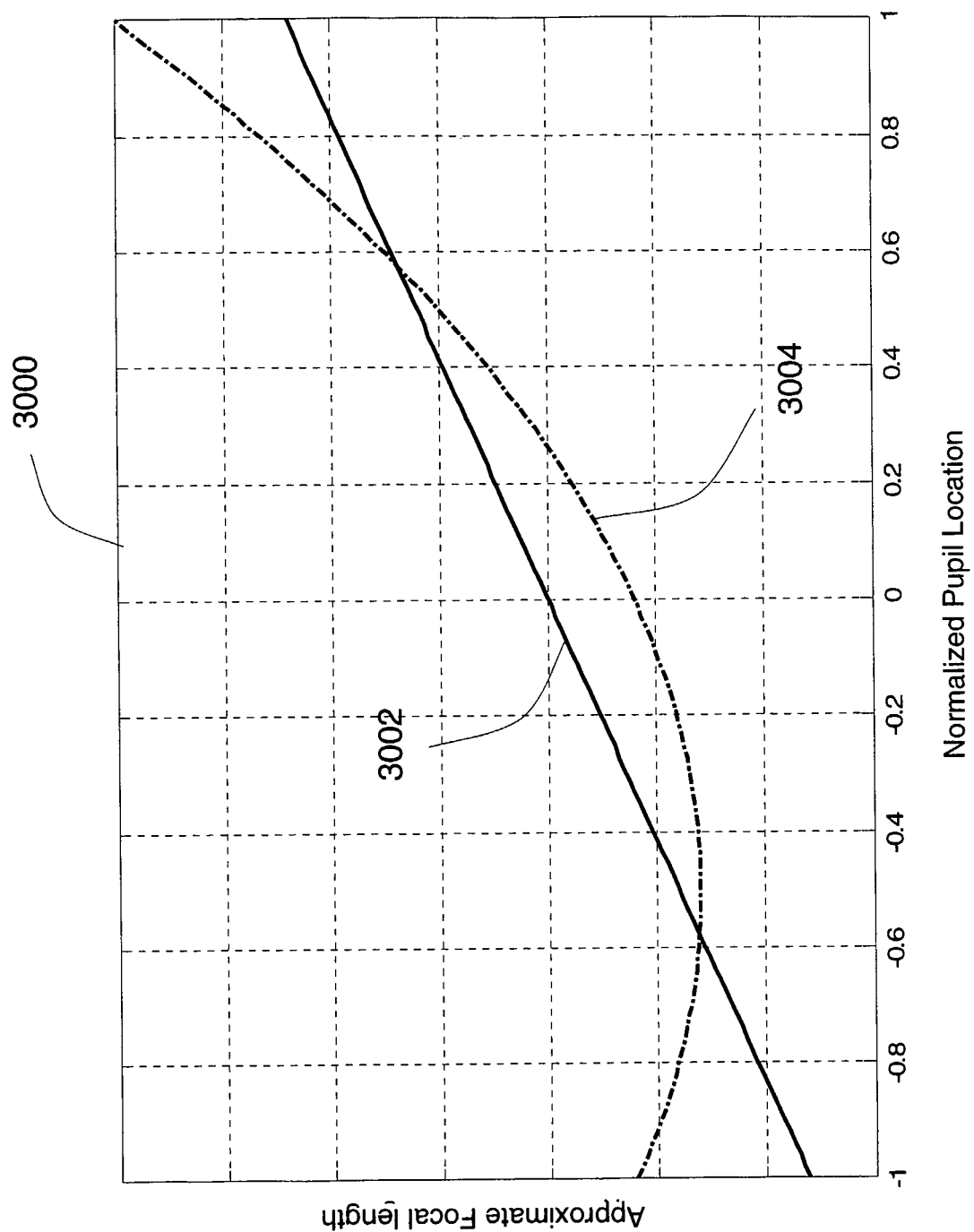
FIG. 65 is a graphical plot of two exemplary focal length versus pupil location curves for two different Wavefront Coded systems, shown here to compare the characteristics of a cubic phase system and a constant signal-to-noise ratio (SNR) system.

In order to shrink the size and reduce the cost of corrective elements that have similar characteristics to dispersive prisms for color separation diffractive type of structures can be used as shown in FIGS. 63 and 64, which illustrate compact methods of spatially dispersing illumination by wavelength. As is well known, diffractive structures are commonly used to spatially separate illumination components in instruments such as spectrometers. Even a simple two-level binary diffractive structure as shown in FIG. 63 will diffract illumination components relative to their color. The angle the color component is deviated directly depends on the wavelength. More complicated diffractive structures can separate color components more efficiently by controlling the amount of light that is diffractive in unwanted directions, or orders. These are often called blazed structures. A blazed diffractive structure is shown in FIG. 64. These diffractive structures could have more than two levels and have varying structure heights as a function of spatial position. The increasing sophisticated structures could more closely approximate the spatial color separation illustrated in FIG. 55 and FIG. 59.

FIGS. 65-70 describe the configuration of the exit pupil of an imaging system with Wavefront Coding to equalize the image SNR, or probability of detection for some systems, as a function of object distance. Many task-based systems are used to acquire specialized information from distant objects. These task based imaging systems in general do not form ideal images for a human eye. One example task-based system is a biometric imaging system, specifically an iris recognition system. Another example is an image tracking system. In both cases the distant object is radiating or reflecting a certain amount of radiation. The imaging systems in these example systems are configured to acquire specialized information, such as an iris code or object (x, y) location respectively, in the presence of noise, imprecise optics and mechanics, etc. Ideally the information can be acquired with high precision and equally well over a large object volume. In some cases it maybe desirable to specify the precision or accuracy the information is acquired within the object volume. For example, information could be deemed more critical depending on where in the volume the object is located. The highest precision estimates of the information could be designed to correspond to the critical locations within the object volume. This is also useful in a general imager, say for instance where image quality from infinity to 1.5 meters is more important than say 1.5 meters to 10 cm.

When imaging general scenes over a large object volume for human viewers it is often considered acceptable to configure the imaging system, or the Wavefront Coded system if the volume is large enough, so that the characteristics of the optics are constant over the object volume. The modulation transfer function or point spread functions, for example, are often configured to form essentially the same values over a broad object volume.

A one-dimensional cubic phase imaging system plus ideal lens can illustrate this concept. For this system the phase profile added to the ideal lens, or exit pupil, is $p(y)=\alpha y^3$ for some constant $\alpha$. The parameter y denotes spatial location along the ideal one dimensional lens. We can consider the changing phase profile across the aperture of the lens as a continuously variable focal length change over the ideal lens. As the focal length a lens can be approximated by the second derivative of the lens phase, the change in focal length across a cubic phase system can be described as:

$$\text{Focal\_length}(y) \sim d^2 p(y)/d^2 = 6*\alpha*x = \beta*x$$

Or, the change in focal length across the lens is linear. We can think of a simple cubic phase system as an infinite collection of small lenses added to the ideal lens with the focal length of the small lenses linearly changing focal length across the aperture. This linear change in focal length results in an approximate constant MTF over some broad object distance. Use of the Ambiguity Function allows simple analysis of these systems to show that the MTF is essentially constant over a broad range of object distance or equivalent range of misfocus.

Consider the effect of a constant MTF at a particular spatial frequency in a specialized detection system. Image information, as Shannon taught, is ultimately related to signal-to-noise ratio (SNR). Increasing the SNR increases the maximum amount of information that can be extracted. The response at a given spatial frequency for, say an image detection system, is then the product of the object spectrum (magnified by the imaging system) and the MTF of the imaging system at this spatial frequency. The noise is related to the amount of detector read noise, fixed pattern noise, and signal dependent noise (including shot noise) as well as other types of noise. As the object distance from the aperture increases less photons are captured by the entrance pupil of the imaging system. As the object distance from the aperture decreases more photons are captured by the entrance pupil. In an ideal system the total number of captured photons can follow an inverse square law with distance. If the object response is then fundamentally changing with distance, assuming for the moment a constant magnification with distance or distant objects small enough to be considered points, then the sampled signal times the optical response, and hence SNR, for a given spatial frequency will then vary even with a constant optical response. Even with a constant MTF, the overall object SNR and therefore image information will be a function of object distance. When the imaging magnification changes with distance, as it does in most systems, the magnification change further changes the SNR at one spatial frequency over misfocus.

For numerous systems the image information should be constant, or specifically controlled, as a function of object distance. We can acquire such a characteristic by changing the fundamental response of the MTF as a function of object location, or misfocus. As the total amount of MTF values squared over all misfocus is a constant, by the Conservation of Ambiguity property of optics, the MTF response can be partitioned to form a constant or specified SNR system as a function of distance. Consider the plot shown in FIG. 65. This plot shows two example focal length vs pupil location curves for two different Wavefront Coded systems. The linearly changing focal length curve represents a cubic phase system. The exponentially changing focal length curve represents a new system designed to achieve a constant SNR over object distance. The form of the exponential focal length change over the aperture is focal_length(y)=$\{\alpha[b^*(y)^2+c^*y+d]\}$. In this particular example b=c=12 and d=−4.

Figures 66, 67:
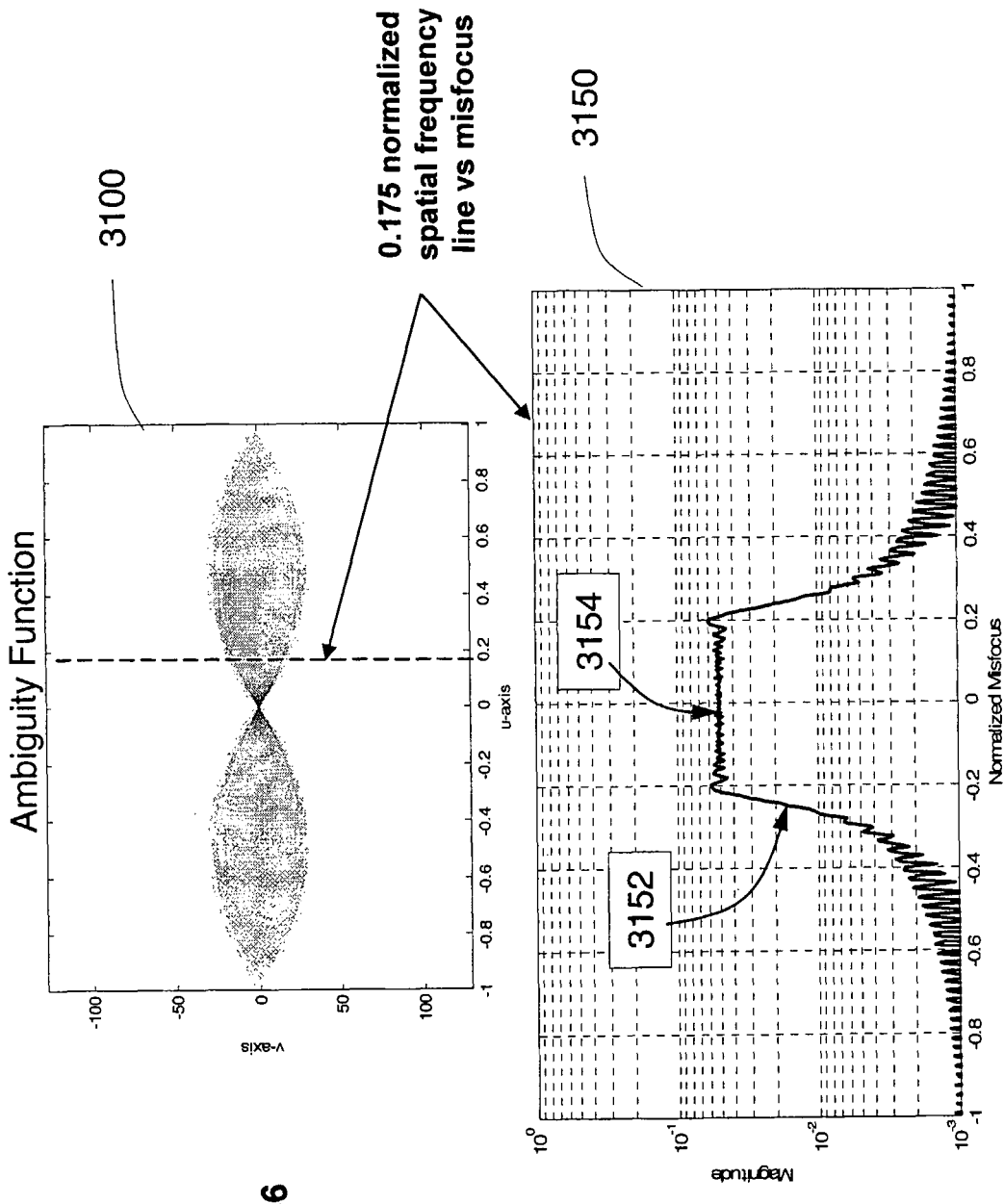
FIG. 66 is a graphical plot of the ambiguity function (AF) for a one-dimensional, linearly changing focal length system.
FIG. 67 is a graphical plot of the response versus normalized misfocus at a cross section of the AF of FIG. 66 at a normalized spatial frequency line of 0.175.

An Ambiguity Function (AF) representation for the linearly changing focal length, or cubic phase system, is shown in FIGS. 66 and 67. FIG. 66 shows the AF for the one-dimensional linearly changing focal length system. Radial slices through the origin of the AF represent the MTF as a function of misfocus. The misfocus aberration coefficient is linearly related to the angle of the radial line. A horizontal slice through the origin of the AF represents the in-focus (misfocus of zero) MTF. A vertical slice through the AF represents the value of the MTF at one spatial frequency as a function of misfocus.

Consider a vertical slice through the AF at normalized spatial frequency (or u-axis value) of 0.175. This represents the MTF at a normalized spatial frequency of 0.175 as a function of misfocus. This vertical slice through the AF is shown in FIG. 67. Within the normalized misfocus region of approximately +/− 0.2 the MTF at this spatial frequency is approximately constant. Alternatively, a linearly changing focal length system results in MTFs that are essentially constant over an extended misfocus range. It is notable that, in FIG. 67, the response for one spatial frequency as a function of misfocus is substantially constant over the designed range.

Figure 68:
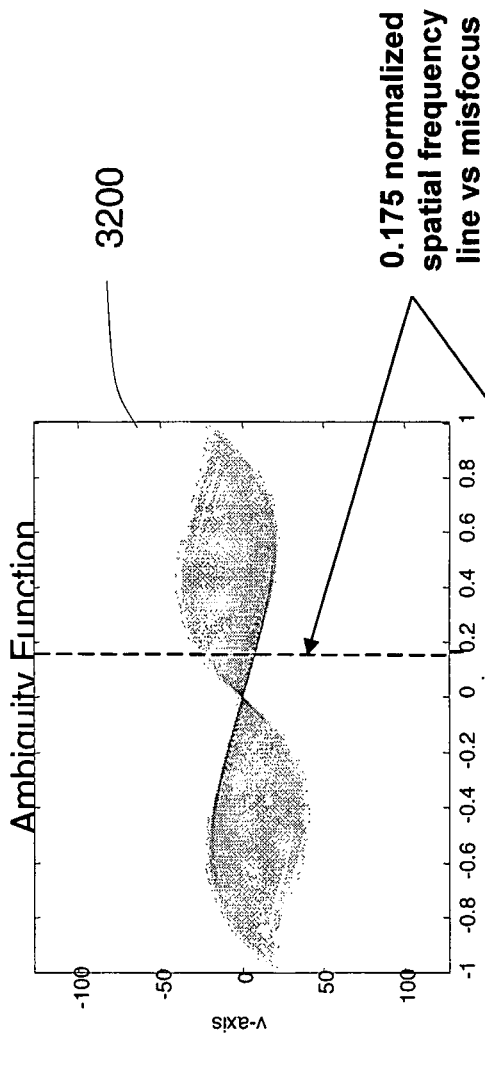
FIG. 68 is a graphical plot of the ambiguity function (AF) for a one-dimensional, exponentially changing focal length system.
Figure 69:
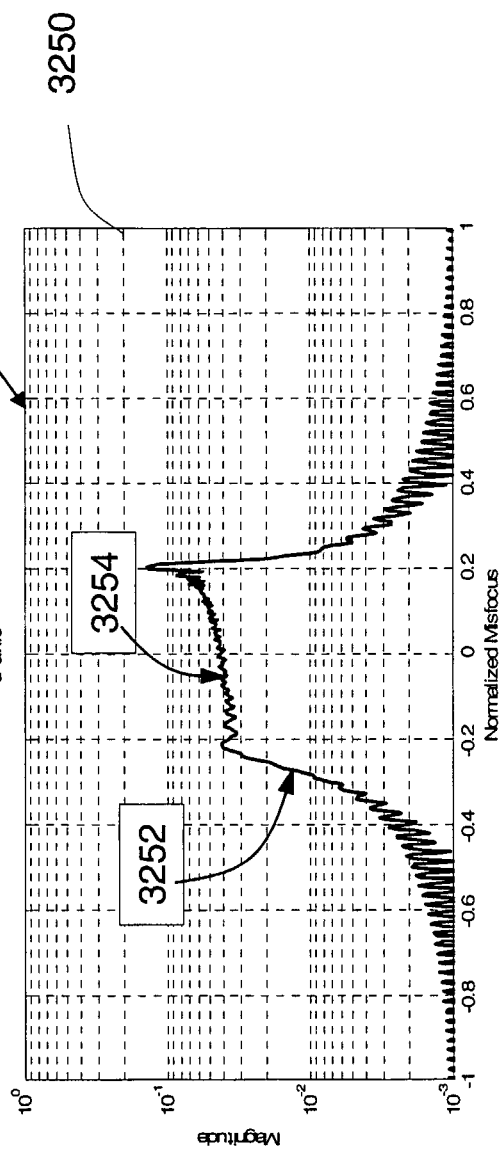
FIG. 69 is a graphical plot of the response versus normalized misfocus at a cross section of the AF of FIG. 68 at a normalized spatial frequency line of 0.175.

FIGS. 68 and 69 show the AF for the exponentially changing focal length (photon compensating) system. The exponentially changing focal length system was shown in FIG. 65. The AF shown as the image in FIG. 68 is seen to be somewhat different from the AF shown in FIG. 66. The phase function has the form p(y)=$\alpha^*(y^4+2y^3-2y^2)$. A slice through the AF at 0.175 normalized spatial frequency is shown in FIG. 69. This MTF response as a function of misfocus is approximately linear when plotted on a log scale. On a linear scale then the MTF response as a function of misfocus is then approximately exponential. In FIG. 69, it may be seen that the response for one spatial frequency as a function of misfocus is substantially linear in a log scale (or exponential on a linear scale) over the designed range.

Figures 70, 71:
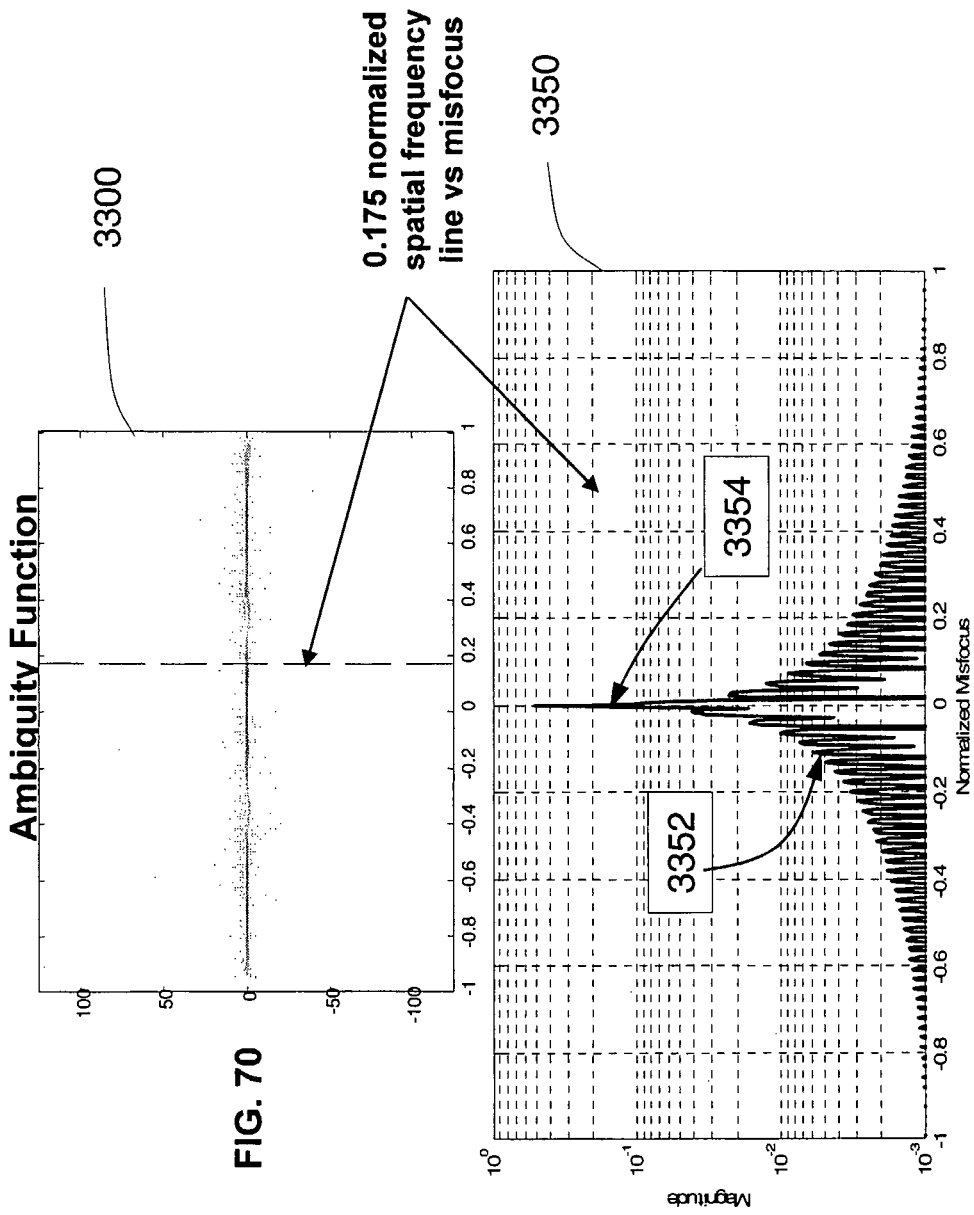
FIG. 70 is a graphical plot of the ambiguity function (AF) for a traditional imaging system with no Wavefront Coding.
FIG. 71 is a graphical plot of the response versus normalized misfocus at a cross section of the AF of FIG. 70 at a normalized spatial frequency line of 0.175.

FIGS. 70 and 71 show the AF for an ideal traditional, or diffraction-limited, imaging system without Wavefront Coding. The AF shown in FIG. 70 is seen to be very closely aligned with the horizontal axis compared to the AFs from the Wavefront Coded systems of FIGS. 66 and 68. This characteristic of the AF in FIG. 70 implies that the MTFs of the system without Wavefront Coding changes greatly with misfocus. A slice through the AF at 0.175 normalized spatial frequency is shown in FIG. 71. This MTF is seen to be very narrow; there is a high MTF value at zero misfocus but very small MTFs for normalized misfocus values slightly changed from zero. The SNR of an imaging system with this type of MTFs is maximized at zero misfocus and minimized everywhere else. Notice that the response for one spatial frequency as a function of misfocus is large with no misfocus but very small everywhere else.

Due to conservation of ambiguity, the sum squared of AF values along any particular vertical line is a constant for any phase applied to the exit pupil of an ideal imaging system. Or the sum of squared MTF values at one spatial frequency for all values of misfocus is a constant. MTF values are therefore conserved. While the MTF values vs. misfocus for the linearly changing focal length system are about 0.05 over the misfocus range of +/−0.2, the MTF values for the exponentially changing system vary from 0.03 to over 0.1. Increasing MTF values for some values of misfocus necessarily mean a decrease of MTF values for some other values of misfocus due to the conservation of ambiguity property.

But, the product of the object response vs. distance and the optical system response of FIG. 69 can be matched with the exponentially changing focal length system to ensure a constant SNR and therefore image information as a function of object distance. The SNR and image information for the linearly changing focal length system would change as a function of object distance. SNR for the system without Wavefront Coding would be maximized at best focus and minimized everywhere else. If particular proportions of MTF values are required as a function of object distance, then a construction similar to that of those plotted in FIGS. 66-69 may be used to construct an approximation to the focal length varying function and then the resulting pupil function. Further refinement through optimization would be required to fine tune the resulting pupil function. The MTF as a function of misfocus, or equivalently object range, can then be customized to suit the needs of the particular application. FIG. 72 is a flowchart illustrating a method 3500 for applying Wavefront Coding to optical systems. The steps leading to the design of a particular GRIN lens (e.g., any of modified GRIN lenses 134, 802, 904 and 954) with wavefront coding to control focus-like effects are illustrated in method 3500. A general description of this process follows.

Step 3510 is selection of a starting optical configuration. The optical configuration includes the type and form of each element that acts to manipulate light from the object to photon sensing elements or a detector array. The optical configuration includes a number of optical components in the system (for example, a three lens system) as well as the type of components, such as refractive lenses, ray correctors, mirrors, diffractive elements, volume holograms, etc. Also, the particular materials being used are determined, such as glass, plastic, particular glasses or plastics, GRIN materials, etc.

Step 3520 is selection of system parameters that can vary, or are not fixed in advance. These parameters will become part of an optimization process (e.g., optimization loop 3540 below). System parameters can include the set of optical or mechanical materials that can be used, physical sizes and shapes of components and related distances. Overall features such as weight, cost and performance can also be identified as parameters to be manipulated during optimization. Signal processing used to form the final image also has parameters, such as silicon area required in an ASIC implementation to produce the final image, linear kernel values, dynamic range of filter kernels, non-linear noise-reduction parameters, etc. Important parameters relevant to wavefront coding include a form and type of aspheric optical manipulations to be applied to the imaging system. These parameters may be fairly simple (such as surface height of a rectangularly separable surface), or may be fairly complicated parameters that define, for example, three dimensional indices of refraction of a volume imaging element. A GRIN lens is one example of a volume imaging element. A volume hologram is another example of a volume imaging element.

An initial optical design step 3530 includes traditional optics design as practiced in numerous textbooks where the design process is particularly concerned with aberration balancing of non-focus related aberrations. Optical design step 3530 may be eliminated in certain cases (for example, when off-the-shelf optical components provide initial assumptions for the optical design). Focus-related aberrations include aberrations such as spherical aberration, field curvature, astigmatism, chromatic aberration, temperature related aberrations, and fabrication and alignment related aberrations. Non-focus related aberrations include aberrations such as coma, lateral chromatic aberration and distortion that cannot implicitly be corrected by movement or warping of the image plane as a function of variables such as field angle, color, temperature and alignment, if such warping was in some way possible. Optical design step 3530 concentrates on removing effects of aberrations that cannot easily be removed with specialized optics design and signal processing of the final imagery. Focus-related aberrations can be removed with specialized optics and signal processing. Optical design step 3530 includes providing an initial guess with regard to the parameter set of the optical system.

With an initial optical design, the joint optimization of the optical and digital components can begin. An optimization loop 3540 modifies optical design parameters specified in step 3520 until some final design criteria are met. Optimization loop includes steps 3550, 3560, 3570, 3580 and 3590, as discussed below.

In a modifying step 3550, the initial guess of parameters is applied to the initial optical design from step 3530, forming a modified optical system.

Step 3560 determines signal processing parameters that will act on a formed image to produce a final image. The signal processing parameters can include, for example, the size and form of a two-dimensional linear filtering kernel. The signal processing parameters may be selected based on the particular modified optical system of step 3550.

After the signal processing parameters have been determined in step 3560, corresponding signal processing is applied in step 3570 to simulated imagery from the modified optical system. The simulated imagery can include images of specialized targets such as points, lines, grids, bars, etc. and/ or can be color images of general scenes. Simulated images can include noise from models of actual or ideal detectors, such as shot noise, fixed pattern noise, read noise, etc.

Step 3580 evaluates simulated optical images and signal processing from step 3570 to determine whether overall system specifications are met. The specifications can include imaging performance, such as particular definitions of image quality as a function of field position, color, object scene, light level, etc., and can also include system dimensions, optical element sizes, optics, electronics and system costs, tolerances to fabrication, assembly and temperature, for example. Metrics may be calculated from the simulated imagery, and the metrics may be numerically evaluated to see if they fall above or below target values. The metrics and target values may act to translate image quality as seen by a human into numeric values recognizable to a computer. Task-based applications (like, for example, iris recognition) may have application-specific, numeric metrics that can remove the need to translate a parameter of image quality to a numeric value. If step 3580 determines that the modified imaging system meets the specifications, then the design process is done. If step 3580 determines that the modified imaging system does not meet the specifications, further optimization of parameters is performed in step 3590. During optimization, parameters of the optical system are changed in order to direct the system toward a particular system that meets the system specifications. The method of changing of the system parameters during optimization is a general problem with many types of solutions. Typical methods of changing or optimizing parameters may involve a trade-off between speed of optimization and ability to find global maxima or minima. Linear search methods such Gradient Descent are useful, as are non-linear methods such as Nelder-Mead or Genetic Search. Selection of the optimization method may be a function of the complexity of the particular imaging system being designed.

After system parameters are changed in step 3590, optimization loop 3540 repeats: the new parameters are then used to modify the optical system in step 3550, the parameters of the signal processing are determined in step 3560, imagery before and after signal processing is formed in step 3570, and so on. Eventually optimization loop 3540 terminates by step 3580 finding that the specifications are met, or through no convergence with no suitable solution being found.

An example of method 3500 is the design of the modified GRIN lens 134 of FIG. 11. The method began with the selection of an off-the-shelf GRIN lens. An NSG ILH-0.25 GRIN lens, and a grayscale detector having 3.3 micron square pixels, were selected in step 3510. Ideal pixels, no ray corrector, and simple linear signal processing were selected in step 3520. Also in step 3520, aspheric modifications placed at the front surface of the GRIN lens, that is, modifications to front surface 135 of GRIN lens 134 of FIG. 11, were chosen to be rectangularly separable cubic forms. The surface form of a rectangularly separable cubic was defined as height(x, y)=$\alpha$ (x.^3+y^3). Only one optical parameter, $\alpha$, corresponding to a maximum surface deviation, was determined in this example.

As only a modification of an off-the-shelf GRIN lens was being designed, step 3530 was omitted in this example. By way of contrast, if a custom-designed GRIN lens, with no modification to its front surface had been the goal, then step 3530 would have been needed.

A particular first value for the cubic surface deviation parameter a was arbitrarily chosen as $\alpha$=0. A rectangularly separable cubic phase modification with parameter a was made to the lens via custom simulation tools in step 3550.

Signal processing parameters were calculated in step 3560 and applied in step 3570 for this particular modified GRIN lens, such that the formed imagery had high MTF values and compact PSFs. As linear filtering was used, a calculation used to determine the linear filter was:

Final_PSF=Sampled_PSF*Linear_Filter in a least squares sense, where the symbol * denotes two-dimensional linear convolution. A Sampled_PSF value is determined in step 3560 from the modified GRIN lens simulations and digital detector. The Final_PSF was selected in step 3560 as a PSF generated from a traditional optical system that had the majority of power concentrated in one pixel. The MTF corresponding to this particular final PSF had a value (at the highest spatial frequency of the detector) of about 0.4. Those skilled in the art of signal processing can appreciate that numerous methods can be used to solve these least squares linear equations to determine the linear filter based on the sampled PSF set and final or desired PSFs. The calculations can of course be done in the frequency domain, and/or iteratively.

With the digital filter calculated, the PSFs and MTFs after signal processing were produced in step 3570. These PSFs and MTFs after signal processing were then. compared in step 3580 to visual image quality metrics that translated to the majority of PSF power being in one pixel over all image fields, and the corresponding MTFs having minimum values above 0.3 after signal processing. In the first iteration of optimization loop 3540, neither the PSFs nor MTFs after signal processing with $\alpha=0$ met the system specifications. A Nelder-Mead optimization was then begun in step 3590 to determine a choice of the optical parameter a, and the linear filter, to improve the optical system. The final solution of the optimized optical parameters is shown in FIG. 18. The peak-to-valley optical path difference is about 11 wavelengths (or $\alpha$, in optical path difference space, of approximately 11 $\lambda$). A corresponding linear filter of the signal processing was calculated to transform the sampled PSFs of FIGS. 19, 20 and 21 to the PSFs of FIGS. 22, 23 and 24. The PSFs of FIGS. 22, 23 and 24 are visually seen to have the majority of the power in one pixel, as compared to the PSFs of FIGS. 19, 20 and 21. The corresponding MTFs after signal processing 170 of FIG. 25 are all seen to be above 0.3. The maximum spatial frequency of the detector is 151 lp/mm. The actual form of the linear filter is seen in FIG. 26 and FIG. 27. This particular linear filter can be thought of as being similar to an inverse filter of the essentially constant sampled PSFs of FIGS. 19, 20, and 21.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

Although each of the aforedescribed embodiments have been illustrated with various components having particular respective orientations, it should be understood that the system as described in the present disclosure may take on a variety of specific configurations with the various components being located in a variety of positions and mutual orientations and still remain within the spirit and scope of the present disclosure. Furthermore, suitable equivalents may be used in place of or in addition to the various components, the function and use of such substitute or additional components being held to be familiar to those skilled in the art and are therefore regarded as falling within the scope of the present disclosure. For example, although each of the aforedescribed embodiments have been discussed mainly for the case of chief ray correction, one or more corrective elements may be combined to provide illumination correction for beam width differences arising from variations in beam angle. An angled, refractive surface, for instance, would be suitable for such an application, and may be further combined with, for example, a diffractive pattern in order to simultaneously correct for chief ray angle.

Therefore, the present examples are to be considered as illustrative and not restrictive, and the present disclosure is not to be limited to the details given herein but may be modified within the scope of the appended claims.

What is claimed is:
1. An imaging system, comprising:
a plurality of detectors forming a detector array,
an optical component comprising aspheric optical structure such that an optical modulation transfer function (MTF) of the imaging system has no zeroes in a passband of the detector array,
a ray corrector positioned between the optical component and the detector array, wherein the ray corrector directs incident rays onto at least one detector of the detector array with an angle of incidence that is closer to a surface normal of the detector array as compared to an angle of incident rays on the detector array without the ray corrector.
2. The imaging system of claim 1, the optical component comprising a lenslet array.
3. The imaging system of claim 1, wherein the ray corrector comprises a gradient index (GRIN) lens.
4. The imaging system of claim 3, further comprising a correction plate positioned between the GRIN lens and the detector array.
5. The imaging system of claim 1, wherein an array of gradient index (GRIN) lenses formed as a stack forms the ray corrector.
6. The imaging system of claim 1, further comprising a post processor connected with the detector array for compensating effects of the aspheric optical structure.
7. The imaging system of claim 1, further comprising a color filter array to filter color for the detector array.
8. The imaging system of claim 1, the ray corrector comprising one or more of a refractive lens, a Fresnel lens and a diffractive element.
9. The imaging system of claim 1, wherein the ray corrector comprises an array of ray correctors formed as a stack.
10. The imaging system of claim 9, each of the ray correctors configured to redirect light of a particular color to at least one detector of the detector array.
11. The imaging system of claim 9, each of the ray correctors being configured to redirect light into a respective detector that is non-rectangular.
12. An imaging system, comprising:
optical components that form a plurality of optical channels; and
a detector array;
each of the optical channels including (a) portions of the optical components that steer incident light into at least one detector of the array and (b) an aspheric gradient index (GRIN) lens.
13. The imaging system of claim 12, an aspheric surface of the aspheric GRIN lens imparting a phase modification to implement wavefront coding.
14. The imaging system of claim 12, wherein a modulation transfer function of each of the optical channels has no zeros within a passband of the detector array.

15. The imaging system of claim 12, further comprising a signal processor to provide a final image based upon phase effects induced by the aspheric GRIN lens of each of the channels.

16. An imaging system, comprising:
a block of optically transmissive material having an entrance aperture, an exit aperture and at least one internally reflective surface, wherein a wavefront transmitted through the entrance aperture reflects off of the reflective surface and exits the exit aperture with a phase modification to implement wavefront coding.

17. The imaging system of claim 16, wherein an external surface of the block imparts the phase modification and comprises one of the entrance aperture and exit aperture.

18. The imaging system of claim 16, wherein the reflective surface is aspheric to impart the phase modification.

19. The imaging system of claim 16, wherein the exit aperture comprises a flat section of the block, for mounting onto a focal plane array.

20. An imaging system, comprising:
a plurality of optical channels and a detector array, each of the optical channels associated with at least one detector of the array and having an aspheric ray corrector, wherein the aspheric ray corrector preferentially directs color towards particular detectors of the detector array.

21. A photon compensating optical system, comprising:
at least one optical element and an aspheric surface, wherein a non-constant modulation transfer function (MTF) of the system compensates for a range between an object and the optical element.

22. The photon compensating optical system of claim 21, wherein the aspheric surface comprises a surface of the optical element.

23. The photon compensating optical system of claim 21, the aspheric surface having a nonlinear focal length change across its aperture.

24. The photon compensating optical system of claim 21, the aspheric surface having a nonlinear focal length change across its exit pupil.

25. The photon compensating optical system of claim 21, wherein the optical system has a normalizing energy distribution across a focal plane over the range.

26. A ray corrector, comprising: an optical element configured for placement adjacent to, or coupling to, a detector array, the optical element forming at least one surface such that field rays within an optical imaging system are directed towards the detector array with an angle of incidence that is closer to a surface normal of the detector array as compared to angle of incidence of field rays incident on the detector array without the optical element, wherein the at least one surface comprises aspheric optical structure such that an optical modulation transfer function (MTF) of the imaging system has no zeroes in a passband of the detector array.

27. The ray corrector of claim 26, wherein the optical element comprises one of a gradient index (GRIN) lens, a refractive lens, a Fresnel lens and diffractive lens.

28. An imaging system, comprising:
a first wafer comprising a plurality of detectors; and
a second wafer including a plurality of aspheric optical components such that an optical modulation transfer function (MTF) of the imaging system has no zeros within a passband of the plurality of detectors;
the first and second wafers being stacked to form the imaging system with a plurality of optical channels, each of the optical channels having at least one optical component and at least one detector.

29. The imaging system of claim 28, further comprising a third wafer stacked with the first and second wafer, to provide optical spacing for the imaging system.

30. The imaging system of claim 28, the optical components comprising a lenslet array.

31. The imaging system of claim 28, further comprising a third wafer stacked with the first and second wafer and an array of ray correctors, each of the array of ray correctors being configured to direct incident rays onto at least one associated detector with an angle of incidence that is closer to a surface normal of the detector array as compared to an angle of incident rays on the detector array without the array of ray correctors.

32. The imaging system of claim 31, wherein the aspheric optical components comprise a lenslet array.

\* \* \* \* \*